United States Patent
Morinaga et al.

(10) Patent No.: US 10,698,281 B2
(45) Date of Patent: Jun. 30, 2020

(54) LIQUID CRYSTAL DISPLAY PANEL AND METHOD FOR MANUFACTURING SAME

(71) Applicant: SHARP KABUSHIKI KAISHA, Sakai, Osaka (JP)

(72) Inventors: Junichi Morinaga, Sakai (JP); Masahiro Yoshida, Sakai (JP); Hidenobu Kimoto, Sakai (JP); Takehiko Kawamura, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/071,030

(22) PCT Filed: Jan. 13, 2017

(86) PCT No.: PCT/JP2017/001055
§ 371 (c)(1),
(2) Date: Jul. 18, 2018

(87) PCT Pub. No.: WO2017/126438
PCT Pub. Date: Jul. 27, 2017

(65) Prior Publication Data
US 2019/0033636 A1 Jan. 31, 2019

(30) Foreign Application Priority Data
Jan. 20, 2016 (JP) .................. 2016-008844

(51) Int. Cl.
*G02F 1/1362* (2006.01)
*G02F 1/1339* (2006.01)
(Continued)

(52) U.S. Cl.
CPC ...... *G02F 1/136286* (2013.01); *G02F 1/1339* (2013.01); *G02F 1/1343* (2013.01);
(Continued)

(58) Field of Classification Search
CPC ............ G02F 1/1339; G02F 1/136286; G02F 1/133345; G02F 1/1343; G02F 1/1368;
(Continued)

(56) References Cited

U.S. PATENT DOCUMENTS

2005/0030461 A1 2/2005 Ono et al.
2006/0023135 A1* 2/2006 Park .................. G02F 1/136204
349/40

(Continued)

FOREIGN PATENT DOCUMENTS

JP 2012-134475 A 7/2012
JP 2014-007399 A 1/2014
(Continued)

*Primary Examiner* — Shan Liu
(74) *Attorney, Agent, or Firm* — ScienBiziP, P.C.

(57) ABSTRACT

A liquid crystal display panel (100) according to the present invention includes a plurality of spacers configured to hold a gap between a first substrate (10) and a second substrate (30). The plurality of spacers include a plurality of first spacers in a display region and a plurality of second spacers (55) in a non-display region. The first substrate includes a first metal layer (12) and a second metal layer (16), a first transparent conductive layer (22) formed on the second metal layer and in direct contact with the second metal layer, a second inorganic insulating layer (23) formed on the first transparent conductive layer, and an organic insulating layer (25) formed on the second inorganic insulating layer. When viewed from the normal direction of the first substrate, each of the plurality of spacers overlaps with the first transparent conductive layer and the second inorganic insulating layer, and overlaps with the first metal layer and/or the second metal layer. Each of the plurality of spacers includes a part of the organic insulating layer.

18 Claims, 24 Drawing Sheets

(51) Int. Cl.
*H01L 27/12* (2006.01)
*G02F 1/1343* (2006.01)
*G02F 1/1333* (2006.01)
*G02F 1/1368* (2006.01)

(52) U.S. Cl.
CPC .... *G02F 1/13394* (2013.01); *G02F 1/133345* (2013.01); *H01L 27/1214* (2013.01); *H01L 27/1248* (2013.01); *G02F 1/1368* (2013.01); *G02F 2001/13396* (2013.01)

(58) Field of Classification Search
CPC ....... G02F 1/13394; G02F 2001/13396; G02F 1/0107; G02F 1/13392; G02F 1/161; G02F 1/133377; G02F 1/133707; G02F 2001/13398; G02F 1/0121; G02F 1/0327; G02F 1/076; G02F 1/133; G02F 1/13306; G02F 1/1345; G02F 1/13452; G02F 1/13454; G02F 1/13458; G02F 2001/133388; G02F 2001/133612; G02F 2001/13456; H01L 27/1214; H01L 27/1248; H01L 27/3246; H01L 23/48; H01L 23/49572; H01L 2224/50; H01L 2224/79; H01L 2224/86; H01L 2225/06579; H01L 2225/107; H01L 24/50; G09G 2300/0426; G09G 2300/0408; G09G 3/3655; G09G 3/3674; G09G 3/3685; G09G 2290/00; G09G 2320/0223; G09G 2300/0421; G09G 3/36
USPC .................................. 349/155–157, 149–152
See application file for complete search history.

(56) References Cited

U.S. PATENT DOCUMENTS

| | | | |
|---|---|---|---|
| 2009/0059110 A1* | 3/2009 | Sasaki | G02F 1/134363 349/39 |
| 2009/0103021 A1* | 4/2009 | Manabe | G02F 1/13394 349/106 |
| 2009/0290082 A1* | 11/2009 | Yamazaki | H01L 21/0273 349/43 |
| 2010/0149477 A1* | 6/2010 | Nagami | G02F 1/1339 349/138 |
| 2012/0138922 A1 | 6/2012 | Yamazaki et al. | |
| 2013/0214299 A1* | 8/2013 | Ryu | H01L 27/1225 257/88 |
| 2013/0320334 A1 | 12/2013 | Yamazaki et al. | |
| 2014/0009711 A1* | 1/2014 | Tomioka | G02F 1/134363 349/43 |
| 2014/0211136 A1* | 7/2014 | Fukuoka | G02F 1/13394 349/106 |
| 2014/0286076 A1 | 9/2014 | Aoki et al. | |
| 2014/0300852 A1 | 10/2014 | Yoshida | |
| 2015/0109553 A1* | 4/2015 | Kubota | H01L 27/1255 349/46 |
| 2015/0378226 A1* | 12/2015 | Yoshimoto | G02F 1/134309 349/43 |

FOREIGN PATENT DOCUMENTS

| | | |
|---|---|---|
| JP | 2014-209727 A | 11/2014 |
| WO | 01/018597 A1 | 3/2001 |
| WO | 2013/077262 A1 | 5/2013 |

\* cited by examiner

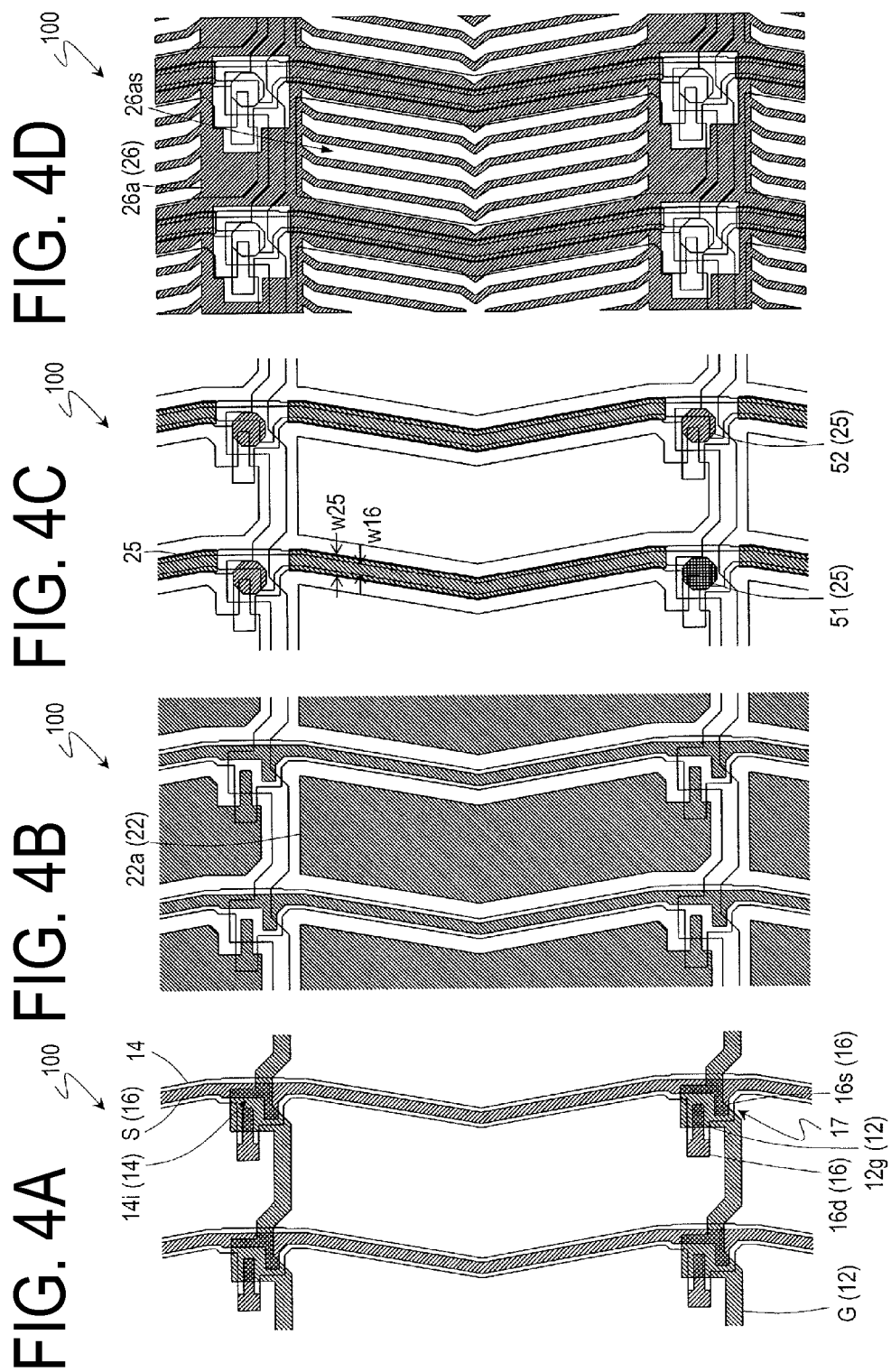

LIQUID CRYSTAL DISPLAY PANEL AND METHOD FOR MANUFACTURING SAME

TECHNICAL FIELD

The present invention relates to a liquid crystal display panel and a method for manufacturing the same.

BACKGROUND ART

An active matrix liquid crystal display panel typically includes an active matrix substrate, a counter substrate disposed facing the active matrix substrate, and a liquid crystal layer provided between the two substrates. The active matrix substrate includes a switching element, e.g. a thin film transistor (TFT), for each pixel. A display region of the liquid crystal display panel is defined by a plurality of pixels in the active matrix substrate. Drive circuits and the like are mounted or formed monolithically in a non-display region (also called a "frame region") in the periphery of the display region.

Liquid crystal display panels employing transverse electrical field modes, liquid crystal display panels employing Vertical Alignment (VA) modes, and the like, for example, are widely used as active matrix liquid crystal display panels having wide viewing angle characteristics.

In-Plane Switching (IPS) mode liquid crystal display panels and Fringe Field Switching (FFS) mode liquid crystal display panels are examples of transverse electrical field mode liquid crystal display panels. In a transverse electrical field mode liquid crystal display panel, an electrical field is produced in the liquid crystal layer in a direction parallel to the substrate surfaces by applying voltages to pixel electrodes and common electrodes (also called "counter electrodes") formed on the active matrix substrate. In a VA mode liquid crystal display panel, which is a vertical electrical field mode liquid crystal display panel, an electrical field is produced in the liquid crystal layer in a direction perpendicular to the substrate surfaces (a vertical direction) by applying a voltage to pixel electrodes and counter electrodes disposed facing each other with the liquid crystal layer located therebetween. Examples of VA mode liquid crystal display panels include Multidomain Vertical Alignment (MVA) mode liquid crystal display panels, where a plurality of domains in which the liquid crystal molecules are aligned in different directions are formed in a single pixel, and Continuous Pinwheel Alignment (CPA) mode liquid crystal display panels, where the directions in which the liquid crystal molecules are aligned are varied continuously central to a rivet or the like formed on an electrode in a central part of the pixel.

Generally, the thickness of the liquid crystal layer of a liquid crystal display panel (also called the "cell gap") is defined by spacers disposed between the active matrix substrate and the counter substrate. In addition to being disposed within the display region, the spacers are sometimes disposed in the non-display region as well. There are also situations where spacers (granular spacers) are mixed into a sealing material for laminating the active matrix substrate to the counter substrate.

As the resolutions of liquid crystal display panels increase, methods in which photolithography processes are used to form spacers in predetermined locations are being widely employed. Spacers formed in this manner will be called photo spacers (sometimes abbreviated as "PS").

Although usually formed on the counter substrate (a color filter substrate), photo spacers are sometimes provided on the active matrix substrate.

The liquid crystal display panel illustrated in FIG. 40 of PTL 1 is a FFS mode liquid crystal display panel, and a photo spacer is disposed corresponding to each pixel. Each photo spacer is formed on the active matrix substrate while overlapping with a gate bus line when viewed from a direction perpendicular to the substrate surface. Forming each photo spacer in the same location relative to the corresponding pixel makes it easier to ensure that the photo spacers have a constant height. This is because an active matrix substrate has, for example, TFTs, gate bus lines, source bus lines, and the like on the surface of a glass substrate, and thus the surface is not necessarily flat; furthermore, the intensity distribution of light used in the exposure step for forming the photo spacers is not uniform. According to PTL 1, the photo spacers are formed using a synthetic resin film that levels the surface of the active matrix substrate prior to the common electrodes being formed. In the liquid crystal display panel illustrated in FIG. 40 of PTL 1, the photo spacers are disposed in a flat region above the gate bus lines.

CITATION LIST

Patent Literature

PTL 1: WO 01/018597

SUMMARY OF INVENTION

Technical Problem

However, according to investigations of the inventors of the present invention, a liquid crystal display panel such as that illustrated in FIG. 40 of PTL 1 has had a problem in that the display quality drops near the photo spacers due to disorder in the alignment of the liquid crystal molecules (e.g. the contrast drops or graininess arises).

Insufficient alignment treatment on an alignment film in the periphery of the photo spacers was found to be one cause of this problem. When subjecting an alignment film to a rubbing treatment as an alignment treatment for defining the alignment direction (called a "pretilt direction") of the liquid crystal molecules when no electrical field is applied, there have been situations where the alignment film is insufficiently rubbed in the periphery of the photo spacers (particularly on the downstream side of the rubbing direction).

Partial peeling of the alignment film, caused by vibrations or external forces imparted on the liquid crystal display panel, was found to be another cause. The effects of vibrations are prominent in liquid crystal display panels installed in vehicles such as automobiles and aircraft, for example. Furthermore, in a liquid crystal display panel that incorporates a touch panel or a digitizer, forces are exerted on the liquid crystal display panel from the exterior by a user's finger or an input pen, which is thought to increase the likelihood of the alignment film partially peeling and causing the alignment to become disordered. This will be described in detail later.

In response to the problem of the display quality dropping due to disorder in the alignment of the liquid crystal molecules near the photo spacers, the drop in display quality can be suppressed by, for example, using a light shielding layer (a black matrix) provided on the counter substrate to cover the portions where the alignment of the liquid crystal molecules can become disordered. However, in this case, the light shielding layer (black matrix) has a greater surface area than in the related art, which causes the aperture ratio of the liquid crystal display panel to drop.

Having been achieved to solve the above-described problems, an object of the present invention is to suppress a drop in display quality caused by disorder in the alignment of liquid crystal molecules near photo spacers without reducing the aperture ratio in a liquid crystal display panel.

Solution to Problem

A liquid crystal display panel according to embodiments of the present invention includes: a first substrate; a second substrate; a liquid crystal layer provided between the first substrate and the second substrate; and a plurality of spacers configured to hold a gap between the first substrate and the second substrate. The first substrate includes: a first transparent substrate; a plurality of TFTs formed on the first transparent substrate, each of the plurality of TFTs including a gate electrode, a semiconductor layer, a source electrode, and a drain electrode; a plurality of first wiring lines including a part of a first metal layer, each of the plurality of first wiring lines being connected to one of the gate electrode and the source electrode of a corresponding one of the plurality of TFTs; a plurality of second wiring lines including a part of a second metal layer, each of the plurality of second wiring lines being connected to the other of the gate electrode and the source electrode of a corresponding one of the plurality of TFTs; an inorganic insulating layer formed on the second metal layer; a first transparent conductive layer formed under the inorganic insulating layer; a second transparent conductive layer formed on the inorganic insulating layer; and an organic insulating layer formed on the inorganic insulating layer. Each of the plurality of spacers overlaps with at least one of the source electrode and the drain electrode of a corresponding one of the plurality of TFTs, and each of the plurality of spacers includes a part of the organic insulating layer.

In some embodiments, the liquid crystal display panel includes a plurality of pixel openings, and each of the plurality of pixel openings includes a layered structure, the layered structure including the first transparent conductive layer, the inorganic insulating layer, and the second transparent conductive layer but not including the organic insulating layer.

In some embodiments, a part of the second transparent conductive layer is formed on the organic insulating layer.

In some embodiments, in a case that a distance, in a normal direction of the first substrate, from a surface of the first transparent substrate closer to the liquid crystal layer to a surface of the inorganic insulating layer closer to the liquid crystal layer is taken as a height, the height at places where the plurality of spacers are provided is greater than the height at places where the plurality of spacers are not provided and that include a layered structure including the first transparent conductive layer and the second transparent conductive layer.

In some embodiments, a part of the organic insulating layer is formed on the plurality of second wiring lines, and is formed substantially parallel to the plurality of second wiring lines while covering at least part of the plurality of second wiring lines.

In some embodiments, the plurality of second wiring lines include a part not covered by the organic insulating layer.

In some embodiments, the plurality of spacers do not overlap with the second transparent conductive layer.

In some embodiments, the plurality of spacers include spacers that, when viewed from the normal direction of the first substrate, overlap entirely with the first metal layer and/or the second metal layer.

In some embodiments, the first transparent conductive layer includes a first transparent electrode; the second transparent conductive layer includes a second transparent electrode opposing the first transparent electrode with the inorganic insulating layer between the first transparent electrode and the second transparent electrode; one of the first transparent electrode and the second transparent electrode is connected to one of the source electrode and the drain electrode; and the second transparent electrode includes at least one slit. The second transparent electrode may include a plurality of slits extending parallel to each other.

In some embodiments, the second transparent electrode functions as a common electrode, and the second transparent electrode covers a part of the organic insulating layer formed covering at least a part of the plurality of second wiring lines.

In some embodiments, the liquid crystal display panel includes a plurality of pixels, and each of the plurality of pixels includes an auxiliary capacitance formed by the first transparent electrode, the inorganic insulating layer, and the second transparent electrode.

In some embodiments, the plurality of spacers include a spacer in direct contact with the inorganic insulating layer.

In some embodiments, the plurality of spacers include a plurality of first spacers that define a gap between the first substrate and the second substrate, and a plurality of second spacers that are lower than the plurality of first spacers.

In some embodiments, the second substrate includes a plurality of projection-shaped structures protruding toward the first substrate; and the plurality of spacers include a spacer that further includes a corresponding one of the plurality of projection-shaped structures.

In some embodiments, the first substrate includes a first alignment film on a side of the first substrate closer to the liquid crystal layer; the second substrate includes a second alignment film on a side of the second substrate closer to the liquid crystal layer; and alignment restriction directions defined by the first alignment film and the second alignment film form an angle of greater than 0° and less than or equal to 15° degrees with a direction in which the plurality of second wiring lines extend.

In some embodiments, the liquid crystal layer includes a nematic liquid crystal material having positive dielectric anisotropy, and functions in a transverse electrical field mode.

A liquid crystal display panel according to other embodiments of the present invention includes: a first substrate; a second substrate; a liquid crystal layer provided between the first substrate and the second substrate; a display region including a plurality of spacers configured to hold a gap between the first substrate and the second substrate, and including a plurality of pixels arranged in a matrix; and a non-display region in a periphery of the display region. The non-display region includes a seal portion enclosing the liquid crystal layer. The plurality of spacers include a plurality of first spacers in the display region and a plurality of second spacers in the non-display region. The first substrate includes, in the display region and the non-display region, a first transparent substrate, a first metal layer formed on the first transparent substrate, a first inorganic insulating layer formed on the first metal layer, a second metal layer formed on the first inorganic insulating layer, a first transparent conductive layer formed on the second metal layer and in direct contact with the second metal layer, a second inorganic insulating layer formed on the first transparent conductive layer, and an organic insulating layer formed on the second inorganic insulating layer. When viewed from a normal direction of the first substrate, each of the plurality of spacers overlaps with the first transparent conductive layer and the second inorganic insulating layer. When viewed from the normal direction of the first substrate, each of the plurality of spacers overlaps with the first metal layer and/or the second metal layer. Each of the plurality of spacers includes a part of the organic insulating layer.

In some embodiments, in the display region and the non-display region, the first substrate further includes a second transparent conductive layer formed on the second inorganic insulating layer, and part of the second transparent conductive layer is formed on the organic insulating layer.

In some embodiments, the plurality of spacers include a spacer that does not overlap with the second transparent conductive layer.

In some embodiments, in the display region, in a case that a distance, in the normal direction of the first substrate, from a surface of the first transparent substrate closer to a liquid crystal layer to a surface of the second inorganic insulating layer closer to the liquid crystal layer is taken as a first height, the first height at places Where the plurality of first spacers are provided is greater than the first height at places where the plurality of first spacers are not provided and that include a layered structure including the first transparent conductive layer and the second transparent conductive layer.

In some embodiments, the plurality of spacers include spacers that, when viewed from the normal direction of the first substrate, overlap entirely with the first metal layer and/or the second metal layer.

In some embodiments, the plurality of spacers include spacers that, when viewed from the normal direction of the first substrate, overlap entirely with the first metal layer and the second metal layer.

In some embodiments, the first substrate includes, in the display region and the non-display region, a semiconductor layer formed under the second metal layer; and the plurality of spacers include a spacer that, when viewed from the normal direction of the first substrate, overlaps with the second metal layer and the semiconductor layer.

In some embodiments, the plurality of second spacers include a second spacer covered by the seal portion.

In some embodiments, the plurality of second spacers include a second spacer inward from the seal portion.

In some embodiments, the plurality of second spacers include a second spacer covered by the seal portion and a second spacer inward from the seal portion; and in a case that a distance, in the normal direction of the first substrate, from a surface of the first transparent substrate closer to the liquid crystal layer to a surface of the organic insulating layer closer to the liquid crystal layer is taken as a second height, the second height at a place where the second spacer covered by the seal portion is provided is substantially equal to the second height at a place where the second spacer inward from the seal portion is provided.

In some embodiments, the first substrate includes, in the display region: a plurality of TFTs formed on the first transparent substrate, each of the plurality of TFTs including a gate electrode, a semiconductor layer, a source electrode, and a drain electrode; a plurality of first wiring lines including a part of the first metal layer, each of the first wiring lines being connected to one of the gate electrode and the source electrode of a corresponding one of the plurality of TFTs; and a plurality of second wiring lines including a part of the second metal layer, each of the second wiring lines being connected to the other of the gate electrode and the source electrode of a corresponding one of the plurality of TFTs. Each of the plurality of first spacers overlaps with at least one of the source electrode and the drain electrode of a corresponding one of the plurality of TFTs.

In some embodiments, in the display region, a part of the organic insulating layer is formed on the plurality of second wiring lines, and is formed substantially parallel to the plurality of second wiring lines while covering at least a part of the plurality of second wiring lines.

In some embodiments, part of the second transparent conductive layer covers a part of the organic insulating layer formed covering at least part of the plurality of second wiring lines.

In some embodiments, the first transparent conductive layer includes a first transparent electrode; the second transparent conductive layer includes a second transparent electrode opposing the first transparent electrode with the second inorganic insulating layer between the first transparent electrode and the second transparent electrode; one of the first transparent electrode and the second transparent electrode is connected to one of the source electrode and the drain electrode; and the second transparent electrode includes at least one slit.

In some embodiments, the first substrate includes, in the non-display region, a first main line connected to the first transparent electrode or the second transparent electrode and including a part of the first metal layer, and a second main line connected to the first transparent electrode or the second transparent electrode and including a part of the second metal layer. The plurality of second spacers include a second spacer that, when viewed from the normal direction of the first substrate, overlaps with the first main line and/or the second main line.

In some embodiments, the second substrate includes a plurality of projection-shaped structures protruding toward the first substrate; and the plurality of spacers include a spacer that further includes a corresponding one of the plurality of projection-shaped structures.

A method for manufacturing a liquid crystal display panel according to embodiments of the present invention is a method for manufacturing a liquid crystal display panel including a first substrate, a second substrate, a liquid crystal layer provided between the first substrate and the second substrate, and a plurality of spacers configured to hold a gap between the first substrate and the second substrate. The first substrate includes a transparent substrate and plurality of TFTs formed on the transparent substrate, each of the plurality of TFTs including a gate electrode, a semiconductor layer, a source electrode, and a drain electrode. The method includes: (a) forming a first metal layer on the transparent substrate, the first metal layer including one of the gate electrodes and the source electrodes of the plurality of TFTs and a plurality of first wiring lines connected to the one of the gate electrodes and the source electrodes of the plurality of TFTs; (b) forming a first inorganic insulating layer on the first metal layer; (c) forming a second metal layer on the first inorganic insulating layer, the second metal layer including the other of the gate electrodes and the source electrodes of the plurality of TFTs and a plurality of second wiring lines connected to the other of the gate electrodes and the source electrodes of the plurality of TFTs; (d) forming a first transparent conductive layer on the first inorganic insulating layer; (e) forming a second inorganic insulating layer on the first transparent conductive layer; and (f) forming an organic insulating layer on the second inorganic insulating layer. The organic insulating layer formed in the (f) includes the plurality of spacers. When viewed from a normal direction of the first substrate, each of the plurality of spacers overlaps with the first transparent conductive layer and the second inorganic insulating layer. When viewed from the normal direction of the first substrate, each of the plurality of spacers overlaps with the first metal layer and/or the second metal layer.

In some embodiments, the second metal layer formed in the (c) includes the source electrodes and the drain electrodes of the plurality of TFTs and a plurality of source bus lines connected to the source electrodes of the plurality of TFTs. The first transparent conductive layer formed in the (d) is formed on the second metal layer and is in direct contact with the second metal layer. The (c) and the (d) include: (g1) forming a conductive film on the first inorganic insulating layer; (g2) forming a transparent conductive film on the conductive film, the transparent conductive film being in direct contact with the conductive film; (g3) forming a resist film on the transparent conductive film and forming a resist layer by exposing and developing the resist film; and (g4) obtaining the second metal layer and the first transparent conductive layer by etching the conductive film and the transparent conductive film using the resist layer as a mask.

In some embodiments, the method further includes (h) forming a second transparent conductive layer on the second inorganic insulating layer, and a part of the second transparent conductive layer formed in the (h) is formed on the organic insulating layer.

In some embodiments, the plurality of spacers include a spacer that does not overlap with the second transparent conductive layer formed in the (h).

Advantageous Effects of Invention

According to embodiments of the present invention, a drop in display quality caused by disorder in the alignment of liquid crystal molecules near photo spacers can be suppressed without causing a drop in the aperture ratio in a liquid crystal display panel.

BRIEF DESCRIPTION OF DRAWINGS

FIGS. 4A to 4D are plan views of an active matrix substrate 10, where FIG. 4A is a diagram illustrating a gate metal layer 12, a semiconductor layer 14, and a source metal layer 16, FIG. 4B is a diagram illustrating a first transparent conductive layer 22 in addition to the content of FIG. 4A, FIG. 4C is a diagram illustrating an organic insulating layer 25 in addition to the content of FIG. 4B, and FIG. 4D is a diagram illustrating a second transparent conductive layer 26 in addition to the content of FIG. 4C.

DESCRIPTION OF EMBODIMENTS

Embodiments of the present invention will be described below with reference to the drawings. Note, however, that the present invention is not limited to the following embodiments. In the descriptions of the drawings below, constituent elements having substantially identical functions will be given identical reference signs, and descriptions thereof may be omitted.

First Embodiment

Figure 1:
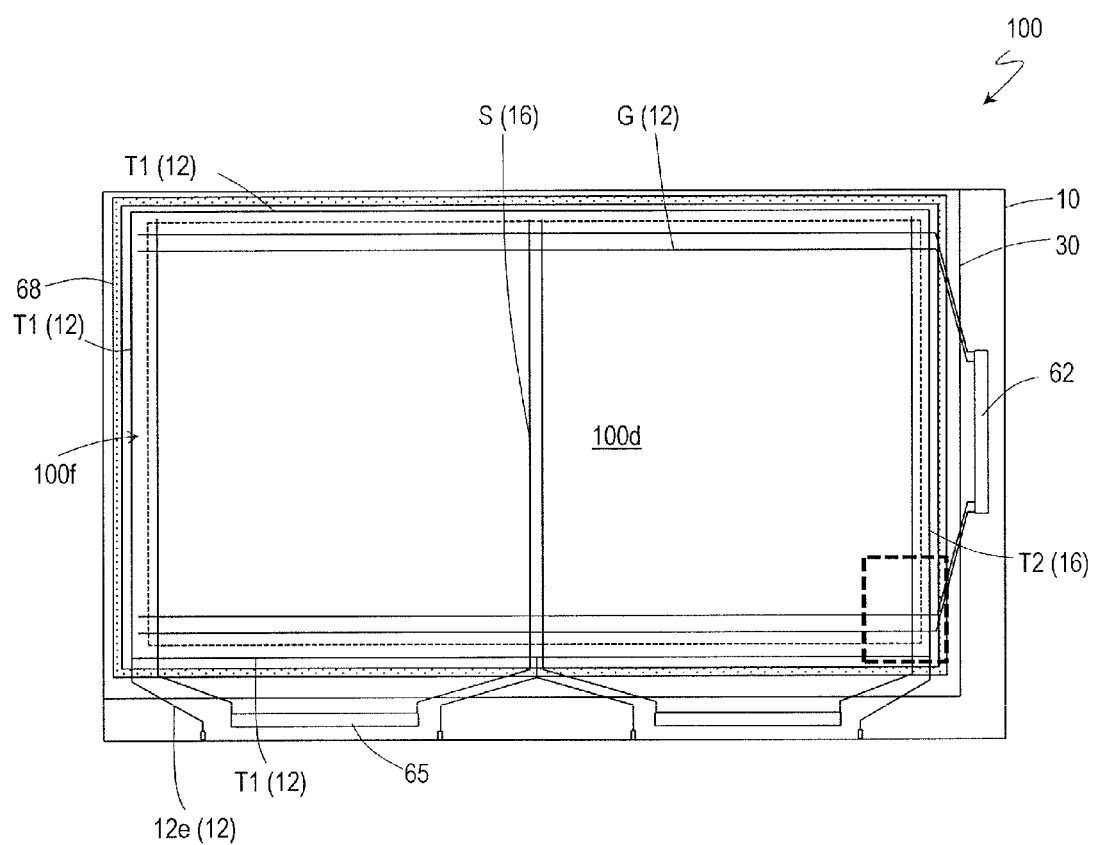
FIG. 1 is a plan view schematically illustrating a liquid crystal display panel 100 according to a first embodiment of the present invention.
Figure 2:
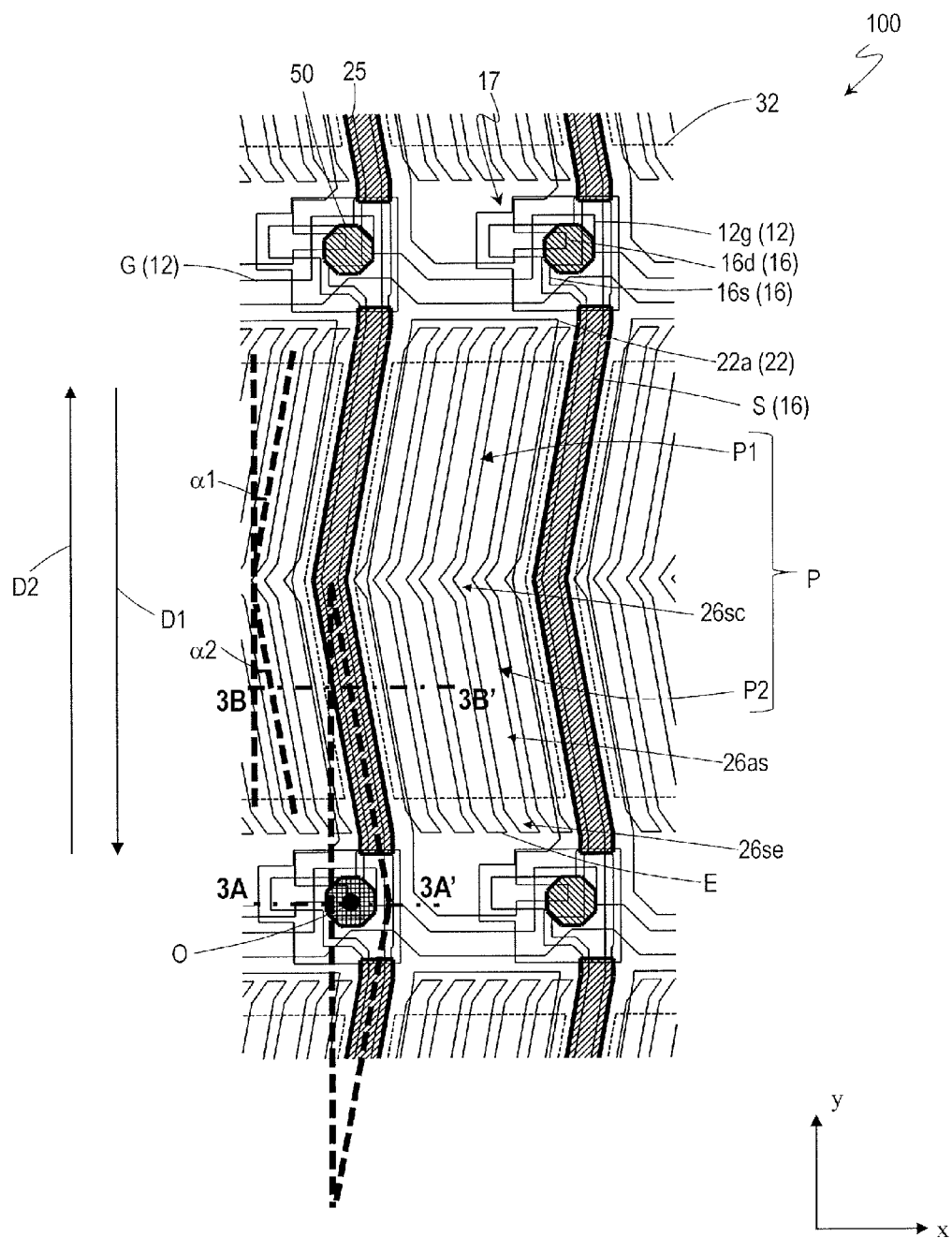
FIG. 2 is a plan view schematically illustrating the structure of a display region in the liquid crystal display panel 100.
Figure 3A:
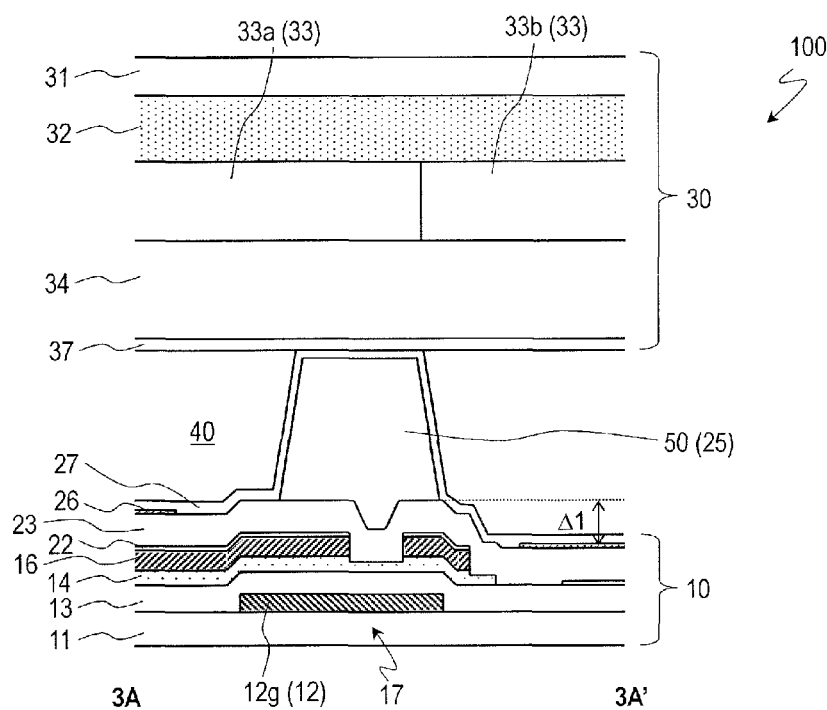
FIGS. 3A and 3B are diagrams illustrating the cross-sectional structure of the display region in the liquid crystal display panel 100, respectively taken along a line 3A-3A' and a line 3B-3B' in FIG. 2.
Figure 3B:
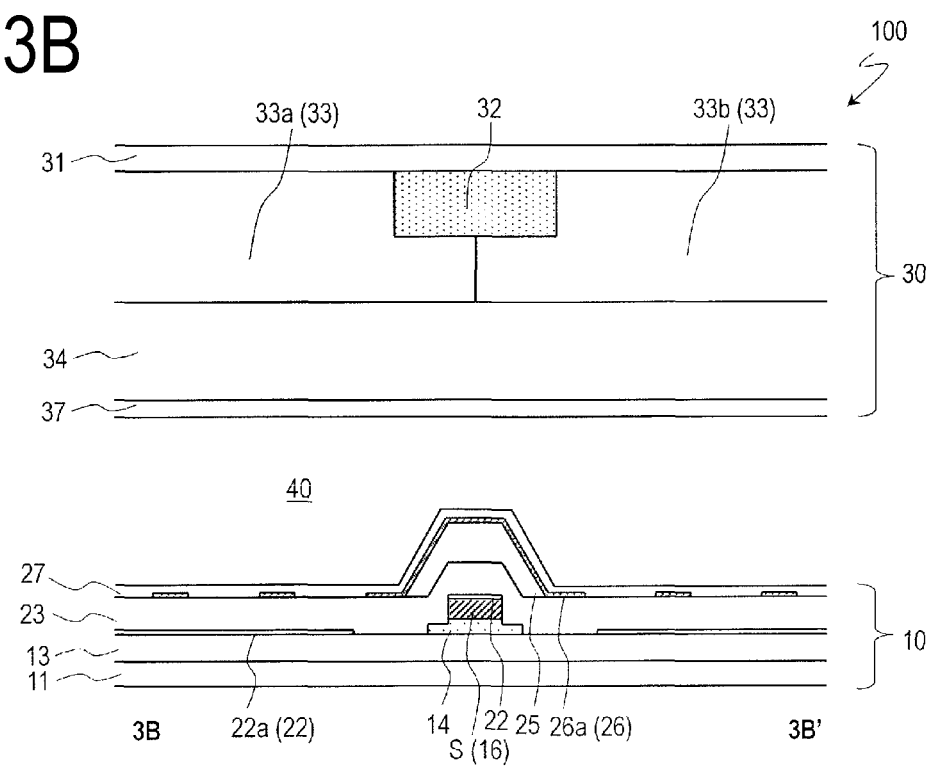

A liquid crystal display panel 100 according to a first embodiment of the present invention will be described with reference to FIGS. 1 to 3B. FIG. 1 is a plan view schematically illustrating the liquid crystal display panel 100. FIGS. 2 to 3B are a plan view and cross-sectional views schematically illustrating the structure of a display region in the liquid crystal display panel 100. FIGS. 3A and 3B are diagrams illustrating the cross-sectional structure of the display region in the liquid crystal display panel 100, respectively taken along a line 3A-3A' and a line 3B-3B' in FIG. 2.

Although the liquid crystal display panel 100 illustrated here is a FFS mode liquid crystal display panel, the liquid crystal display panel according to the embodiments is not limited thereto, and can also be applied in an IPS mode liquid crystal display panel. Additionally, the embodiments of the present invention are not limited to a transverse electrical field mode. The embodiments can also be applied in a vertical electrical field mode (e.g. a VA mode and a Twisted Nematic (TN) mode) liquid crystal display panel. An example of a CPA mode liquid crystal display panel will be given later as an example of a vertical electrical field mode.

As illustrated in FIG. 1, the liquid crystal display panel 100 includes an active matrix substrate (a first substrate) 10, a counter substrate (a second substrate) 30, and a liquid crystal layer 40 (see FIGS. 3A and 3B) provided between the active matrix substrate 10 and the counter substrate 30. The liquid crystal display panel 100 includes a plurality of pixels arranged in a matrix having a plurality of rows and a plurality of columns. In a 7-inch qHD panel, for example, color display pixels are constituted by three colors, namely R (red) pixels, G (green) pixels, and B (blue) pixels, such that when R pixel columns, G pixel columns, and B pixel columns are arranged in stripes (i.e. different colors are displayed from pixel column to pixel column), the number of pixels is 540 rows×(960×3) columns. The liquid crystal display panel 100 includes a display region 100d defined by the plurality of pixels (the region surrounded by broken lines in FIG. 1) and a non-display region 100f in the periphery of the display region 100d. The liquid crystal display panel 100 further includes a plurality of spacers 50 (see FIG. 3A) configured to hold a gap between the active matrix substrate 10 and the counter substrate 30. The plurality of spacers 50 may include spacers provided in the display region 100d, and may include spacers provided in the non-display region 100f. The non-display region 100f may include, for example, dummy pixel TFTs that do not contribute to displays, inspection TFTs used for inspecting whether there are defects in the pixels or the like in the display region 100d, two-terminal elements (diodes) (including TFTs) provided as static electricity countermeasure elements, driving TFTs, and the like. The spacers provided in the non-display region 100f may be provided overlapping with the above-described TFTs, as will be described later.

The structure of the display region 100d in the liquid crystal display panel 100 will be described with reference to FIGS. 2 to 3B. The active matrix substrate 10 includes a first transparent substrate (e.g. a glass substrate) 11 and a plurality of TFTs 17 formed on the first transparent substrate 11. Each of the TFTs 17 includes a gate electrode 12g, a semiconductor layer 14, a source electrode 16s, and a drain electrode 16d. The following are formed in the region of the active matrix substrate 10 corresponding to the display region 100d of the liquid crystal display panel 100: pixel electrodes 22a arranged in a matrix; the TFTs 17, the drain electrodes 16d of which are connected to corresponding ones of the pixel electrodes 22a; a plurality of gate bus lines G, each connected to the gate electrode 12g of a corresponding TFT 17; and a plurality of source bus lines S, each connected to the source electrode 16s of a corresponding TFT 17. Gate signal voltages (scanning signal voltages) are supplied to the gate bus lines G from a gate driver (a gate drive circuit) 62, and source signal voltages (display signal voltages) are supplied to the source bus lines S from a source driver (a source drive circuit) 65. The gate driver 62 and the source driver 65 are provided, for example, in the non-display region 100f of the liquid crystal display panel 100, as illustrated in FIG. 1. The gate driver 62 and the source driver 65 are mounted on the active matrix substrate 10 using chip on glass (COG) technology, for example. The non-display region 100f of the liquid crystal display panel 100 can include drivers mounted using COG technology. The mounting method is not limited thereto, however, and the gate driver 62 and/or the source driver 65 may be mounted on the active matrix substrate 10 using chip on film (COF). The non-display region 100f of the liquid crystal display panel 100 may be included in the active matrix substrate 10.

As illustrated in FIGS. 3A and 3B, the active matrix substrate 10 includes a gate metal layer (first metal layer) 12, a gate insulating layer 13, the semiconductor layer 14, a source metal layer (second metal layer) 16, a first transparent conductive layer 22, an inorganic insulating layer 23, an organic insulating layer 25, and a second transparent conductive layer 26. The active matrix substrate 10 further includes a first alignment film 27 on the liquid crystal layer 40 side. Each of the plurality of spacers 50 includes a part of the organic insulating layer 25. Each of the plurality of spacers 50 overlaps with at least one of the source electrode 16s and the drain electrode 16d of the corresponding TFT 17.

Figure 5:
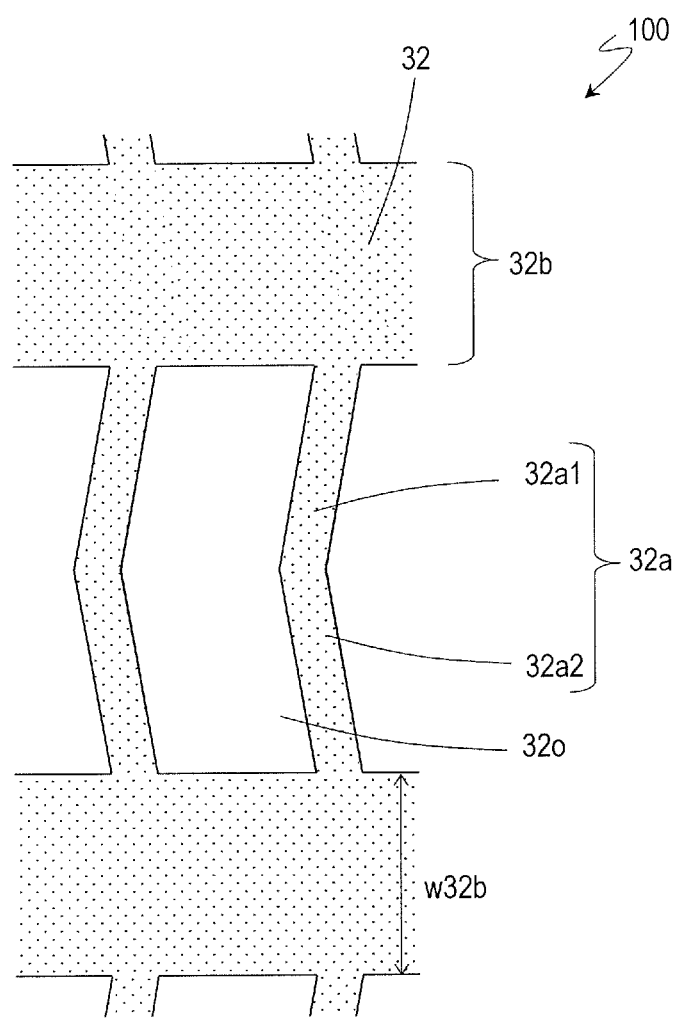
FIG. 5 is a plan view of a counter substrate 30, and is a diagram illustrating a light shielding layer (black matrix) 32.

Next, the structures of the active matrix substrate 10 and the counter substrate 30 will be described in detail with reference to FIGS. 4A to 5. FIGS. 4A to 4D are plan views of the active matrix substrate 10, where FIG. 4A is a diagram illustrating the gate metal layer 12, the semiconductor layer 14, and the source metal layer 16, FIG. 4B is a diagram illustrating the first transparent conductive layer 22 in addition to the content of FIG. 4A, FIG. 4C is a diagram illustrating the organic insulating layer 25 in addition to the content of FIG. 4B, and FIG. 4D is a diagram illustrating the second transparent conductive layer 26 in addition to the content of FIG. 4C. FIG. 4A is a diagram in which the gate metal layer 12 and the source metal layer 16 are indicated by hatching, FIG. 4B is a diagram in which the first transparent conductive layer 22 is indicated by hatching, FIG. 4C is a diagram in which the organic insulating layer 25 is indicated by hatching, and FIG. 4D is a diagram in which the second transparent conductive layer 26 is indicated by hatching. FIG. 5 is a plan view of the counter substrate 30, and is a diagram illustrating a light shielding layer (black matrix) 32.

The gate metal layer (first metal layer) 12 is provided on the first transparent substrate 11. The gate metal layer (first metal layer) 12 includes the gate electrodes 12g of the TFTs 17 and a plurality of the gate bus lines (a plurality of first wiring lines) G. The gate metal layer 12 may have a single-layer structure, or may have a layered structure in which a plurality of layers are layered. The gate metal layer 12 includes at least a layer formed from a metal material. In a case where the gate metal layer 12 has a layered structure, some of the layers may be formed from a metal nitride or a metal oxide.

In this specification, the gate metal layer (first metal layer) 12 is a layer containing electrodes, wiring lines, terminals, and the like formed by patterning a conductive film that forms the gate electrodes 12g and the gate bus lines G. In other words, in addition to the gate electrodes 12g and the gate bus lines G, the pattern of the gate metal layer 12 includes electrodes, wiring lines, terminals, and the like formed by patterning a conductive film that forms the gate electrodes 12g and the gate bus lines G. Likewise, the source metal layer (second metal layer) 16 is a layer containing electrodes, wiring lines, terminals, and the like formed by patterning a conductive film that forms the source electrodes 16s, the drain electrodes 16d, and the source bus lines S, and may include drain lead-out wiring lines for connecting the drain electrodes 16d to the pixel electrodes 22a, for example, in addition to the source electrodes 16s, the drain electrodes 16d, and the source bus lines S. In other words, in addition to the source electrodes 16s, the drain electrodes 16d, and the source bus lines S, the pattern of the source metal layer 16 includes electrodes, wiring lines, terminals, and the like (e.g. drain lead-out wiring lines) formed by patterning a conductive film that forms the source electrodes 16s, the drain electrodes 16d, and the source bus lines S.

The gate insulating layer 13 is provided on the gate metal layer 12. In other words, the gate insulating layer 13 is formed covering the gate electrodes 12g and the gate bus lines G. The gate insulating layer 13 is formed from an inorganic insulating material.

The semiconductor layer 14 is provided on the gate insulating layer 13, and includes an active layer of the TFTs 17. The active layer of the TFTs 17 includes channel regions 14i. The semiconductor layer 14 may have a layered structure including an intrinsic semiconductor layer (e.g. an amorphous silicon layer) and a semiconductor layer having reduced resistance obtained by doping a semiconductor with an impurity a phosphorous-doped $n^+$ amorphous silicon layer). However, the channel regions 14i do not include the impurity-doped semiconductor layer. The impurity-doped semiconductor layer is formed in portions aside from the channel regions 14i, for example. Preferably, the impurity-doped semiconductor layer is provided within the active layer of the TFTs 17, in source regions and drain regions. Part of the impurity-doped semiconductor layer may be disposed under the source bus lines S. In this case, parts of the impurity-doped semiconductor layer function as source bus lines.

The source metal layer (second metal layer) 16 is provided on the semiconductor layer 14. The source metal layer (second metal layer) 16 includes the source electrodes 16s and the drain electrodes 16d of the TFTs 17, and a plurality of the source bus lines a plurality of second wiring lines) S. The source metal layer 16 may have a single-layer structure, or may have a layered structure in which a plurality of layers are layered. The source metal layer 16 includes at least a layer formed from a metal material. In a case where the source metal layer 16 has a layered structure, some of the layers may be formed from a metal nitride or a metal oxide. The gate metal layer 12 and the source metal layer 16, which include layers formed from a metal material, are generally more conductive than conductive layers formed from a transparent conductive material. This makes it possible to reduce the width of the wiring lines, which contributes to higher resolutions and improvements in pixel aperture ratios.

The first transparent conductive layer 22 is provided on the source metal layer 16. The first transparent conductive layer 22 is formed from a transparent conductive material. The first transparent conductive layer 22 includes first transparent electrodes 22a electrically connected to the drain electrodes 16d of corresponding ones of the TFTs 17. The first transparent electrodes 22a electrically connected to the drain electrodes 16d function as pixel electrodes. The pixel electrodes 22a are in direct contact with the drain electrodes 16d, for example. The first transparent conductive layer 22 and the source metal layer 16 may be in direct contact. Here, the first transparent conductive layer 22 and the source metal layer 16 being "in direct contact" means that no insulating layer is present between the first transparent conductive layer 22 and the source metal layer 16. In a case where no insulating layer is present between the pixel electrodes 22a and the drain electrodes 16d, the pixel electrodes 22a and the drain electrodes 16d can be electrically connected without carrying out a step for forming the insulating layer and a step for forming contact holes in the insulating layer. The TFTs 17 and the pixel electrodes 22a are provided on a pixel-by-pixel basis (i.e. each pixel includes a TFT 17 and a pixel electrode 22a).

The inorganic insulating layer 23 is provided on the semiconductor layer 14, the source metal layer 16, and the first transparent conductive layer 22. In other words, the first transparent conductive layer 22 is formed under the inorganic insulating layer 23.

The second transparent conductive layer 26 is formed on the inorganic insulating layer 23. The second transparent conductive layer 26 includes second transparent electrodes 26a that are not electrically connected to the pixel electrodes 22a. The second transparent electrodes 26a function as common electrodes. The common electrodes 26a face the pixel electrodes 22a with the inorganic insulating layer 23 located therebetween, and the pixel electrodes 22a, the common electrodes 26a, and the inorganic insulating layer 23 located therebetween constitute an auxiliary capacitance. The auxiliary capacitance is electrically connected (connected in parallel) to a liquid crystal capacitance (a capacitance formed by the pixel electrodes 22a, the common electrodes 26a, and the liquid crystal layer 40), and thus an effect can be achieved in which the auxiliary capacitance holds the liquid crystal capacitance. The pixel electrodes 22a and the common electrodes 26a constitute electrode pairs that produce a transverse electrical field in the liquid crystal layer 40. The common electrodes 26a include a plurality of slits 26as extending parallel to each other. Note that the arrangement relationship of the pixel electrodes 22a and the common electrodes 26a may be reversed. In other words, the first transparent electrodes 22a may function as the common electrodes and the second transparent electrodes 26a may function as the pixel electrodes. In this case, the pixel electrodes 26a include a plurality of slits. Here, the number of slits in the second transparent electrodes 26a (the common electrodes 26a or the pixel electrodes 26a) need not be a plurality for each pixel, and at least one slit per pixel is sufficient.

The organic insulating layer 25 is formed on the inorganic insulating layer 23. The organic insulating layer 25 may be in direct contact with the inorganic insulating layer 23. Parts of the organic insulating layer 25 constitute the spacers 50. In other words, each of the plurality of spacers 50 includes a part of the organic insulating layer 25. The plurality of spacers 50 may include spacers 50 in direct contact with the inorganic insulating layer 23. The spacers 50 are provided to hold a gap between the active matrix substrate 10 and the counter substrate 30.

The plurality of spacers 50 can include, for example, first spacers 51 that define a distance between the active matrix substrate 10 and the counter substrate 30, and second spacers 52 that are lower than the first spacers 51. In other words, the first spacers 51 control the thickness of the liquid crystal layer 40 (also called a "cell gap"). The first spacers 51 may be called "main spacers", and the second spacers 52 may accordingly be called "sub spacers". Typically, the first spacers 51 are in contact with the counter substrate 30, but the second spacers 52 are not in contact with the counter substrate 30. However, the first spacers 51 are not necessarily in contact with the counter substrate 30. For example, it is possible that the cell gap will vary in at least part of the liquid crystal layer 40 in a case where the temperature of the liquid crystal layer 40 changes, in a case where the display panel is attached to another object using attachment members (e.g. attachment screws or the like) and mechanically deforms at the positions where the attachment members are located, in a case where the liquid crystal display panel is installed in a curved state, or the like.

The second spacers 52 can be omitted, but including the second spacers 52 in addition to the first spacers 51 provides the following effects. In liquid crystal display panels in the related art, increasing the density at which photo spacers are disposed (the number of photo spacers per unit of area) to improve the load-bearing characteristics has been a problem in that doing so makes it more likely that low-temperature bubbling (vacuum bubbling) will occur. In the liquid crystal display panel 100, the cell gap is basically controlled only by the first spacers 51, and thus the spacer density is essentially defined by the first spacers 51 only. This makes it easy for the cell gap to follow contraction of the liquid crystal layer 40, which makes it possible to suppress the occurrence of low-temperature bubbling. Additionally, when the cell gap narrows due to a load being exerted on the liquid crystal display panel 100, both substrates are supported by both the first spacers 51 and the second spacers 52 (the effective spacer density at this time is defined by both the first spacers 51 and the second spacers 52), and thus good load-bearing characteristics can be realized.

The plurality of spacers 50 are provided on a pixel-by-pixel basis, for example. The plurality of spacers 50 may be provided for all of the plurality of pixels in the liquid crystal display panel 100, or may be provided for only some of the pixels. The ratio between the first spacers 51 and the second spacers 52 may also be set as desired, and may be set as appropriate in consideration of the application of the liquid crystal display panel (the planned usage environment), the number of pixels, and the like.

Each of the spacers 50 provided in the display region 100d of the liquid crystal display panel 100 is disposed overlapping with a corresponding TFT 17 when viewed from the normal direction of the active matrix substrate 10. In other words, as illustrated in FIG. 4C, each of the spacers 50 is disposed overlapping with the source electrode 16s and the drain electrode 16d of a corresponding TFT 17 when viewed from the normal direction of the active matrix substrate 10. As will be described below, it is sufficient that each of the spacers 50 be disposed overlapping with at least one of the source electrode 16s and the drain electrode 16d of the corresponding TFT 17.

As illustrated in FIGS. 3A and 3B, the counter substrate 30 includes, for example: a second transparent substrate (e.g. a glass substrate) 31; the light shielding layer (black matrix) 32, which is provided on the second transparent substrate 31 and has openings 32o; a color filter layer 33; and an overcoat layer 34 that covers the color filter layer 33. The counter substrate 30 further includes a second alignment film 37 on the liquid crystal layer 40 side. The color filter layer 33 includes, for example, three types of color filters that transmit light of mutually-different colors, i.e. a first color filter 33a, a second color filter 33b, and a third color filter (not illustrated).

Figure 6:
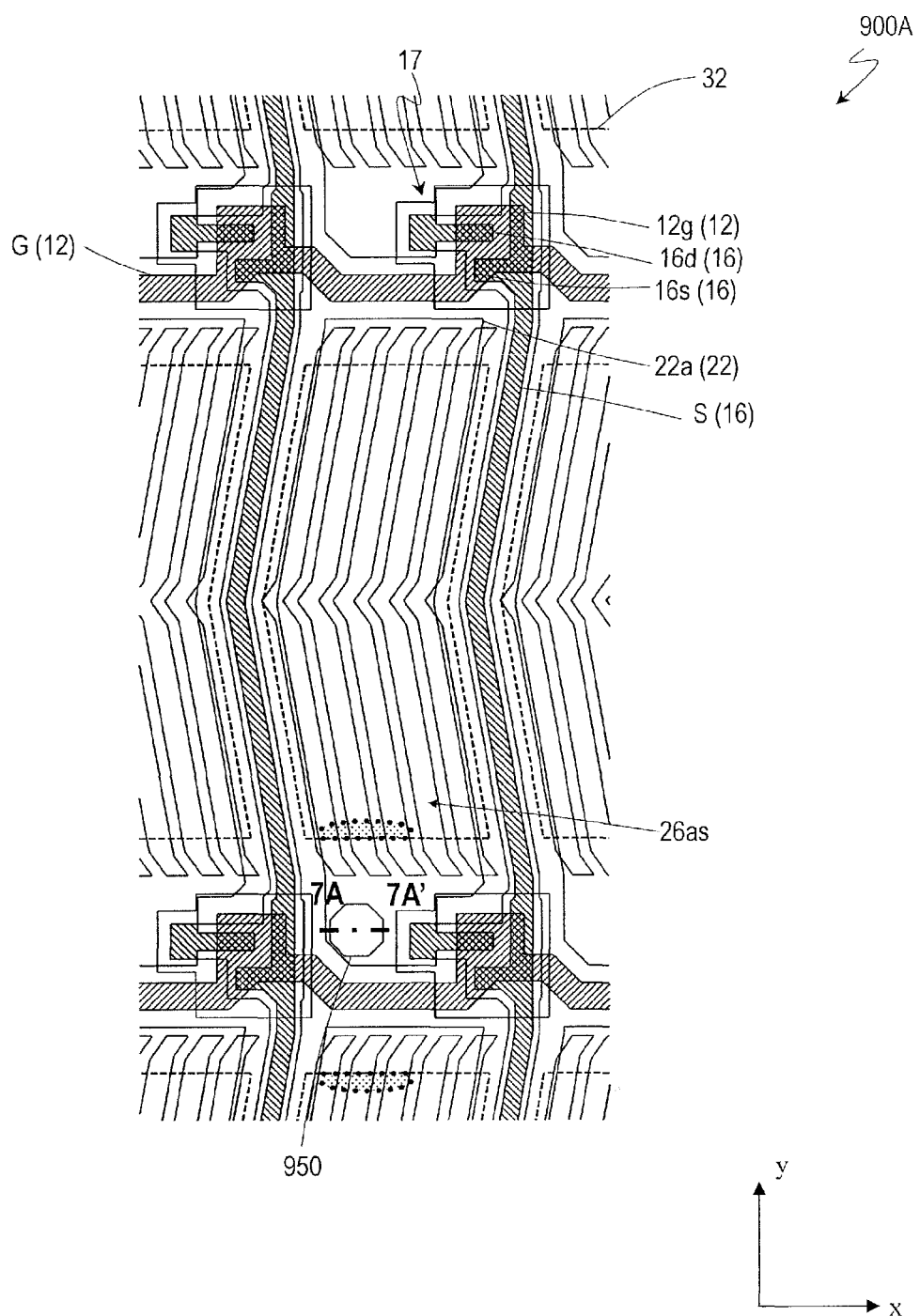
FIG. 6 is a plan view schematically illustrating the structure of a display region in a liquid crystal display panel 900A according to a first comparative example.
Figure 7:
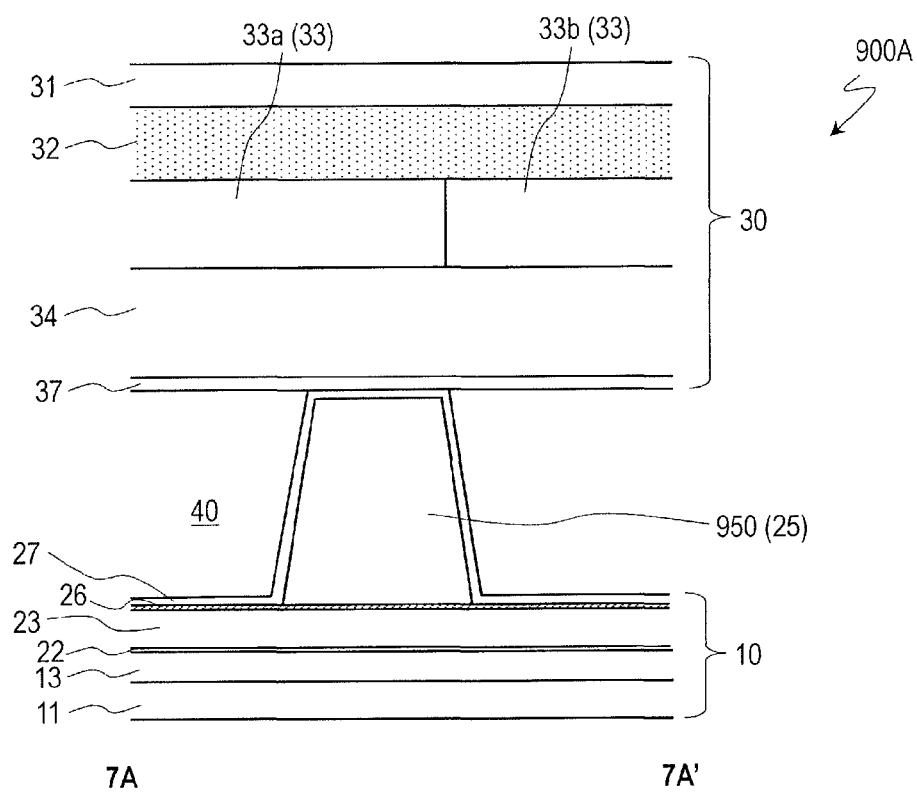
FIG. 7 is a diagram schematically illustrating the cross-sectional structure of the display region in the liquid crystal display panel 900A according to the first comparative example, taken along a line 7A-7A' in FIG. 6.

A problem to be solved by embodiments of the present invention will be described next with reference to FIGS. 6 and 7. FIG. 6 is a plan view schematically illustrating the structure of a display region in a liquid crystal display panel 900A according to a first comparative example, and FIG. 7 is a diagram schematically illustrating the cross-sectional structure of the display region in the liquid crystal display panel 900A according to the first comparative example, taken along a line 7A-7A' in FIG. 6. The liquid crystal display panel 900A according to the first comparative example, which, aside from the locations where the spacers are provided, has the same structure as the liquid crystal display panel 100, will be described as an example.

In regions near spacers 950, which are indicated by dotted lines in FIG. 6, the liquid crystal display panel 900A according to the first comparative example often suffers a drop in display quality caused by disorder in the alignment of the liquid crystal molecules. Investigations made by the inventors of the present invention as to the cause of this will be described here. Note that the following are merely considerations on the part of the inventors, and are not intended to limit the present invention.

Insufficient alignment treatment on the alignment film in the periphery of the spacers was found to be one cause of the problem of the display quality dropping near the spacers due to disorder in the alignment of the liquid crystal molecules.

In a transverse electrical field mode liquid crystal display panel, the alignment direction of the liquid crystal molecules when no electrical field is applied is defined, for example, by subjecting the alignment film to a rubbing treatment as an alignment treatment. When a voltage is applied to electrode pairs (here, the pixel electrodes 22a and the common electrodes 26a) to produce a transverse electrical field in the liquid crystal layer 40 (an electrical field in the horizontal direction; an electrical field parallel to the plane of the liquid crystal layer), the transverse electrical field is produced in a direction orthogonal to the direction in which the slits 26as in the common electrodes 26a extend. For example, nematic liquid crystal molecules having positive dielectric anisotropy are aligned such that the long axes of the molecules (parallel to the director) are parallel to the electrical field. Accordingly, when the liquid crystal layer 40 includes a nematic liquid crystal material having positive dielectric anisotropy, rubbing the material in a direction substantially parallel to a direction orthogonal to the direction of the transverse electrical field (the direction in which the slits 26as extend) causes the liquid crystal molecules to be aligned substantially parallel to the slits 26as when no electrical field is applied. When viewed from the normal direction of the active matrix substrate 10, the orientation of the alignment as restricted by the first alignment film 27 and the second alignment film 37 is parallel or antiparallel, for example. Generally, the alignment direction of the liquid crystal molecules when no electrical field is applied is defined so as to form an angle of greater than 0° and less than or equal to 15°, for example, with a direction orthogonal to the direction of the transverse electrical field (the direction in which the slits extend). This makes it possible to define the direction in which the liquid crystal molecules rotate (counter-clockwise or clockwise) under the transverse electrical field when a voltage is applied. The response speed of the liquid crystal molecule when a voltage is applied can be unproved as well. For example, in the liquid crystal display panel 900A according to the first comparative example illustrated in FIG. 6, a rubbing treatment has been carried out in the vertical direction in FIG. 6 (the direction parallel to the y axis in FIG. 6) so that when no electrical field is applied, the liquid crystal molecules are aligned in the vertical direction in FIG. 6.

In such a rubbing treatment, there have been situations where the alignment film is insufficiently rubbed in the periphery of the photo spacers (particularly in portions in the shadows of the spacers relative to the rubbing direction, i.e. downstream in the rubbing direction). This can produce disorder in the alignment of the liquid crystal molecules. Of the portions where the alignment treatment is insufficient, the display quality sometimes drops in regions not covered by the light shielding layer (black matrix) 32 of the counter substrate 30 (the regions indicated by dotted lines in FIG. 6). Particularly in liquid crystal display panels that display in a normally-black mode, this causes light leakage in black display states, which has caused a drop in contrast.

The method of the alignment treatment on the alignment film is not limited to a rubbing treatment, and may be an optical alignment treatment instead. For example, the alignment treatment is sometimes carried out through an optical alignment treatment in VA mode liquid crystal display panels. The problem of the alignment treatment on the alignment film being insufficient in the periphery of the spacers can arise in optical alignment treatments as well. For example, in a case where the substrate is irradiated with light from a direction slanted relative to the normal direction of the substrate, an alignment treatment using light may not be sufficient in parts in the shadows of the spacers.

A problem of insufficient alignment treatment on the alignment film in the periphery of the spacers has been described using a transverse electrical field mode liquid crystal display panel including a nematic liquid crystal material having positive dielectric anisotropy as an example, but this problem is not limited to this example. The same problem can arise in liquid crystal display panels including a nematic liquid crystal material having negative dielectric anisotropy, as well as in vertical electrical field mode liquid crystal display panels. When using a nematic liquid crystal material having negative dielectric anisotropy, the alignment orientation of the liquid crystal molecules when no electrical field is applied may be rotated 90° from the case where a nematic liquid crystal material having positive dielectric anisotropy is used. In other words, the alignment direction of the liquid crystals when no electrical field is applied may be defined as substantially parallel to the direction of the transverse electrical field (a direction orthogonal to the direction in which the slits extend) or so as to form an angle of approximately greater than 0° and less than or equal to 15° with the direction of the transverse electrical field. For example, in the example illustrated in FIG. 6, the alignment treatment may be carried out in the horizontal direction in FIG. 6 (a direction parallel to the x axis in FIG. 6).

The alignment treatment on the alignment film can include a process for defining the alignment direction of the liquid crystal molecules when no electrical field is applied and a process for defining a pretilt angle. The "alignment direction (or alignment orientation) of the liquid crystal molecules" refers to an azimuth angle direction in the display plane, whereas the "pretilt angle" refers to an angle formed by the liquid crystal molecules with the surface of the alignment film.

The above-described problem of the display quality dropping due to insufficient alignment treatment on the alignment film in the periphery of the spacers can arise regardless of whether the spacers are main spacers or sub spacers. However, the higher the spacers are, the greater the region in the shadows of the spacers will be when carrying out the alignment treatment, which tends to make the above-described problem more likely to occur.

For such reasons, in the liquid crystal display panel 900A according to the first comparative example, the alignment of the liquid crystal molecules often becomes distorted in the regions near the spacers 950, indicated by the dotted lines in FIG. 6, which causes a drop in the display quality.

The ability of the liquid crystal display panel 100 according to the first embodiment of the present invention to solve the above-described problems will be described with reference again to FIGS. 2 to 5.

As described above, unlike the liquid crystal display panel 900A according to the first comparative example, each of the spacers 50 provided in the display region 100d of the liquid crystal display panel 100 is disposed overlapping with a corresponding TFT 17 when viewed from the normal direction of the active matrix substrate 10. In other words, each of the spacers 50 is disposed overlapping with at least one of the source electrode 16s and the drain electrode 16d of a corresponding TFT 17 when viewed from the normal direction of the active matrix substrate 10.

In the liquid crystal display panel 100, a drop in the display quality is suppressed even in a case where an alignment treatment is carried out in the vertical direction in FIG. 2 (the direction parallel to the y axis in FIG. 2). This is because most of the regions, in the vertical direction of the spacers 50, for which the alignment treatment is insufficient overlap with the light shielding layer 32. The liquid crystal display panel 100 can therefore suppress a drop in the display quality caused by disorder in the alignment of the liquid crystal molecules near the spacers without causing a drop in the aperture ratio.

Suppressing a drop in the display quality caused by insufficient alignment treatment on the alignment film in the periphery of the spacers will be described in more detail using the structure of the liquid crystal display panel 100 as an example.

The liquid crystal display panel 100 includes a plurality of pixels P, and each of the pixels P has a first domain P1 and a second domain P2 in which the slits 26as extend in different directions. An alignment restriction direction D1 defined by the first alignment film 27 forms an angle α1 from 0° to 15° with the direction in which the slits 26as extend in the first domain P1 and an angle α2 from 0° to 15° with the direction in which the slits 26*as* extend in the second domain P2. The angles α1 and α2 are typically equal. The direction in which the source bus lines S extend in each of the pixels P is substantially parallel to the direction in which the slits 26*as* extend. In other words, the source bus lines S extend in different directions in the first domain P1 and the second domain P2. The alignment restriction direction D1 defined by the first alignment film 27 forms the angle α1 with the direction in which the source bus lines S extend in the first domain P1 and the angle α2 with the direction in which the source bus lines S extend in the second domain P2. When viewed from the normal direction of the active matrix substrate 10, an alignment restriction direction D2 defined by the second alignment film 37 is, for example, antiparallel to the alignment restriction direction D1, as illustrated in FIG. 2. The alignment restriction direction D2 may be parallel to the alignment restriction direction D1 when viewed from the normal direction of the active matrix substrate 10.

Although the alignment restriction direction defined by the first alignment film 27 is the same in regions corresponding to the first domain P1 and regions corresponding to the second domain P2 in the first alignment film 27, the alignment restriction direction is not limited thereto, and may be varied.

As illustrated in the drawings, in both the first domain P1 and the second domain P2, both end portions 26*se* and a central part 26*sc* of each of the slits 26*as* may form an angle from 5° to 35° with the direction in which the slits 26*as* extend. This makes it possible for disorder in the alignment of the liquid crystal molecules arising when external stress is exerted on the surface of the liquid crystal display panel, e.g. when the surface of the liquid crystal display panel is pressed, to return to the normal alignment state more quickly upon the external stress being eliminated. The external stress exerted on the surface of the liquid crystal display panel sometimes acts so as to rotate the liquid crystal molecules in the direction opposite from the direction in which the liquid crystal molecules are rotated by the transverse electrical field, and thus a problem sometimes arises in which it is difficult for the liquid crystal molecules to return to the normal alignment state (i.e. the alignment state formed by the transverse electrical field) even when the external stress is eliminated. However, in a case where both end portions 26*se* and the central part 26*sc* of the slits 26*as* are slanted relative to the direction in which the slits 26*as* extend, the above-described problem is suppressed by an electrical field generated by both end portions 26*se* and the central part 26*sc*.

The following effect can also be achieved by setting both end portions 26*se* of the slits 26*as* to form an angle with the direction in which the slits 26*as* extend. When a voltage is applied to the electrode pairs, a transverse electrical field is produced in a direction orthogonal to the direction in which the slits 26*as* extend. However, edges (short sides) E of the slits 26*as* extend in a direction substantially orthogonal to the direction in which the slits 26*as* extend, and an electrical field substantially parallel to the direction in which the slits 26*as* extend is produced locally by the edges E. Forming both end portions 26*se* of the slits 26*as* so as to form an angle with the direction in which the slits 26*as* extend makes it possible to reduce the region into which the electrical field produced by the edges E extends into the slits 26*as*, which in turn makes it possible to suppress a drop in transmittance when a voltage is applied.

As illustrated in FIG. 5, the light shielding layer 32 includes first portions 32*a* covering the source bus lines S and second portions 32*b* covering the gate bus lines G. Each of the first portions 32*a* of the light shielding layer 32 includes a first portion 32*a*1 covering the source bus line S in the first domain P1 and a first portion 32*a*2 covering the source bus line S in the second domain P2. A light shielding layer (black matrix) is often provided in the regions where the source bus lines are provided in order to suppress the mixing of colors between pixels. The spacers 50 are provided overlapping with the second portions 32*b* of the light shielding layer 32. A center O of each of the spacers 50 is positioned within a region surrounded by straight lines extending from the first portion 32*a*1 of the light shielding layer 32 for a given pixel, from the first portion 32*a*2 of the light shielding layer 32 for a pixel adjacent to the given pixel in the column direction (the y-axis direction in FIG. 2), and in the alignment restriction direction D1 defined by the first alignment film 27.

Arranging the spacers 50 in this manner makes it possible to suppress a drop in the display quality caused by insufficient alignment treatment of the alignment film in the periphery of the spacers, without increasing the area of the light shielding layer 32, i.e. without reducing the aperture ratio. The positions where the spacers 50 are arranged are not limited to the above-described example, however, and may be adjusted as appropriate in consideration of the alignment restriction directions defined by the first alignment film 27 and the second alignment film 37, and the shape of the light shielding layer 32.

The spacers 50 may be provided at locations, in the display region 100*d*, where the height of inorganic insulating layer 23 is the greatest, for example. Here, the "height of the inorganic insulating layer 23" refers to the distance, in the normal direction of the active matrix substrate 10, from the surface of the first transparent substrate 11 closer to the liquid crystal layer 40 to the surface of the inorganic insulating layer 23 closer to the liquid crystal layer 40. The same applies to the other conductive layers or insulating layers provided on the active matrix substrate 10. The organic insulating layer 25 that forms the spacers 50 being thin has a benefit of making it easy to control variations in line widths, the shape of tapers, and the like in photolithography processes for patterning the organic insulating layer 25. Furthermore, in some cases, the amount of material used to form the spacers 50 can be reduced, which makes it possible to reduce manufacturing costs.

For example, the height of the inorganic insulating layer 23 at the places where the spacers 50 are provided is greater than the height of the inorganic insulating layer 23 at places where the spacers 50 are not provided but the pixel electrodes 22*a* and the common electrodes 26*a* are present.

As illustrated in FIG. 7, the places in the liquid crystal display panel 900A according to the first comparative example where the spacers 950 are provided have a layered structure including the gate insulating layer 13, the first transparent conductive layer 22, the inorganic insulating layer 23, and the second transparent conductive layer 26 on the first transparent substrate 11. In other words, these locations have a layered structure that includes neither the gate metal layer 12, the semiconductor layer 14, nor the source metal layer 16. However, as illustrated in FIG. 3A, the places in the liquid crystal display panel 100 where the spacers 50 are provided have a layered structure including the gate metal layer 12, the gate insulating layer 13, the semiconductor layer 14, the source metal layer 16, the first transparent conductive layer 22, and the inorganic insulating layer 23 on the first transparent substrate 11. In other words, the locations have a layered structure including all of the layers of the active matrix substrate 10 aside from the second transparent conductive layer 26. This makes it possible to make the height of the spacers 50 lower than the height of the spacers 950. A difference Δ1 between the height of the spacers 50 and the height of the spacers 950 (see FIG. 3A) is substantially equal to the sum of the thicknesses of the gate metal layer 12, the semiconductor layer 14, and the source metal layer 16, for example.

As can be seen by comparing FIG. 3A with FIG. 7, the places where the spacers 950 are provided in the liquid crystal display panel 900A according to the first comparative example are flatter than the places where the spacers 50 are provided in the liquid crystal display panel 100. In other words, the places where the spacers 950 are provided in the liquid crystal display panel 900A according to the first comparative example have a layered structure that includes neither the gate metal layer 12, the semiconductor layer 14, nor the source metal layer 16, and thus the surface of the active matrix substrate 10 has few recesses and protrusions. The spacers have often been provided in locations selected for having few recesses and protrusions in the surface, as with the liquid crystal display panel 900A according to the first comparative example, from the standpoint of ensuring a uniform thickness throughout the liquid crystal layer 40.

As described above, in the liquid crystal display panel 100, each of the spacers 50 is disposed overlapping with the source electrode 16s and the drain electrode 16d of a corresponding TFT 17 when viewed from the normal direction of the active matrix substrate 10. From the standpoint of achieving the above-described effect of suppressing a drop in the display quality caused by insufficient alignment treatment on the alignment film in the periphery of the spacers without reducing the aperture ratio, each of the spacers 50 may be disposed overlapping with at least one of the source electrode 16s and the drain electrode 16d of the corresponding TFT 17 when viewed from the normal direction of the active matrix substrate 10. Because the channel regions 14i of the semiconductor layer 14 are located between the source electrodes 16s and the drain electrodes 16d of the TFTs 17, it can also be said that the spacers 50 may be disposed overlapping with the channel regions 14i of the semiconductor layer 14 when viewed from the normal direction of the active matrix substrate 10.

Additionally, providing the spacers 50, which hold the gap between the active matrix substrate 10 and the counter substrate 30, on the active matrix substrate 10 makes it possible to suppress a problem in which the alignment film peels because of the spacers. Investigations made by the inventors of the present invention showed that spacers provided on the counter substrate can cause the alignment film provided on the active matrix substrate to partially peel under the influence of vibrations imparted on the liquid crystal display panel, forces from the exterior, and the like. In a case where the alignment film partially peels, the alignment of the liquid crystal molecules can become disordered in the portions where the alignment film has peeled, and this has been a cause of a drop in the display quality of liquid crystal display panels. Details will be given later. The liquid crystal layer 40 side of the active matrix substrate 10 is generally less flat than the liquid crystal layer 40 side of the counter substrate 30, and thus in a case where the counter substrate 30 includes the spacers 50, it is more likely that a problem in which the spacers 50 cause the first alignment film 27 to peel under vibrations, forces imparted from the exterior, and the like will arise. However, in the liquid crystal display panel 100, the active matrix substrate 10 includes the spacers 50, which makes it difficult for a problem to arise in which the spacers 50 cause the second alignment film 37 of the counter substrate 30 to partially peel.

Furthermore, providing the spacers 50, which hold the gap between the active matrix substrate 10 and the counter substrate 30, on the active matrix substrate 10 makes it possible to suppress unevenness in the cell gap. Even in a case where, during the step of manufacturing the active matrix substrate 10, the film thicknesses have become uneven in the steps leading up to the step of providing the spacers 50, making the heights from the first transparent substrate 11 to the spacers 50 (and more specifically, the heights, in the normal direction of the active matrix substrate 10, from the surface of the common electrodes 26a closer to the liquid crystal layer 40 to the surfaces of the spacers 50 closer to the liquid crystal layer 40) even compensates for such unevenness and makes it possible to ensure that the cell gap is constant.

In a case where the spacers 50 are provided on the counter substrate 30, there is a problem in that the aperture ratio can drop in order to control the cell gap. The liquid crystal layer 40 side of the active matrix substrate 10 is generally less flat than the liquid crystal layer 40 side of the counter substrate 30, and thus the surface area over which the spacers 50 contact the active matrix substrate 10 may become smaller than the cross-sectional area of the spacers 50 as viewed from the normal direction of the active matrix substrate 10 (in a case where the spacers 50 have a tapered shape, the area of the surfaces of the spacers closer to the liquid crystal layer 40). Therefore, in light of alignment skew between the active matrix substrate 10 and the counter substrate 30 (e.g. less than or equal to approximately 5 μm), it may be necessary to increase the surface area of the spacers 50 or increase the number of spacers 50 provided. Such a problem can be suppressed when the spacers 50 are provided on the active matrix substrate 10, and thus the cell gap can be controlled without reducing the aperture ratio.

As described above, the liquid crystal display panel 100 includes the TFTs 17, which are bottom-gate TFTs, for example. In a liquid crystal display panel including bottom-gate TFTs, a light shielding layer is typically provided covering the active layers of the TFTs, and thus such a panel can be used favorably for the object of the present invention, namely to suppress a drop in the display quality caused by disorder in the alignment of the liquid crystal molecules near the spacers without causing a drop in the aperture ratio of the liquid crystal display panel. However, the liquid crystal display panel according to embodiments of the present invention is not limited to the structure illustrated here, and may instead include top-gate TFTs, for example. In other words, the arrangement relationship of the gate metal layer 12 and the source metal layer 16 may be reversed.

Preferably, plurality of spacers 50 are located on an inner side of a pattern provided in the gate metal layer 12, e.g. the gate electrodes 12g, when viewed from the normal direction of the active matrix substrate 10. This is because when patterning an organic insulating film using a photolithography process during the step of forming the organic insulating layer 25, in a case where the pattern includes a mixture of places where a metal layer (a reflective layer) is provided under the organic insulating film and places where such a metal layer is not provided, the exposure time required to achieve the desired spacer shape may vary. From the standpoint of preventing variations in the shapes of the spacers 50, it is preferable that the plurality of spacers 50 be located on an inner side of the pattern provided in the gate metal layer 12, e.g. the gate electrodes 12g, when viewed from the normal direction of the active matrix substrate 10. In other words, it is sufficient that the spacers 50 all overlap with the gate metal layer 12 and/or the source metal layer 16 when viewed from the normal direction of the active matrix substrate 10. That is, it is sufficient that the spacers 50 be on inner sides of the pattern provided in the gate metal layer 12 the gate electrodes 12g) and/or the pattern provided in the source metal layer 16 (e.g. the source electrodes 16s, the drain electrodes 16d) when viewed from the normal direction of the active matrix substrate 10. To put it differently, it is sufficient that the spacers 50 be formed so as not to protrude from the pattern provided in the gate metal layer 12 and/or the pattern provided in the source metal layer 16.

As described above, each of the spacers 50 includes a part of the organic insulating layer 25. In other words, the spacers 50 are formed from the same organic insulating film as the organic insulating layer 25, and thus the spacers 50 can be formed without increasing the steps in the manufacturing process. The spacers 50 do not overlap with the second transparent conductive layer 26 when viewed from the normal direction of the active matrix substrate 10.

Preferably, part of the organic insulating layer 25 is formed on the source bus lines S. In other words, as illustrated in FIGS. 3B and 4C, it is preferable that part of the organic insulating layer 25 be formed on the source bus lines S, and formed substantially parallel to the source bus lines S while covering at least part of the source bus lines S. The capacitance value of a capacitance formed between the source bus lines S and the common electrodes 26a can be reduced by forming part of the organic insulating layer 25 on the source bus lines S. As a result, the source bus line load (the product of capacitance and resistance (also called "CR product")) can be reduced, which makes it possible to suppress blunting of the signal waveforms of the source signal voltages supplied to the source bus lines S.

An organic insulating material generally tends to have a lower relative dielectric constant than an inorganic insulating material. Accordingly, providing the organic insulating layer 25 between the source bus lines S and the common electrodes 26a in addition to the inorganic insulating layer 23 formed from an inorganic insulating material makes it possible to reduce the capacitance value of capacitance formed therebetween. Alternatively, the thickness of the insulating layers required to achieve the effect of reducing the capacitance between the source bus lines S and the common electrodes 26a can be reduced. This makes it possible to suppress disorder in the alignment of the liquid crystal molecules near the source bus lines S, for example. Additionally, providing part of the organic insulating layer 25 between the source bus lines S and the common electrodes 26a makes it possible to effectively maintain the insulated state between the source bus lines S and the common electrodes 26a (reduce leak current arising between the source bus lines S and the common electrodes 26a) even in a case where flaws such as pinholes or cracks arise in the inorganic insulating layer 23 between the source bus lines S and the common electrodes 26a.

From the standpoint of achieving the above-described effects of reducing the source bus line load and reducing leak current between the source bus lines S and the common electrodes 26a, it is preferable that a width w25 of a part of the organic insulating layer 25 formed substantially parallel to the source bus lines S and covering at least part of the source bus lines S be designed to be wider than a width w16 of the source bus lines S, e.g. approximately 4 μm wider. This value can be adjusted as appropriate in consideration of line width variations during the photolithography process, the alignment precision of the patterning of the organic insulating layer 25 with respect to the source bus lines S (e.g. approximately ±1 μm), and the like.

The source bus lines S need not be entirely covered by the organic insulating layer 25. The plurality of source bus lines S may include parts not covered by the organic insulating layer 25. In a case where the area of the parts of the source bus lines S not covered by the organic insulating layer 25 increases, the above-described effects of reducing the source bus line load and suppressing leak current between the source bus lines S and the common electrodes 26a can decrease. However, this can suppress disorder in the alignment of the liquid crystal molecules near the source bus lines S due to an increased thickness in the layered structure above the source bus lines S. As such, the area of the parts of the source bus lines S not covered by the organic insulating layer 25 may be set as appropriate in consideration of the drive capability of the source driver, the number of pixels, the resolution, and the like.

Preferably, part of the second transparent conductive layer 26 is formed on the organic insulating layer 25. As illustrated in FIGS. 3B to 4D, it is preferable that the common electrodes 26a cover the parts of the organic insulating layer 25 formed covering at least part of the source bus lines S. The potential of the common electrodes 26a is constant, and thus the common electrodes 26a provided in this manner can suppress disorder in the alignment of the liquid crystal molecules resulting from changes in the electrical field caused by the source bus lines S.

On the other hand, it is preferable that the layered structure not include the organic insulating layer 25 in each of the pixel openings, as illustrated in FIGS. 3B to 4D. In other words, it is preferable that each of the pixel openings have a layered structure including the first transparent conductive layer 22, the inorganic insulating layer 23, and the second transparent conductive layer 26, but not including the organic insulating layer 25. Here, "pixel opening" refers to a region in the display region 100d that contributes to the display. "Pixel aperture ratio" refers to a ratio of the surface area of the regions contributing to the display relative to the surface area of the display region 100d. For example, in the liquid crystal display panel 100, the pixel openings are defined by the openings 32o in the tight shielding layer 32. In particular, the electrode pairs producing the transverse electrical field in the liquid crystal layer 40 (here, the pixel electrodes 22a and the common electrodes 26a) face each other with the inorganic insulating layer 23 located therebetween, and the organic insulating layer 25 is not present between the electrode pairs. In other words, it is preferable that the organic insulating layer 25 not be present between the pixel electrodes 22a and the common electrodes 26a. In this case, the thickness of the insulating layers between the electrode pairs can be reduced, and the capacitance value of the auxiliary capacitance formed by the electrode pairs can be increased, as compared to a situation where both the inorganic insulating layer 23 and the organic insulating layer 25 are present between the electrode pairs. The effect of holding the liquid crystal capacitance increases, and thus the occurrence of flicker and the like can be suppressed effectively. Additionally, electrical field components in the normal direction of the substrate (vertical electrical field) arising near the slits 26as in the common electrodes 26a can be reduced, and thus transverse electrical field components can be relatively increased. This makes it possible to reduce the value of the voltage applied to the electrode pairs for obtaining the same display luminance, and thus the power consumption can be reduced.

A method for manufacturing the liquid crystal display panel 100 will be described next.

First, the gate metal layer (first metal layer) 12 including the gate electrodes 12g and the gate bus lines G is formed on the first transparent substrate (e.g. a glass substrate) 11. Specifically, the first metal layer 12 is formed by depositing a first conductive film on the first transparent substrate 11 and then patterning the first conductive film. For example, aluminum (Al), chromium (Cr), copper (Cu), tantalum (Ta), titanium (Ti), molybdenum (Mo), tungsten (W), or an alloy thereof can be used as the material of the first conductive film. The first conductive film may have a single-layer structure, or may have a layered structure in which a plurality of layers are layered. For example, a Ti/Al/Ti (upper layer/intermediate layer/lower layer) layered body or a Mo/Al/Mo layered body can be used. The layered structure of the first conductive film is not limited to a three-layer structure, and may be a layered structure having two layers or four or more layers. Furthermore, it is sufficient that the first conductive film includes at least a layer formed from a metal material, and in a case where the first conductive film has a layered structure, some of the layers may be formed from a metal nitride or a metal oxide. Here, a 30 nm-thick Ti layer, a 200 nm-thick Al layer, and a 100 nm-thick Ti layer are deposited in sequence through sputtering, for example, to form the first conductive film, and the first conductive film is then patterned through a photolithography process to form the first metal layer 12. A known photolithography process can be used. More specifically, a photoresist is applied on the first conductive film and is then patterned by exposing the photoresist using a photomask having a desired pattern and developing the photoresist. The first metal layer 12 having a desired pattern is formed on the first transparent substrate by etching the first conductive film using the resist pattern as an etching mask. Finally, the photoresist is removed.

As illustrated in FIGS. 2 and 4A to 4D, the gate bus lines G are formed extending in the x-axis direction in FIG. 2, for example. As illustrated in the drawings, the gate bus lines G may be curved at parts intersecting with the source bus lines S. In other words, the gate bus lines G may have cutout portions cut out along the y-axis direction at the parts where the gate bus lines G and the source bus lines S intersect. The cutout portions are formed, for example, in trapezoid shapes on the lower sides of the gate bus lines G (the −y-axis direction sides, in FIG. 2). Providing the cutout portions in the gate bus lines G makes it possible to reduce the area over which the gate bus lines G and the source bus lines S overlap, and thus the capacitance formed between the gate bus lines G and the source bus lines S can be reduced. However, this is not limited to the area between the gate bus lines C and the source bus lines S, and in a case where the area over which the pattern provided in the gate metal layer 12 (including the gate electrodes 12g and the like) and the pattern provided in the source metal layer 16 (including the source electrodes 16s and the like) overlap can be reduced by the cutout portions, the capacitance formed between the gate bus lines C and the source bus lines S can be reduced. Additionally, cutting out the gate bus lines G in trapezoid shapes makes it possible to lengthen the distance of the parts of the source bus lines S slanted relative to the horizontal direction (the direction parallel to the liquid crystal plane) due to the source bus lines S riding up onto the gate bus lines G, and thus the likelihood that the source bus lines S will break can be reduced.

Next, the gate insulating layer 13 is formed on the first metal layer 12. The gate insulating layer 13 is, for example, a silicon dioxide ($SiO_2$) film, a silicon nitride ($SiN_x$) film, a silicon oxide nitride ($SiO_xN_y$, (x>y)) film, a silicon nitride oxide ($SiN_xO_y$, (x>y)) film, an aluminum oxide film, a tantalum oxide film, or a layered film thereof. Here, the gate insulating layer 13 is formed by depositing a 410 nm-thick $SiN_x$ film through Chemical Vapor Deposition (CVD), for example.

Next, as illustrated in FIG. 4B, the semiconductor layer 14, the source metal layer (second metal layer) 16, and the first transparent conductive layer 22 are formed on the gate insulating layer 13. The semiconductor layer 14 includes the channel regions 14i. The source metal layer (second metal layer) 16 includes the source electrodes 16s, the drain electrodes 16d, and the source bus lines S. The first transparent conductive layer 22 includes the pixel electrodes 22a.

The semiconductor layer 14, the source metal layer (second metal layer) 16, and the first transparent conductive layer 22 can be formed using two photomasks through the following step. Specifically, first, a semiconductor film is deposited on the gate insulating layer 13. Then, without patterning the semiconductor film, a second conductive film is deposited on the semiconductor film. The semiconductor film and the second conductive film are then patterned through a photolithography process using the same photomask. Next, a first transparent conductive film is deposited on the semiconductor film and the second conductive film. The first transparent conductive film is formed so as to contact the second conductive film directly. Then, the semiconductor layer 14, the source metal layer (second metal layer) 16, and the first transparent conductive layer 22 are formed by patterning the second conductive film and the first transparent conductive film through a photolithography process. In a case where the semiconductor layer 14 has a layered structure including an intrinsic semiconductor layer and an impurity-doped semiconductor layer, a step of removing the impurity-doped semiconductor film from the channel regions may furthermore be carried out.

Here, a 130 nm-thick amorphous Si film and a 40 nm-thick phosphorous-doped $n^+$ amorphous Si film are deposited in sequence through Chemical Vapor Deposition (CVD), for example. These semiconductor films may be deposited in sequence with the above-described $SiN_x$ film. Then, the second conductive film is formed on the amorphous Si film and the $n^+$ amorphous Si film, without patterning the semiconductor films. Here, the second conductive film is formed by depositing a 200 nm-thick MoNb film through sputtering, for example. The semiconductor film and the second conductive film are then patterned through a photolithography process using the same photomask. As a result, the amorphous Si film, the $n^+$ amorphous Si film, and the second conductive film are formed having substantially the same pattern shape. The pattern shapes of the amorphous Si film, the $n^+$ amorphous Si film, and the second conductive film are at this time the same as the shape of an amorphous silicon film included in the semiconductor layer 14, and are the same as the shape of the semiconductor layer 14 illustrated in FIG. 4A.

Next, the first transparent conductive film is deposited on the patterned amorphous Si film, $n^+$ amorphous Si film, and second conductive film. Here, the first transparent conductive film is formed by depositing a 65 nm-thick IZO film through sputtering, for example. The $n^+$ amorphous Si film, the second conductive film, and the first transparent conductive film are then patterned through a photolithography process. In the photolithography process, first, a photoresist is applied on the first transparent conductive film, and the photoresist is then exposed using a photomask and developed to pattern the photoresist. The photoresist is patterned so as to be provided on the portions where the pixel electrodes 22a are formed and the portions where the second metal layer 16 is formed (portions aside from the channel regions 14i). The first transparent conductive film and the second conductive film are patterned through wet etching using the resist pattern as an etching mask. The second metal layer 16 including the source electrodes 16s, the drain electrodes 16d, and the source bus lines S, and the first transparent conductive layer 22 including the first transparent electrodes 22a, are obtained from this patterning. Then, the n$^+$ amorphous Si film in the channel regions 14i is removed through dry etching using the same resist pattern as an etching mask. The semiconductor layer 14 including the channel regions 14i is obtained from this dry etching. The semiconductor layer 14, the second metal layer 16, and the first transparent conductive layer 22 are formed in this manner.

Manufacturing the semiconductor layer 14, the second metal layer 16, and the first transparent conductive layer 22 through the above-described step results in the second metal layer 16 and the first transparent conductive layer 22 having substantially the same pattern shape, aside from the pixel electrodes 22a. When viewed from the normal direction of the first transparent substrate 11, the first transparent conductive layer 22 is formed on the second metal layer 16, and the second metal layer 16 and the first transparent conductive layer 22 are in direct contact, in the regions where the second metal layer 16 is formed. The drain electrodes 16d are island-shaped, for example. Additionally, the semiconductor layer 14 has a layered structure including an intrinsic semiconductor layer and an impurity-doped semiconductor layer, whereas the channel regions 14i do not have the impurity-doped semiconductor layer. When viewed from the normal direction of the active matrix substrate 10, in the regions where the source bus lines S are formed, the semiconductor layer 14 (including the intrinsic semiconductor layer and the impurity-doped semiconductor layer) is formed under the source bus lines S, and the source bus lines S and the semiconductor layer 14 (the impurity-doped semiconductor layer) are in direct contact. When viewed from the normal direction of the active matrix substrate 10, in the regions where the source bus lines S are formed, the first transparent conductive layer 22 is formed on the source bus lines S, and the source bus lines S and the first transparent conductive layer 22 are in direct contact. The parts of the semiconductor layer 14 (the intrinsic semiconductor layer and the impurity-doped semiconductor layer) and the first transparent conductive layer 22 in direct contact with the source bus lines S function as source bus lines.

In the step of removing the n$^+$ amorphous Si film in the channel regions 14i through dry etching, the surface of the amorphous Si film in the channel regions 14i can also be etched. Accordingly, it is preferable that the thickness of the amorphous Si film deposited in the step of depositing the amorphous Si film be greater than the thickness of the amorphous Si film removed in the step of removing the n$^+$ amorphous Si film in the channel regions 14i through dry etching. Preferably, the thickness of the amorphous Si film deposited in the step of depositing the amorphous Si film is greater than the thickness of the n$^+$ amorphous Si film deposited in the step of depositing the n$^+$ amorphous Si film.

For example, aluminum (Al), chromium (Cr), copper (Cu), tantalum (Ta), titanium (Ti), molybdenum (Mo), tungsten (W), or an alloy thereof can be used as the material of the second conductive film. The second conductive film may have a single-layer structure, or may have a layered structure in which a plurality of layers are layered. For example, a Ti/Al/Ti (upper layer/intermediate layer/lower layer) layered body or a Mo/Al/Mo layered body can be used. The layered structure of the second conductive film is not limited to a three-layer structure, and may be a layered structure having two layers or four or more layers. Furthermore, it is sufficient that the second conductive film include at least a layer formed from a metal material, and in a case where the second conductive film has a layered structure, some of the layers may be formed from a metal nitride or a metal oxide. An Al film or an Al alloy film may further be formed as a lower layer of the MoNb film described as an example of the second conductive film. By further forming an Al film or an Al alloy film as a lower layer of the MoNb film, the resistance of the second metal layer 16 can be reduced.

Various types of transparent conductive materials can be used as the material of the first transparent conductive film, and for example, a metal oxide such as ITO, IZO, or ZnO can be used.

Next, the inorganic insulating layer 23 is formed on the semiconductor layer 14, the second metal layer 16, and the first transparent conductive layer 22. The inorganic insulating layer 23 is, for example, a silicon dioxide ($SiO_2$) film, a silicon nitride ($SiN_x$) film, a silicon oxide nitride ($SiO_xN_y$ (x>y)) film, a silicon nitride oxide ($SiN_xO_y$ (x>y)) film, an aluminum oxide film, a tantalum oxide film, or a layered film thereof. Here, a 250 nm-thick $SiN_x$ film is deposited through Chemical Vapor Deposition (CVD), for example. Openings are formed through patterning in the inorganic insulating layer 23, for example in regions of the non-display region 100f corresponding to contact portions for electrically connecting the first metal layer 12 and the second metal layer 16. The inorganic insulating layer 23 need not have openings in the display region 100d.

Next, the organic insulating layer 25 is formed on the inorganic insulating layer 23, as illustrated in FIG. 4C. Parts of the organic insulating layer 25 constitute the plurality of spacers 50. Specifically, the organic insulating layer 25 is formed by depositing an organic insulating film on the inorganic insulating layer 23 and then patterning the organic insulating film. A negative-working or positive-working photosensitive resin (photoresist) can be used as the material of the organic insulating film, and for example, a negative-working photosensitive resin is suitable for use. Here, the organic insulating layer 25 is formed by first providing an approximately 3 μm-thick negative-working photosensitive resin on the inorganic insulating layer 23 through a spin coating method or a slit coating method, for example, and then patterning the organic insulating film through a photolithography process. In the organic insulating layer 25, the portions constituting the spacers 50 and the portions formed on the source bus lines S may have different heights. By exposing the organic insulating film using a gray scale mask, the organic insulating layer 25 can be formed from a common organic insulating film without increasing the number of steps in the manufacture or the number of photomasks. The same applies when the plurality of spacers 50 include the first spacers 51 and the second spacers 52, which have different heights. A gray tone mask or a halftone mask can be used as the gray scale mask. In a gray tone mask, slits are formed at a resolution less than or equal to that of the exposure device, and mid-level exposure is realized by using these slits to partially block the light. On the other hand, in a halftone mask, mid-level exposure is realized by using a semi-transmissive film. Of course, the first spacers 51 and the second spacers 52 may be formed having different heights by using a plurality of photomasks.

The height difference between the first spacers 51 and the second spacers 52 is from 0.3 μm to 1.0 μm, for example.

Next, the second transparent conductive layer 26 is formed on the organic insulating layer 25, as illustrated in FIG. 4D. The second transparent conductive layer 26 includes the common electrodes 26a. Specifically, second transparent conductive layer 26 is formed by depositing a second transparent conductive film on the organic insulating layer 25 and then patterning the second transparent conductive film. Various types of transparent conductive materials can be used as the material of the second transparent conductive film, and for example, a metal oxide such as ITO, IZO, or ZnO can be used. Here, the second transparent conductive layer 26 is formed by first forming the second transparent conductive film, by depositing a 60 nm-thick IZO film through sputtering, for example, and then patterning the second transparent conductive film through a photolithography process. The common electrodes 26a and the slits 26as are formed through the patterning carried out by the photolithography process.

The first alignment film 27 and the second alignment film 37 are formed on the surfaces of the active matrix substrate 10 formed in this manner and the separately-prepared counter substrate 30. The counter substrate 30 can be manufactured through a variety of known methods. A sealing material is then added, using, for example, a dispenser method or a screen printing method, so as to enclose the region of the active matrix substrate 10 or the counter substrate 30 corresponding to the display region 100d. The liquid crystal layer 40 is formed by dripping a liquid crystal material through a dripping method onto the substrate provided with the sealing material. After the active matrix substrate 10 and the counter substrate 30 are affixed in a vacuum, the sealing material is cured by being irradiated with ultraviolet light, for example.

The liquid crystal display panel 100 can be manufactured through this step.

The liquid crystal display panel and the method for manufacturing the liquid crystal display panel according to the present embodiment are not limited to the examples described above.

For example, in the above-described manufacturing step, the semiconductor layer 14, the source metal layer (second metal layer) 16, and the first transparent conductive layer 22 are formed using two photomasks. Specifically, after the semiconductor film is deposited on the gate insulating layer 13, the second conductive film is deposited on the semiconductor film without patterning the semiconductor film. However, the semiconductor layer 14, the source metal layer (second metal layer) 16, and the first transparent conductive layer 22 may be formed using three photomasks. Specifically, the semiconductor film deposited on the gate insulating layer 13 may be patterned, after which the second conductive film may be deposited on the semiconductor film. Here, a 130 nm-thick amorphous Si film and a 40 nm-thick phosphorous-doped n$^+$ amorphous Si film may be deposited in sequence through Chemical Vapor Deposition (CVD), for example, after which an intrinsic semiconductor film and an impurity-doped semiconductor film may be patterned through a photolithography process. The shape of the pattern of the amorphous Si film at this time is the same as the shape of the amorphous silicon layer included in the semiconductor layer 14.

According to this manufacturing method, a liquid crystal display panel having an island-shaped semiconductor layer 14 can be manufactured. In other words, when viewed from the normal direction of the first transparent substrate 11, the semiconductor layer 14 (including the intrinsic semiconductor layer and the impurity-doped semiconductor layer) is not formed under the source bus lines S, and thus the thickness of the layered structure can be reduced in the regions where the source bus lines S are formed. Accordingly, the difference between the height of the common electrodes 26a above the source bus lines S and the height of the common electrodes 26a at the pixel openings can be reduced, which makes it possible to suppress disorder in the alignment of the liquid crystal molecules caused by steps near the source bus lines S, for example.

The TFTs 17 may be a known TUFT such as an amorphous silicon TFT (a-Si TFT), a polysilicon TFT (p-Si TFT), or a microcrystalline silicon TFT (μC-Si TFT), and a TFT having an oxide semiconductor layer (an oxide TFT) may be used. The semiconductor layer 14 need not include an impurity-doped semiconductor layer. The semiconductor layer 14 also need not have a layered structure. In a case where the TFTs 17 are amorphous silicon TFTs as described above, it is preferable that the semiconductor layer 14 have a layered structure including an amorphous Si layer and an n$^+$ amorphous Si layer, but in a case where the TFTs 17 are oxide TFTs, for example, the semiconductor layer 14 may have a single-layer structure of an oxide semiconductor layer. In a case where the semiconductor layer 14 has a single-layer structure, the semiconductor layer 14 may, for example, have the same pattern shape as the source metal layer 16 with the exception of the channel regions 14i. In this case, the semiconductor layer 14 and the source metal layer (second metal layer) 16 can be formed using a single photomask by using a gray scale mask. In other words, the semiconductor film and the second conductive film may be patterned through photolithography processes using the same photomask, after which the second conductive film may be removed from the channel regions.

The semiconductor layer 14 may contain an oxide semiconductor. The semiconductor layer 14 may be an oxide semiconductor layer.

The oxide semiconductor contained in the oxide semiconductor layer may be an amorphous oxide semiconductor or a crystalline oxide semiconductor having a crystalline part. A polycrystalline oxide semiconductor, a microcrystalline oxide semiconductor, and a crystalline oxide semiconductor in which the c-axis is oriented substantially perpendicular to the layer surface can be given as examples of the crystalline oxide semiconductor.

The oxide semiconductor layer may have a layered structure of two or more layers. In a case where the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer has a two-layer structure including an upper layer and a lower layer, the energy gap of the oxide semiconductor included in the upper layer is preferably greater than the energy gap of the oxide semiconductor included in the lower layer. However, in the case where the difference in the energy gap between these layers is comparatively small, the energy gap of the lower-layer oxide semiconductor may be greater than the energy gap of the upper-layer oxide semiconductor.

JP 2014-007399 A, for example, describes a material, a structure, and a film formation method of the amorphous oxide semiconductor and each of the above-described crystalline oxide semiconductors, a configuration of an oxide semiconductor layer having a layered structure, and the like. The entire contents of JP 2014-007399 A are incorporated into the present specification by reference.

The oxide semiconductor layer may contain at least one metal element selected from In, Ga, and Zn, for example. In the present embodiment, the oxide semiconductor layer contains, for example, an In—Ga—Zn—O semiconductor (e.g. indium gallium zinc oxide). Here, the In—Ga—Zn—O semiconductor is a ternary oxide of In (indium), Ga (gallium), and Zn (zinc); the ratio of In, Ga, and Zn (the composition ratio) is not particularly limited to a specific ratio, and includes, for example, In:Ga:Zn=2:2:1, In:Ga:Zn=1:1:1, In:Ga:Zn=1:1:2, and the like. Such an oxide semiconductor layer can be formed from an oxide semiconductor film containing an In—Ga—Zn—O semiconductor. Note that a channel-etched type TFT having an active layer containing an oxide semiconductor such as an In—Ga—Zn—O semiconductor may be called a "CE-OS-TFT".

The In—Ga—Zn—O semiconductor may be amorphous or crystalline. For a crystalline In—Ga—Zn—O semiconductor, a crystalline In—Ga—Zn—O semiconductor in which the c-axis is oriented substantially perpendicular to the layer surface is preferable.

Note that the above-described JP 2014-007399 A, JP 2012-134475 A, and JP 2014-209727 A, for example, disclose crystal structures of crystalline In—Ga—Zn—O semiconductors. The entire contents of JP 2012-134475 A and JP 2014-209727 A are incorporated into the present specification by reference. A TFT having an In—Ga—Zn—O semiconductor layer has a high mobility (greater than 20 times that of an a-Si TFT) and a low leak current (less than 1/100th that of an a-Si TFT), and thus can be used favorably as a driving TFT (for example, a TFT included in a drive circuit provided on the same substrate as a display region including a plurality of pixels, in the periphery of the display region) and a pixel TFT (a TFT provided in a pixel).

The oxide semiconductor layer may contain another oxide semiconductor instead of an In—Ga—Zn—O semiconductor. For example, the oxide semiconductor layer may contain an In—Sn—Zn—O semiconductor ($In_2O_3$—$SnO_2$ZnO; InSnZnO). The In—Sn—Zn—O semiconductor is a ternary oxide of in (indium), Sn (tin), and Zn (zinc). Alternatively, the oxide semiconductor layer may contain an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, a Ga—Zn—O semiconductor, or the like.

The TFTs 17 are not limited to the channel-etched TFTs described here. The TFTs 17 may be etch-stop TFTs. With "channel-etched TFTs", an etching stop layer is not formed above the channel regions, and lower faces of the end portions of the source and drain electrodes closer to the channel are arranged to be in contact with the upper face of the semiconductor layer, as illustrated in FIG. 3A, for example. A channel-etched TFT is formed by, for example, forming source/drain electrode conductive films on the semiconductor layer and then separating the source and the drain. There are situations where the surface portions in the channel regions are etched in the step of separating the source and the drain. On the other hand, with a TFT in which an etching stop layer is formed above the channel regions (an etch-stop TFT), the lower faces of the end portions of the source and drain electrodes closer the channel are located above the etching stop layer, for example. An etch-stop TFT is formed, for example, by forming an etching stop layer (e.g., a silicon oxide ($SiCO_2$) film or silicon nitride ($SiN_x$)) covering the portions of the semiconductor layer corresponding to the channel regions, forming source/drain electrode conductive films on the semiconductor layer and the etching stop layer, and then separating the source and the drain. The source and drain electrodes are in contact with the semiconductor layer through contact holes formed in the etching stop layer, for example.

A variation on the liquid crystal display panel according to the present embodiment will be described next.

Figure 8:
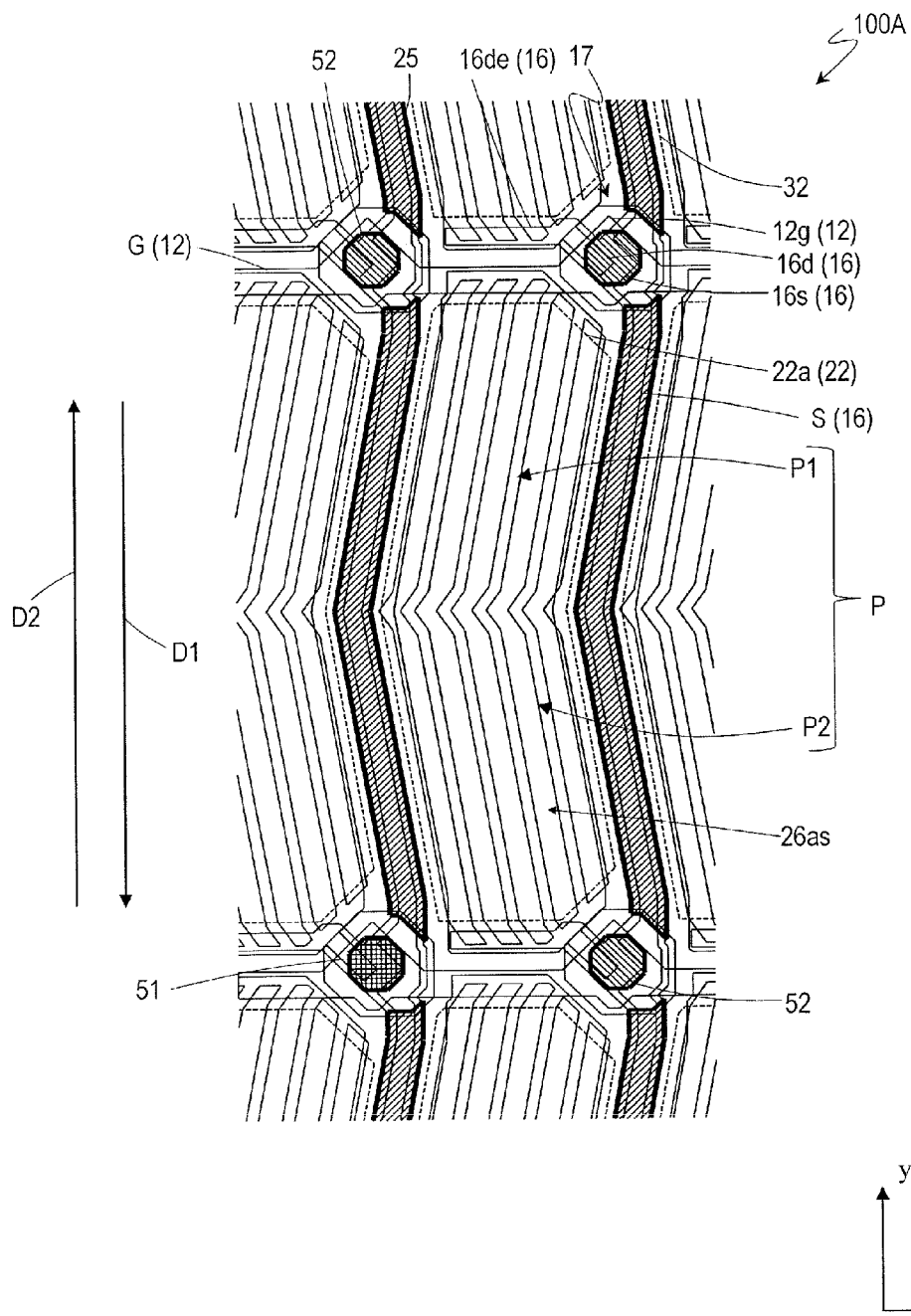
FIG. 8 is a plan view schematically illustrating the structure of a display region in a liquid crystal display panel 100A serving as a variation on the liquid crystal display panel 100.
Figure 9:
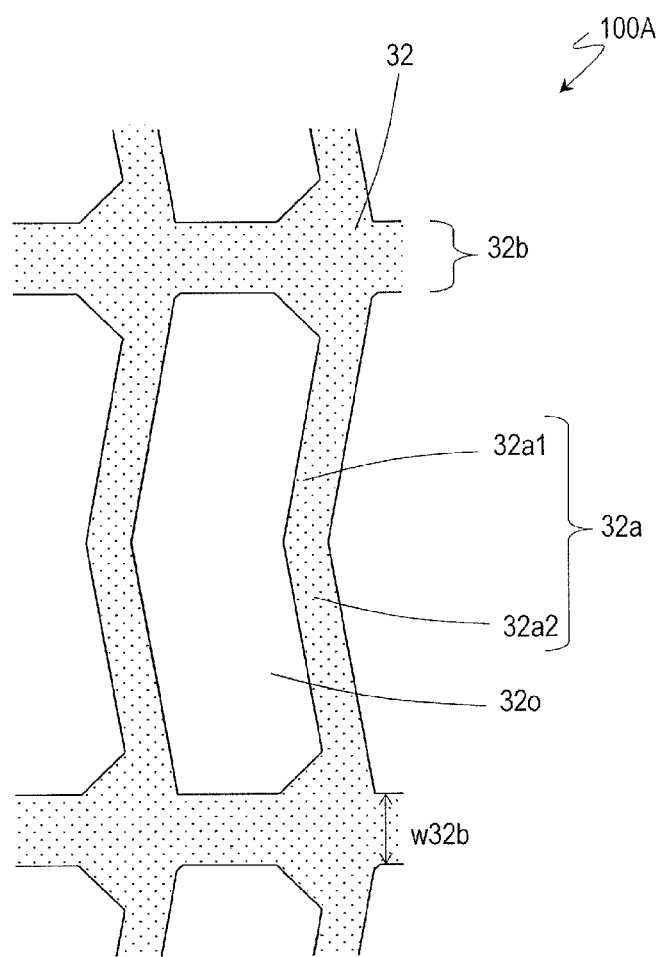
FIG. 9 is a plan view of the counter substrate 30 in the liquid crystal display panel 100A, and is a diagram illustrating the light shielding layer (black matrix) 32.

FIGS. 8 and 9 illustrate a liquid crystal display panel 100A, which is a variation on the liquid crystal display panel 100. FIG. 8 is a plan view schematically illustrating the structure of a display region in the liquid crystal display panel 100A. FIG. 9 is a plan view of the counter substrate 30 in the liquid crystal display panel 100A, and is a diagram illustrating the light shielding layer (black matrix) 32.

In the liquid crystal display panel 100A, the area of the openings 32o in the light shielding layer 32 is greater than that in the liquid crystal display panel 100. In other words, the liquid crystal display panel 100A has a greater pixel aperture ratio than that of the liquid crystal display panel 100. For example, the pixel aperture ratio of the liquid crystal display panel 100A is approximately 28% greater than the pixel aperture ratio of the liquid crystal display panel 100. For example, in the liquid crystal display panel 100, a width w32b of the second portions 32b of the light shielding layer 32 that cover the gate bus lines G is 53.5 μm, whereas in the liquid crystal display panel 100A, the width w32b of the second portions 32b of the light shielding layer 32 is 20 μm.

The liquid crystal display panel 100A also differs from the liquid crystal display panel 100 in terms of the shapes of the gate electrodes 12g, the source electrodes 16s, and the drain electrodes 16d. This, too, makes it possible to achieve a greater area for the openings 32o in the light shielding layer 32 than that in the liquid crystal display panel 100. Additionally, by providing drain lead-out wiring lines 16de for connecting the drain electrodes 16d to the pixel electrodes 22a so that the drain lead-out wiring lines 16de overlap with end portions of the slits 26as in the common electrodes 26a, disorder in the alignment of the liquid crystal molecules caused by the electrical field from the gate bus lines G can be suppressed, and thus a drop in the display quality can be effectively prevented.

The liquid crystal display panel 100A having this configuration can achieve effects similar to those of the liquid crystal display panel 100.

Second Embodiment

Figure 10:
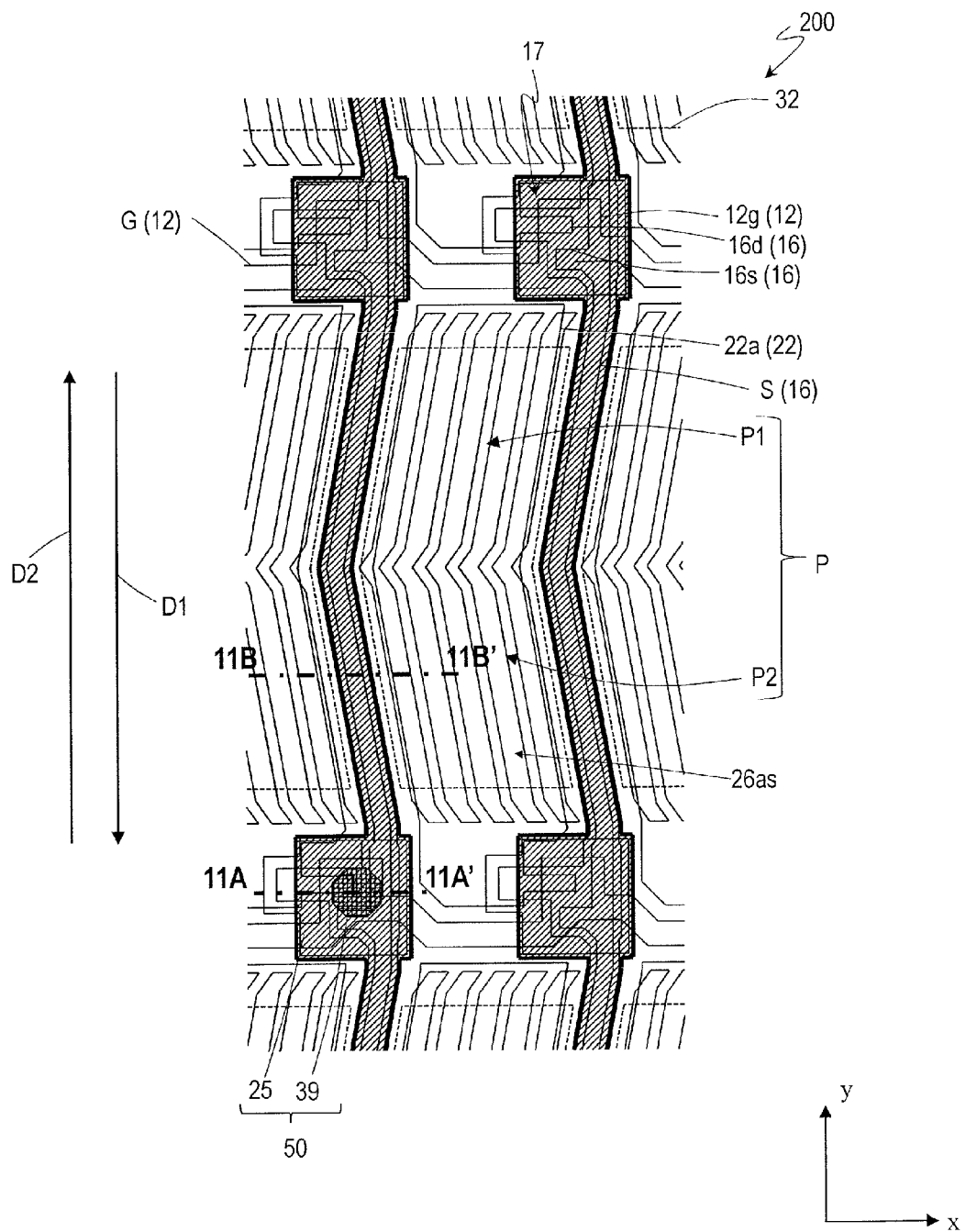
FIG. 10 is a plan view schematically illustrating the structure of a display region in a liquid crystal display panel 200 according to a second embodiment of the present invention.
Figure 11A:
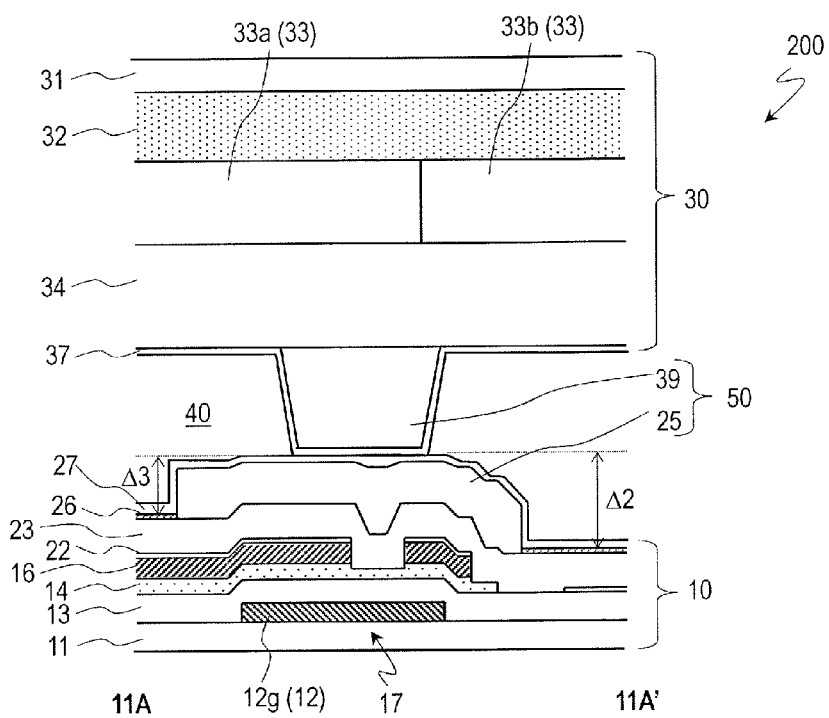
FIGS. 11A and 11B are diagrams illustrating the cross-sectional structure of the display region in the liquid crystal display panel 200, respectively taken along a line 11A-11A' and a line 11B-11B' in FIG. 10.
Figure 11B:
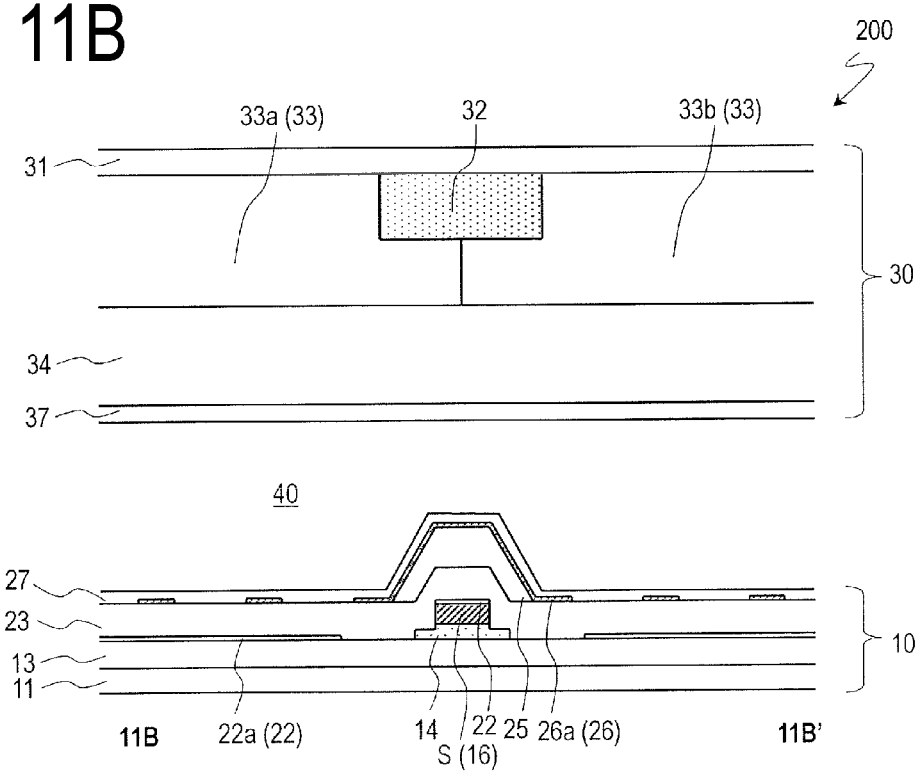

FIGS. 10 to 11B illustrate a liquid crystal display panel 200 according to the present embodiment. FIGS. 10 to 11B are a plan view and cross-sectional views, that schematically illustrate the structure of a display region in the liquid crystal display panel 200. FIGS. 11A and 11B are diagrams illustrating the cross-sectional structure of the liquid crystal display panel 200, respectively taken along a line 11A-11A' and a line 11B-11B' in FIG. 10. Note that the following descriptions focus on the ways in which the liquid crystal display panel 200 differs from the liquid crystal display panel 100 according to the first embodiment. The same applies to the subsequent embodiments as well.

As illustrated in FIGS. 10 to 11B, the liquid crystal display panel 200 differs from the liquid crystal display panel 100 according to the first embodiment in terms of the configuration of the spacers 50. In the liquid crystal display panel 200, the counter substrate 30 includes a plurality of projection-shaped structures 39 protruding toward the active matrix substrate 10, and the plurality of spacers 50 further include spacers 50 that each include one of the plurality of projection-shaped structures 39. In other words, the plurality of spacers 50 include spacers 50 that each include part of the organic insulating layer 25 and a projection-shaped structure 39. The projection-shaped structures 39 are formed from an organic insulating film formed from a photosensitive resin, for example.

With the liquid crystal display panel 200, a drop in the display quality caused by insufficient alignment treatment of the alignment film in the periphery of the spacers can be suppressed, without increasing the area of the light shielding layer 32, i.e. without reducing the aperture ratio.

Additionally, with the liquid crystal display panel 200, a situation in which the projection-shaped structures 39 provided on the counter substrate 30 cause the first alignment film 27 provided on the active matrix substrate 10 to partially peel under the influence of vibrations imparted on the liquid crystal display panel, forces from the exterior, and the like, resulting in a drop in the display quality, can be suppressed. This effect will be described in more detail hereinafter with reference to FIG. 12.

Figure 12:
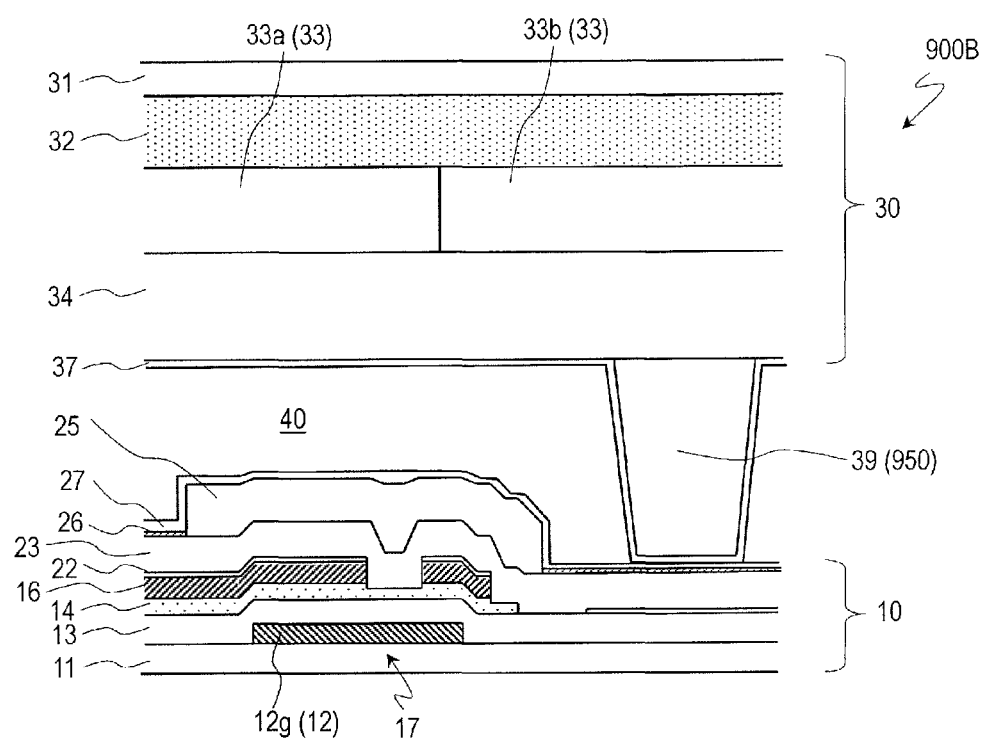
FIG. 12 is a cross-sectional view schematically illustrating the structure of a display region in a liquid crystal display panel 900B according to a second comparative example.

FIG. 12 is a cross-sectional view schematically illustrating the structure of a display region in a liquid crystal display panel 900B according to a second comparative example. The liquid crystal display panel 900B according to the second comparative example has the same structure as the liquid crystal display panel 200 aside from the locations where the spacers are provided. The liquid crystal display panel 900B according to the second comparative example has the same structure as the liquid crystal display panel 900A according to the first comparative example (see FIGS. 6 and 7) aside from the configuration of the spacers 50. FIG. 6 may be referred to when describing the liquid crystal display panel 900B according to the second comparative example.

In the liquid crystal display panel 900B according to the second comparative example, insufficient alignment treatment of the alignment film in the periphery of the spacers was found to be one cause of a drop in the display quality near the spacers 950 (the regions indicated by dotted lines in FIG. 6), as has been described with reference to FIGS. 6 and 7.

Partial peeling-off of the alignment film, caused by vibrations or external forces imparted on the liquid crystal display panel 900B according to the second comparative example, was found to be another cause. Specifically, the first alignment film 27 provided on the active matrix substrate 10 may partially peel under the influence of vibrations or forces, due to the spacers 950 provided on the counter substrate 30. In a case where the alignment film partially peels, the alignment of the liquid crystal molecules may become disordered at the locations where the alignment film has peeled. The alignment of the liquid crystal molecules has also become disordered by alignment film pieces peeled from the alignment film intermixing with the liquid crystal layer. In a case where the parts where the alignment of the liquid crystal molecules is disordered are not covered by a light shielding layer (black matrix), a drop in the display quality, such as the display becoming grainy, may result.

The effects of vibrations are prominent in liquid crystal display panels installed in vehicles such as automobiles and aircraft, for example. Furthermore, in a liquid crystal display panel that incorporates a touch panel or a digitizer, forces exerted by a user's finger or an input pen (including, for example, a stylus or a digitizer pen) touching the panel are also thought to have an effect. Touch panels include external types (where a polarizing plate is arranged on an observer side, and a touch panel is arranged closer to the observer than the polarizing plate), on-cell types, and in-cell types, (On-cell and in-cell types may be collectively referred to as "built-in types".) Of these, the problem of the alignment film peeling arises easily in on-cell and in-cell touch panels. The same problem arises easily in external types as well, in a case where the configuration provides no air gap between the display panel and the touch panel. Here, "cell" refers to a display cell (called "display panel" hereinafter). For example, a liquid crystal display panel includes a pair of substrates (e.g. an active matrix substrate and a counter substrate) facing each other with a liquid crystal layer therebetween, but does not include a polarizing plate. "On-cell" refers to a panel in which a layer providing touch panel functionality is present between a polarizing plate and the counter substrate of the liquid crystal display panel, whereas "in-cell" refers to a panel in which a layer providing touch panel functionality is present on the liquid crystal layer side of the counter substrate or on the active matrix substrate in the liquid crystal display panel.

Generally, spacers are provided so as to overlap with a light shielding layer (black matrix) provided on the counter substrate. As such, even in a case where the alignment film partially peels, the display quality will not drop as long as the places where the alignment of the liquid crystal molecules has become disordered overlap with the light shielding layer (black matrix). However, in a case where, for example, the positions of active matrix substrate 10 and the counter substrate 30 become skewed or the substrates warp (even temporarily) under the influence of the above-described vibrations or forces from the exterior, the places where the alignment film has peeled are more likely to extend to the periphery of the locations where the spacers 950 are provided. The display quality may drop in a case where the places where the alignment film has peeled and the alignment of the liquid crystal molecules has become disordered extend to locations aside from where the light shielding layer (black matrix) is provided, as illustrated in FIG. 6. The liquid crystal layer 40 side of the active matrix substrate 10 is generally less flat than the liquid crystal layer 40 side of the counter substrate 30, and thus in a case where the counter substrate 30 includes spacers, it is easier for a problem in which the spacers 50 cause the first alignment film 27 to peel under vibrations, forces imparted from the exterior, and the like to arise. For example, the first alignment film 27 may peel at specific locations (e.g. portions that overlap with the TFTs 17). Details will be given later.

It was also found that the problem of the first alignment film 27 peeling in the periphery of the places where the spacers 950 are provided arises easily in a case where, as illustrated in FIG. 12, points where the height of the inorganic insulating layer 23 is higher than that of where the spacers 950 are provided (e.g. portions overlapping with the TFTs 17) are near the spacers 950, due to the positions of active matrix substrate 10 and the counter substrate 30 becoming skewed or the substrates warping (even temporarily) as a result. This problem arises regardless of whether the spacers 950 are so-called main spacers or sub spacers. Although FIG. 12 illustrates a configuration in which the organic insulating layer 25 is formed overlapping with the TFTs 17, the problem does not only arise in this type of liquid crystal display panel. The problem can arise in a liquid crystal display panel where the organic insulating layer 25 does not overlap with the TFTs 17 as well. This is because each TUFT 17 has a layered structure in which many layers are layered, and thus the height of the inorganic insulating layer 23 is higher at the portions corresponding to the TFTs than elsewhere.

The problem of the alignment film partially peeling under vibrations or forces applied from the exterior can arise in both vertical electrical field mode and transverse electrical field mode liquid crystal display panels, and can arise regardless of the liquid crystal material contained in the liquid crystal layer and the alignment treatment method for the alignment film.

For such reasons, in the liquid crystal display panel 900B according to the second comparative example, the alignment of the liquid crystal molecules often becomes distorted in the regions near the spacers 950, indicated by the dotted lines in FIG. 6, which causes a drop in the display quality.

The ability of the liquid crystal display panel 200 according to the second embodiment of the present invention to solve the above-described problems, particularly the problem of the display quality dropping due to the alignment film partially peeling under vibrations or forces applied from the exterior, will be described with reference again to FIGS. 10 to 11B.

Unlike the liquid crystal display panel 900B according to the second comparative example, each of the spacers 50 provided in the display region of the liquid crystal display panel 200 is arranged, when viewed from the normal direction of the active matrix substrate 10, overlapping with at least one of the source electrode 16s and the drain electrode 16d of a corresponding TFT 17. In other words, each of the spacers 50 is disposed overlapping with at least one of the source electrode 16s and the drain electrode 16d of a corresponding TUFT 17 when viewed from the normal direction of the active matrix substrate 10.

As can be seen by comparing FIGS. 11A and 12, the inorganic insulating layer 23 of the active matrix substrate 10 is higher at the places where the spacers 50 are provided in the liquid crystal display panel 200 than the places where the spacers 950 are provided in the liquid crystal display panel 900B according to the second comparative example. The places where the spacers 50 are provided in the liquid crystal display panel 200 are typically the places in the display region 100d where the inorganic insulating layer 23 is highest. Accordingly, the height of inorganic insulating layer 23 is lower near the spacers 50 than the height of the inorganic insulating layer 23 at the places where the spacers 50 are provided. In the liquid crystal display panel 200, the problem can be suppressed in which the first alignment film 27 peels near the places where the spacers 50 are provided as a result of, for example, the positions of the active matrix substrate 10 and the counter substrate 30 becoming skewed or the substrates warping. In the liquid crystal display panel 200, a drop in the display quality can be suppressed that is caused by the alignment film partially peeling in the periphery of the spacers, without reducing the aperture ratio.

As can be seen by comparing FIGS. 11A and 12, the surface of the active matrix substrate 10 in the liquid crystal display panel 900B according to the second comparative example at the places where the spacers 950 are provided is flatter than the surface of the active matrix substrate 10 in the liquid crystal display panel 200 at the places where the spacers 50 are provided. In other words, at the places where the spacers 950 are provided in the liquid crystal display panel 900B according to the second comparative example, the active matrix substrate 10 has a layered structure that includes neither the gate metal layer 12, the semiconductor layer 14, nor the source metal layer 16, and thus the surface of the active matrix substrate 10 has few recesses and protrusions. From the standpoint of ensuring that the liquid crystal layer 40 has a uniform thickness, places where the liquid crystal layer 40-side surface of the active matrix substrate 10 has few recesses and protrusions have often been selected when providing the spacers on the counter substrate 30, as for the liquid crystal display panel 900B according to the second comparative example.

The spacers 950 in the liquid crystal display panel 900B according to the second comparative example are the projection-shaped structures 39 provided on the counter substrate 30, and do not include the organic insulating layer 25. However, the spacers 50 in the liquid crystal display panel 200 include part of the organic insulating layer 25 and the projection-shaped structures 39, and thus the height of the projection-shaped structures 39 can be kept lower in the liquid crystal display panel 200 than in the liquid crystal display panel 900B according to the second comparative example. A difference Δ2 between the height of the spacers 50 and the height of the spacers 950 (see FIG. 11A) is substantially equal to the sum of the thicknesses of the gate metal layer 12, the semiconductor layer 14, the source metal layer 16, and the organic insulating layer 25, for example. In the liquid crystal display panel 200, the cost of the material for forming the projection-shaped structures 39 can be reduced. There is an additional benefit of making it easy to control variations in line widths, the shape of tapers, and the like in photolithography processes for patterning the projection-shaped structures 39. Furthermore, the problem of insufficient alignment treatment in the periphery of the projection-shaped structures 39 can be suppressed when subjecting the second alignment film 37 to an alignment treatment.

The spacers 50 in the liquid crystal display panel 200 have the sum of the thickness of the organic insulating layer 25 and the height of the projection-shaped structures 39, and thus hold a gap between the active matrix substrate 10 and the counter substrate 30. The problem of the first alignment film 27 peeling in the periphery of the spacers 50 due to the projection-shaped structures 39 when the organic insulating layer 25 is made thicker can be more effectively suppressed. This is because the problem of the first alignment film 27 peeling in the periphery of the spacers 50 due to the projection-shaped structures 39 can be more effectively suppressed in a case where there is a large difference in the height of the layered structure provided on the first transparent substrate 11 between where the spacers 50 are provided and the periphery of the spacers 50 (e.g. Δ2 or Δ3 indicated in FIG. 11A).

In the process of manufacturing the liquid crystal display panel 200, it is not necessary to use a gray scale mask when forming the organic insulating layer 25. The projection-shaped structures 39 are formed before the second alignment film 37 is formed on the surface of the counter substrate 30. Specifically, the projection-shaped structures 39 are formed by depositing an organic insulating film on the second transparent substrate 31 and then patterning the organic insulating film. A negative-working or positive-working photosensitive resin (photoresist) can be used as the material of the organic insulating film, for example.

A variation on the liquid crystal display panel according to the present embodiment will be described next.

Figure 13:
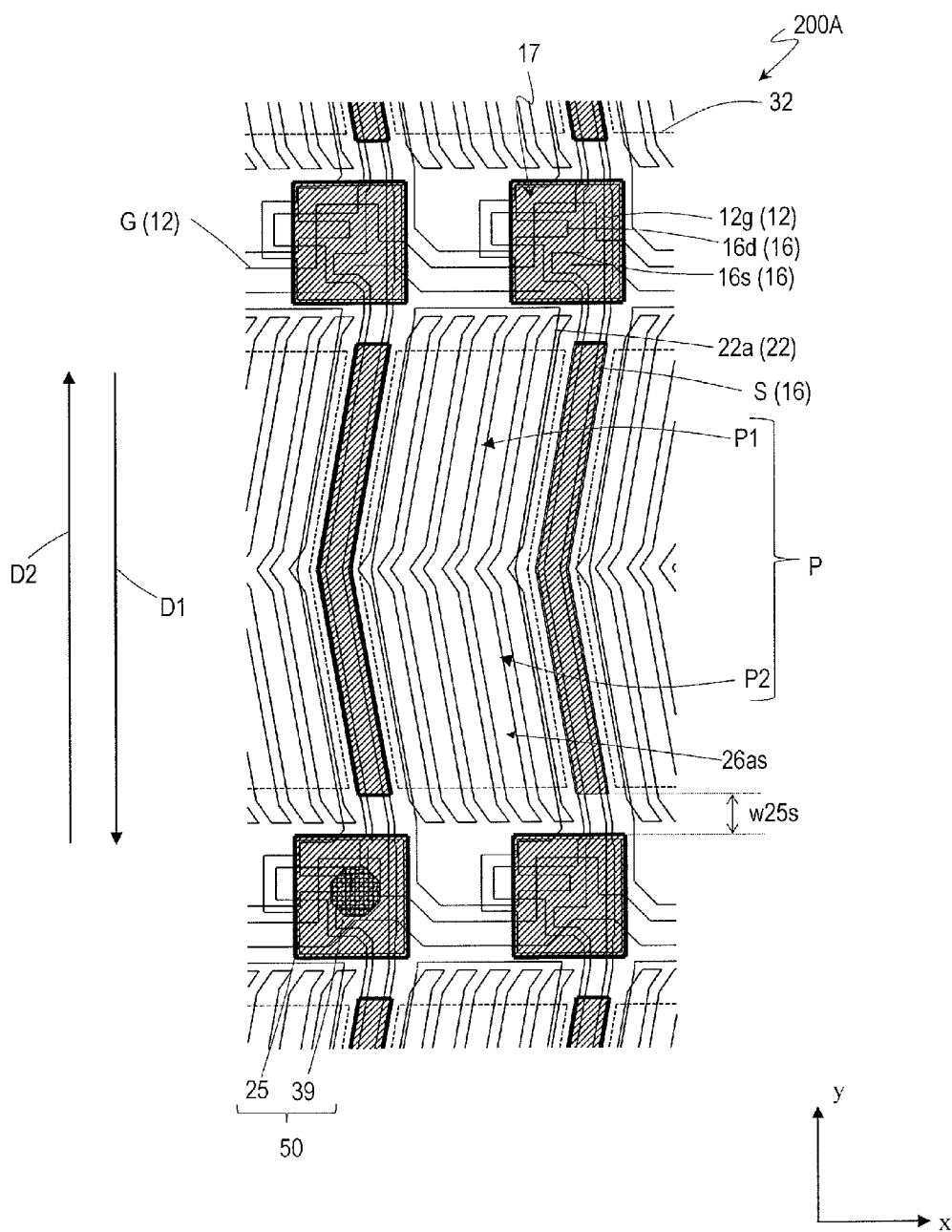
FIG. 13 is a plan view schematically illustrating the structure of a display region in a liquid crystal display panel 200A serving as a variation on the liquid crystal display panel 200.

FIG. 13 illustrates a liquid crystal display panel 200A, which is a variation on the liquid crystal display panel 200, FIG. 13 is a plan view schematically illustrating the structure of a display region in the liquid crystal display panel 200A.

The liquid crystal display panel 200A differs from the liquid crystal display panel 200 in terms of the portions of the source bus lines S not covered by the organic insulating layer 25. Of the source bus lines S, portions near the spacers 50 are not covered by the organic insulating layer 25. There is a large difference in the heights of the layered structure provided on the first transparent substrate 11, between the portions of the region in which the source bus lines S are formed that are not covered by the organic insulating layer 25 and the places where the spacers are provided. As such, in the liquid crystal display panel 200A, the problem can be effectively suppressed in which the first alignment film 27 peels in the periphery of the spacers 50 due to the projection-shaped structures 39.

Providing portions of the source bus lines S not covered by the organic insulating layer 25 also makes it possible to achieve the following effects. For example, when washing the active matrix substrate 10 before forming the first alignment film 27, a situation where washing fluid accumulates in specific locations can be suppressed. Furthermore, when forming the first alignment film 27 through a dripping method, it is easier for the alignment film to spread evenly, which makes it possible to suppress unevenness in the application of the alignment film.

The portions of the source bus lines S that are not covered by the organic insulating layer 25 have a length w25s in the y-axis direction of 10 µm, for example. As described earlier, in a case where the area of the portions of the source bus lines S not covered by the organic insulating layer 25 increases, the above-described effects of reducing the source bus line load and suppressing leak current between the source bus lines S and the common electrodes 26a can decrease. As such, the length w25s of the portions of the source bus lines S not covered by the organic insulating layer 25 may be set as appropriate in consideration of the drive capability of the source driver, the number of pixels, the resolution, and the like.

The portions of the source bus lines S not covered by the organic insulating layer 25 are not limited to the example illustrated in FIG. 13. For example, a portion not covered by the organic insulating layer 25 may be provided at the boundary area between the first domain P1 and the second domain P2 in each pixel P.

The liquid crystal display panel 200A having this configuration can achieve effects similar to those of the liquid crystal display panel 200.

Figure 14:
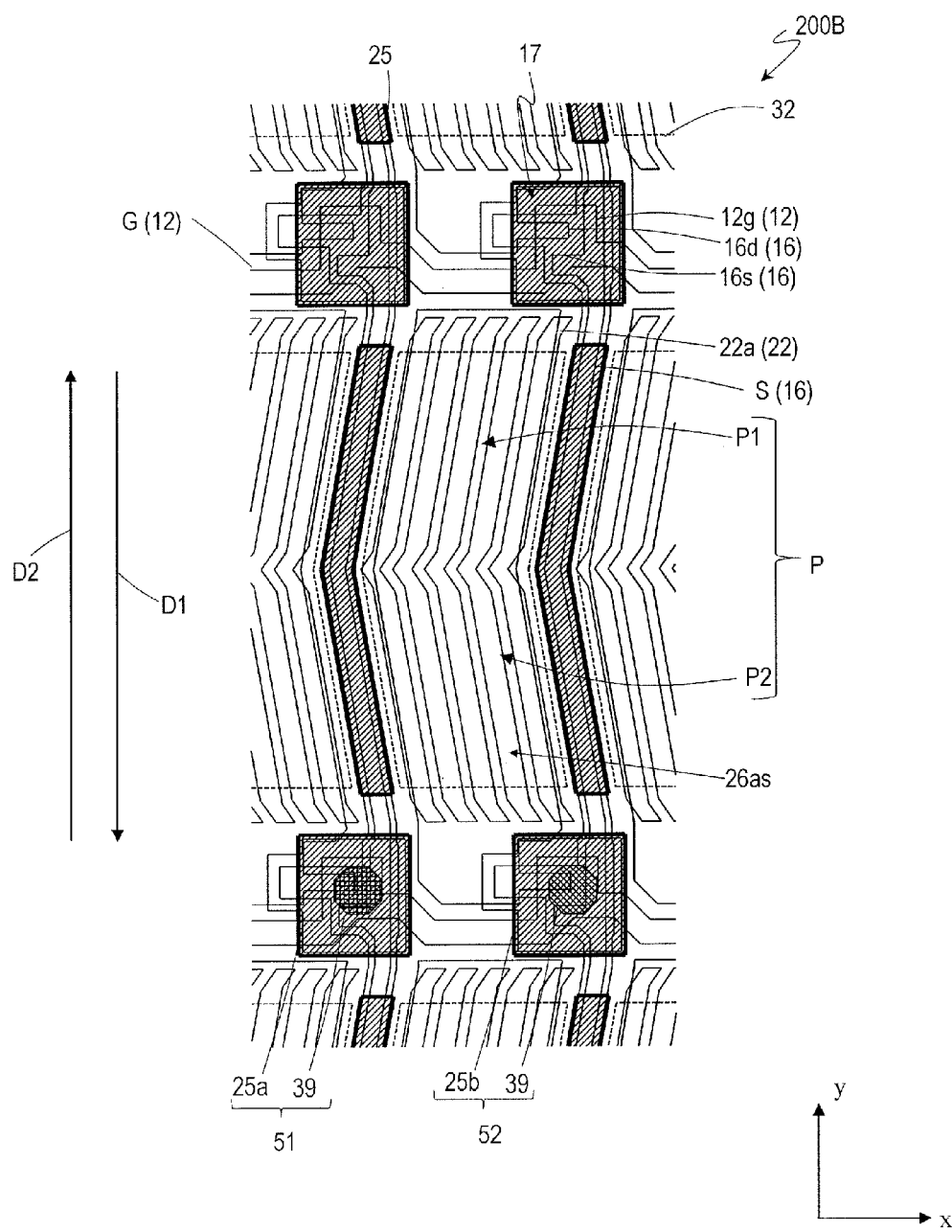
FIG. 14 is a plan view schematically illustrating the structure of a display region in a liquid crystal display panel 200B serving as a variation on the liquid crystal display panel 200.

FIG. 14 illustrates a liquid crystal display panel 200B, which is a variation on the liquid crystal display panel 200. FIG. 14 is a plan view schematically illustrating the structure of a display region in the liquid crystal display panel 200B.

The spacers 50 in the liquid crystal display panel 200B include first spacers 51 and second spacers 52, which have different heights. In the liquid crystal display panel 200B, the first spacers 51 and the second spacers 52 are formed by varying the thicknesses of the parts of the organic insulating layer 25 that constitute the spacers 50. Each of the first spacers 51 includes a part 25a of the organic insulating layer 25 and the projection-shaped structure 39, and each of the second spacers 52 includes a part 25b of the organic insulating layer 25 and the projection-shaped structure 39. The parts 25a and 25b of the organic insulating layer 25 that constitute the first spacers 51 and the second spacers 52, respectively, have different thicknesses. The heights of the projection-shaped structures 39 constituting the first spacers 51 and the second spacers 52 are the same.

The configuration is not limited to that illustrated here, and the first spacers 51 and second spacers 52 may be formed by varying the heights of the projection-shaped structures 39 while keeping the thickness of the organic insulating layer 25 in the first spacers 51 and second spacers 52 the same.

The liquid crystal display panel 200B having this configuration can achieve effects similar to those of the liquid crystal display panel 200.

Figure 15:
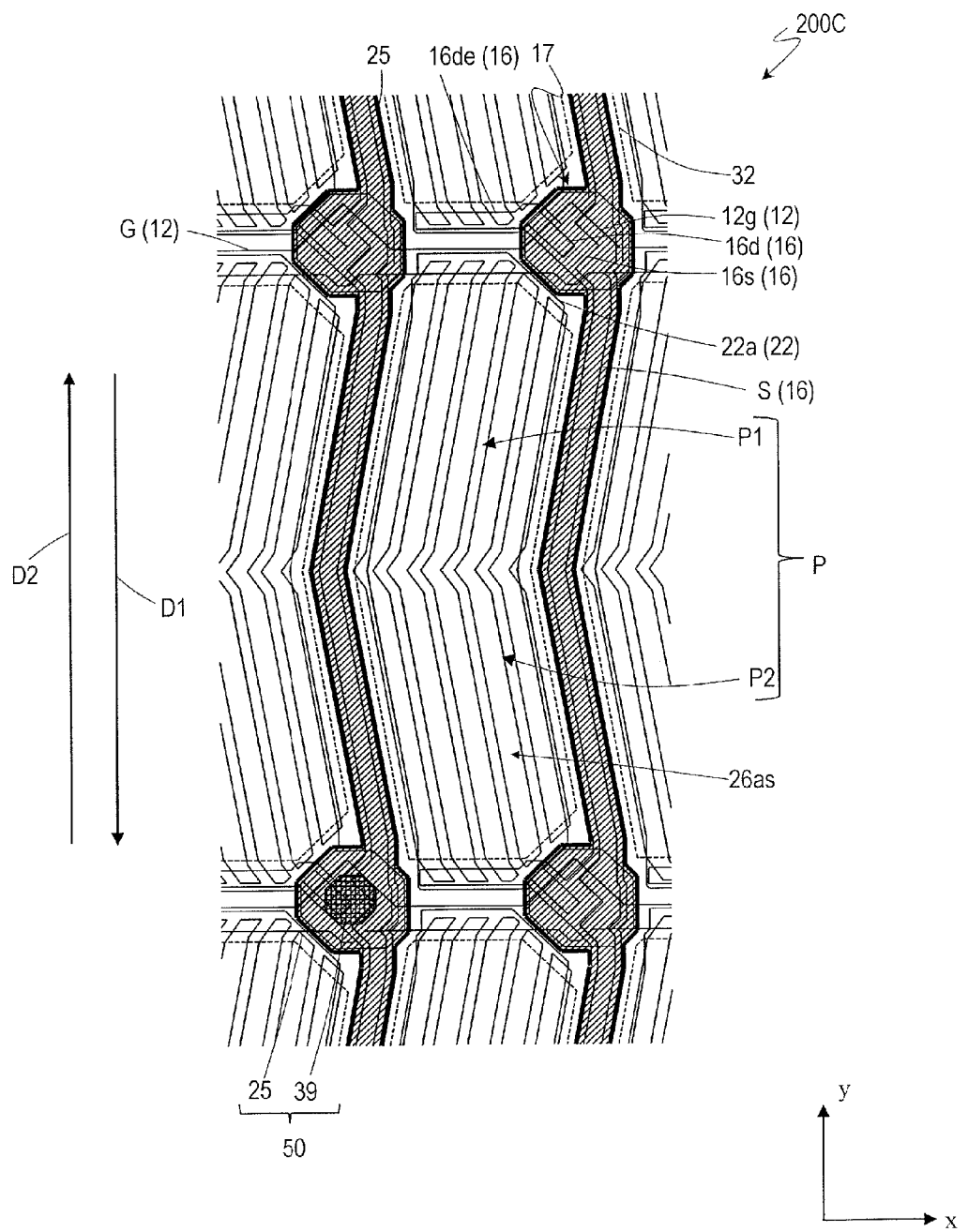
FIG. 15 is a plan view schematically illustrating the structure of a display region in a liquid crystal display panel 200C serving as a variation on the liquid crystal display panel 200.

FIG. 15 illustrates a liquid crystal display panel 200C, which is a variation on the liquid crystal display panel 200. FIG. 15 is a plan view schematically illustrating the structure of a display region in the liquid crystal display panel 200C.

In the liquid crystal display panel 200C, the area of the openings 32o in the light shielding layer 32 is greater than in the liquid crystal display panel 200. In other words, the liquid crystal display panel 200C has a greater pixel aperture ratio than that of the liquid crystal display panel 200. The light shielding layer (black matrix) 32 of the liquid crystal display panel 200C may be the same as that of the liquid crystal display panel 100A illustrated in FIG. 9. For example, the pixel aperture ratio of the liquid crystal display panel 200C is approximately 28% greater than the pixel aperture ratio of the liquid crystal display panel 200. For example, in the liquid crystal display panel 200, the width w32b of the second portions 32b of the light shielding layer 32 that cover the gate bus lines G is 53.5 µm, whereas in the liquid crystal display panel 200C, the width w32b of the second portions 32b of the light shielding layer 32 is 20 µm.

The liquid crystal display panel 200C also differs from the liquid crystal display panel 200 in terms of the shapes of the gate electrodes 12g, the source electrodes 16s, and the drain electrodes 16d. This, too, makes it possible to achieve a greater area for the openings 32o in the light shielding layer 32 than that of the liquid crystal display panel 200. Additionally, by providing drain lead-out wiring lines 16de for connecting the drain electrodes 16d to the pixel electrodes 22a so that the drain lead-out wiring lines 16de overlap with end portions of the slits 26as in the common electrodes 26a, disorder in the alignment of the liquid crystal molecules caused by the electrical field from the gate bus lines G can be suppressed, and in the display quality can be effectively prevented.

The liquid crystal display panel 200C having this configuration can achieve effects similar to those of the liquid crystal display panel 200.

Third Embodiment

Figure 16:
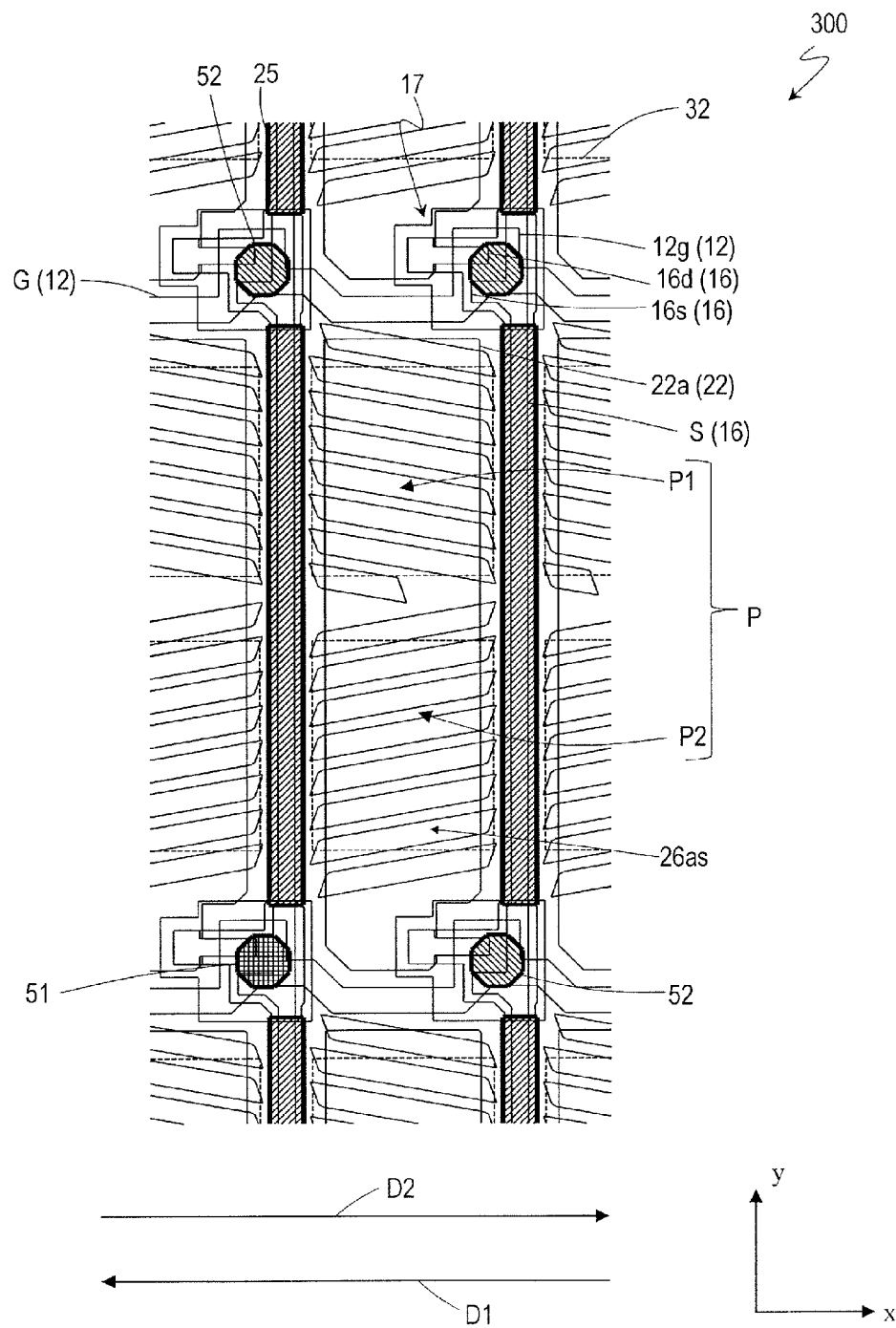
FIG. 16 is a plan view schematically illustrating the structure of a display region in a liquid crystal display panel 300 according to a third embodiment of the present invention.

FIG. 16 illustrates a liquid crystal display panel 300 according to the present embodiment, FIG. 16 is a plan view schematically illustrating the structure of a display region in the liquid crystal display panel 300.

As illustrated in FIG. 16, the liquid crystal display panel 300 differs from the liquid crystal display panel 100 according to the first embodiment in terms of the direction in which the slits 26as in the common electrodes 26a extend. The slits 26as in the common electrodes 26a of the liquid crystal display panel 300 extend in a direction substantially parallel to the x-axis direction in FIG. 16. Accordingly, when the liquid crystal layer 40 contains a nematic liquid crystal material having positive dielectric anisotropy, the alignment restriction directions D1 and D2 defined by the first alignment film 27 and the second alignment film 37 are, for example, parallel or antiparallel to the x-axis direction when viewed from the normal direction of the active matrix substrate 10, as illustrated in the drawing.

With the liquid crystal display panel 300, a drop in the display quality caused by insufficient alignment treatment on the alignment film in the periphery of the spacers can be suppressed, without increasing the area of the light shielding layer 32, i.e. without reducing the aperture ratio.

In particular, when the liquid crystal layer 40 contains a nematic liquid crystal material having positive dielectric anisotropy, an alignment treatment is carried out in the horizontal direction in FIG. 16 (the x-axis direction in FIG. 16). Thus, in the liquid crystal display panel 300, it is difficult for the problem of the display quality dropping due to insufficient alignment treatment on the alignment film in the periphery of the spacers to arise. This is because portions in the shadows of the spacers 50 when an alignment treatment is carried out in the horizontal direction in FIG. 16 are covered by the second portions 32b of the light shielding layer 32 that cover the gate bus lines G. In a case where the configuration is such that, for example, a retardation film is disposed on the observer side to achieve a wider viewing angle, it tends to be easier for the liquid crystal display panel 300 than the liquid crystal display panel 100 to achieve wider viewing angle characteristics (a wide region where high contrast can be achieved) in the horizontal direction compared to the vertical direction. The liquid crystal display panel 300 is suitable for use as, for example, a wide-format liquid crystal display panel, and as a liquid crystal display panel where viewing characteristics in the horizontal direction are considered more important than in the vertical direction, such as in the instrument panel of an automobile or the cockpit of an aircraft. However, the pixel aperture ratio of the liquid crystal display panel 300 may be worse than the pixel aperture ratio of the liquid crystal display panel 100, and it is thus preferable to apply the variations described below as appropriate to improve the pixel aperture ratio. Note that the retardation film is sometimes disposed on the opposite side from the observer side, i.e. on the light source (backlight) side.

Variations on the liquid crystal display panel according to the present embodiment will be described next.

Figure 17:
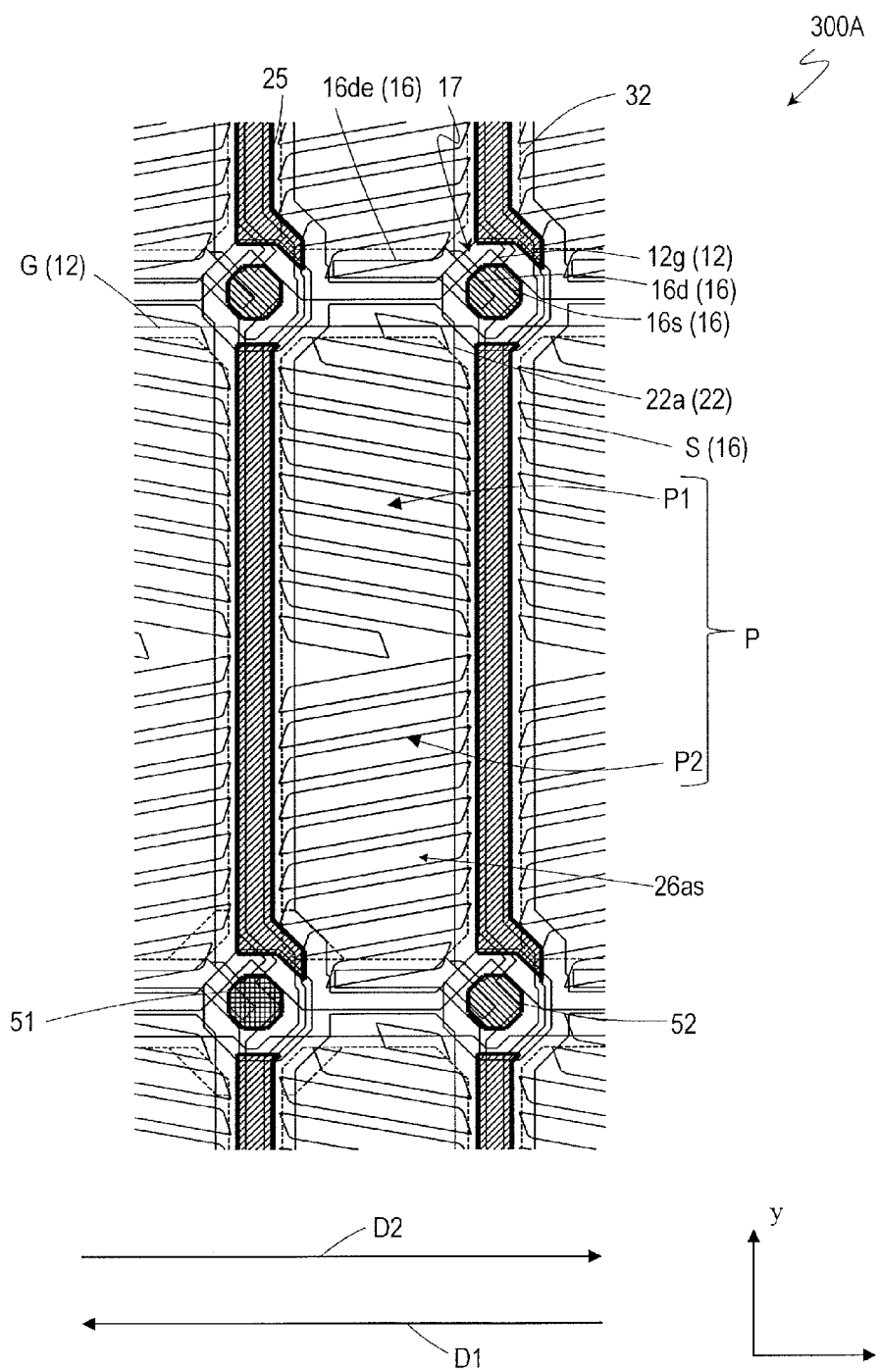
FIG. 17 is a plan view schematically illustrating the structure of a display region in a liquid crystal display panel 300A serving as a variation on the liquid crystal display panel 300.

FIG. 17 illustrates a liquid crystal display panel 300A, which is a variation on the liquid crystal display panel 300. FIG. 17 is a plan view schematically illustrating the structure of a display region in the liquid crystal display panel 300A.

In the liquid crystal display panel 300A, the surface area of the openings 32o in the light shielding layer 32 is greater than in the liquid crystal display panel 300. In other words, the liquid crystal display panel 300A has a greater pixel aperture ratio than that of the liquid crystal display panel 300. For example, the pixel aperture ratio of the liquid crystal display panel 300A is approximately 44% greater than the pixel aperture ratio of the liquid crystal display panel 300. For example, in the liquid crystal display panel 300, the width w32b of the second portions 32b of the light shielding layer 32 that cover the gate bus lines G is 53.5 μm, whereas in the liquid crystal display panel 300A, the width w32b of the second portions 32b of the light shielding layer 32 is 20 μm. Additionally, although the light shielding layer 32 is present between the first domain P1 and the second domain P2 of each pixel P in the liquid crystal display panel 300, such is not the case in the liquid crystal display panel 300A.

The liquid crystal display panel 300A also differs from the liquid crystal display panel 300 in terms of the shapes of the gate electrodes 12g, the source electrodes 16s, and the drain electrodes 16d. This, too, makes it possible to achieve a greater area for the openings 32o in the light shielding layer 32 than that of the liquid crystal display panel 300. Additionally, by providing drain lead-out wiring lines 16de for connecting the drain electrodes 16d to the pixel electrodes 22a so that the drain lead-out wiring lines 16de overlap with end portions of the slits 26as in the common electrodes 26a, disorder in the alignment of the liquid crystal molecules caused by the electrical field from the gate bus lines G can be suppressed, and in the display quality can be effectively prevented.

The liquid crystal display panel 300A having this configuration can achieve effects similar to those of the liquid crystal display panel 300.

Figure 18:
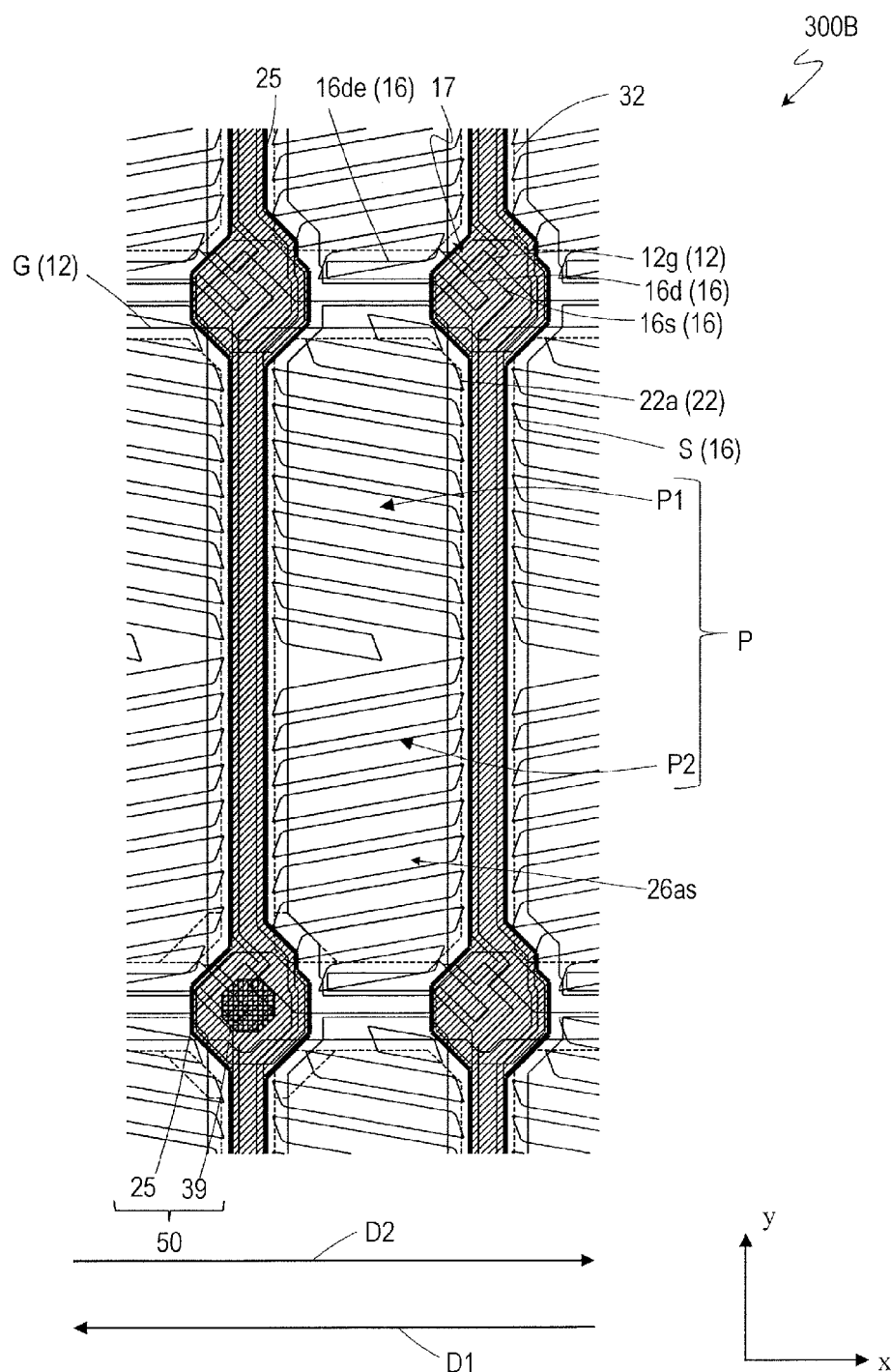
FIG. 18 is a plan view schematically illustrating the structure of a display region in a liquid crystal display panel 300B serving as a variation on the liquid crystal display panel 300A.

FIG. 18 illustrates a liquid crystal display panel 300B, which is a variation on the liquid crystal display panel 300A. FIG. 18 is a plan view schematically illustrating the structure of a display region in the liquid crystal display panel 300B.

The liquid crystal display panel 300B differs from the liquid crystal display panel 300A in terms of the configuration of the spacers 50. Each of the plurality of spacers 50 in the liquid crystal display panel 300B includes part of the organic insulating layer 25 and the projection-shaped structure 39, as in the second embodiment. The spacers 50 of the liquid crystal display panel 300B may be the same as in the second embodiment.

The liquid crystal display panel 300B having this configuration can achieve effects similar to those of the liquid crystal display panel 300. Furthermore, in the liquid crystal display panel 300B, a drop in the display quality caused by the alignment film partially peeling in the periphery of the spacers, without reducing the aperture ratio, can be suppressed.

Fourth Embodiment

Figure 19:
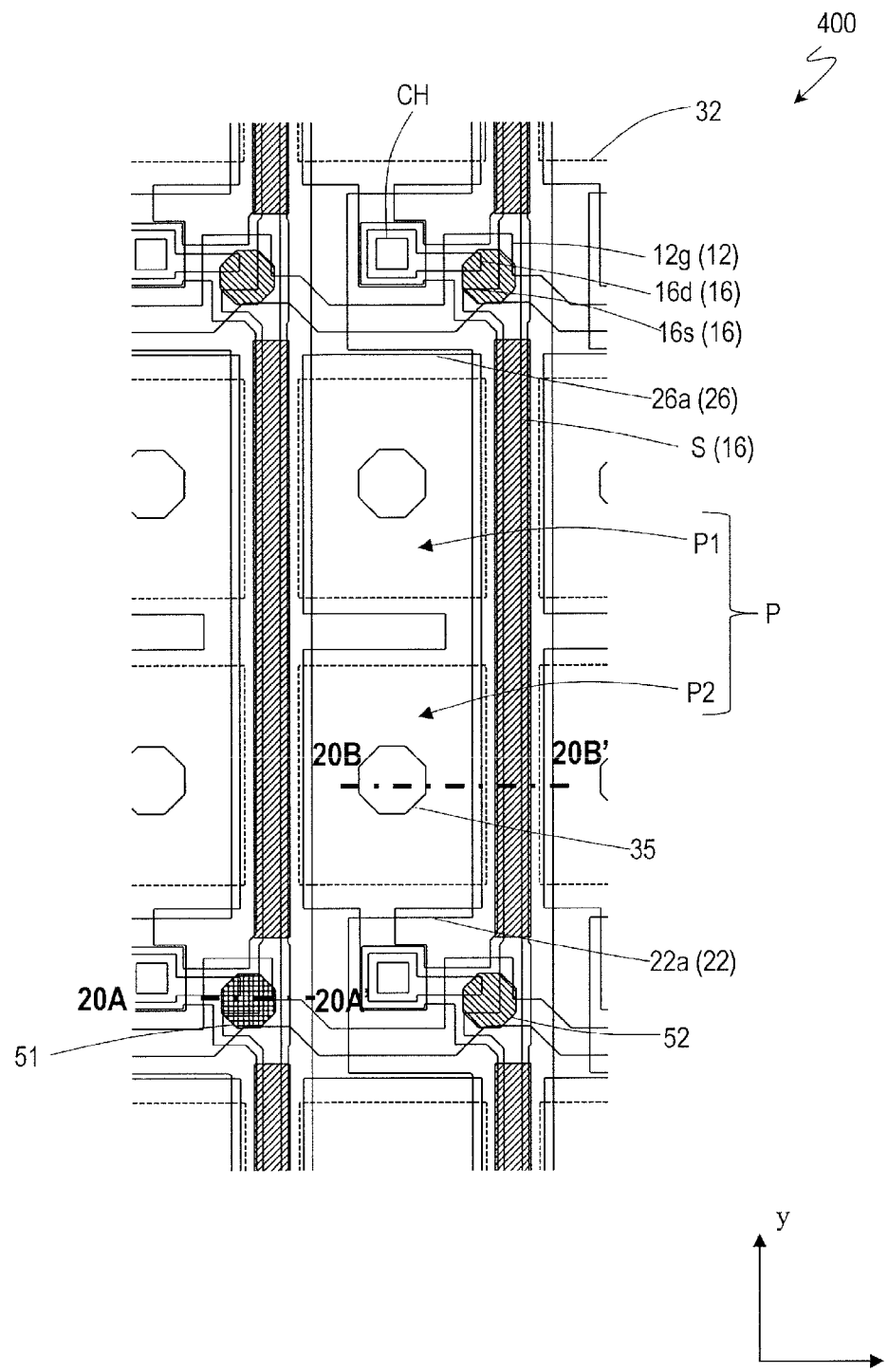
FIG. 19 is a plan view schematically illustrating the structure of a display region in a liquid crystal display panel 400 according to a fourth embodiment of the present invention.
Figure 20A:
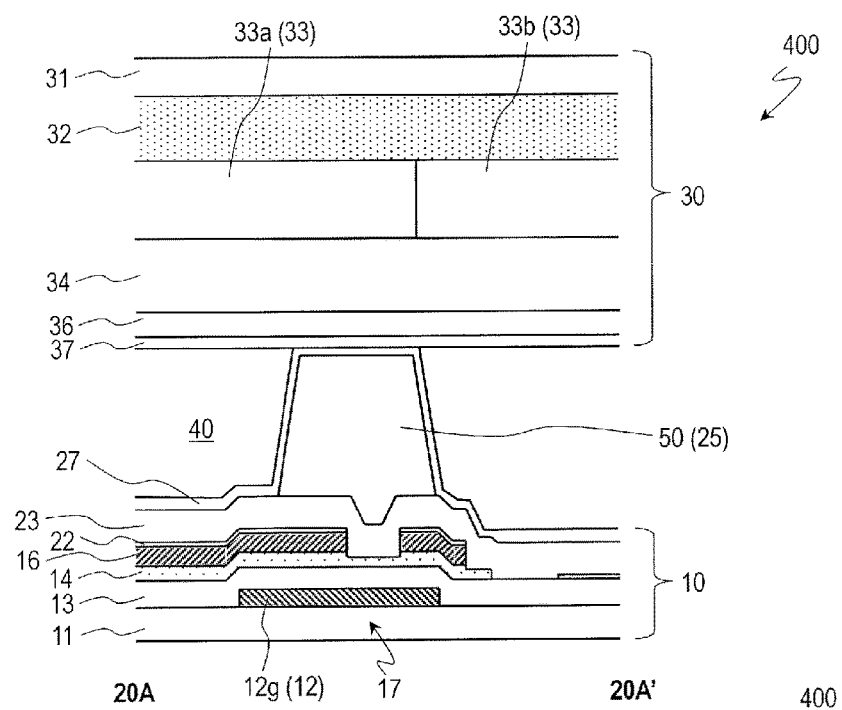
FIGS. 20A and 20B are diagrams illustrating the cross-sectional structure of the display region in the liquid crystal display panel 400, respectively taken along a line 20A-20A' and a line 20B-20B' in FIG. 19.
Figure 20B:
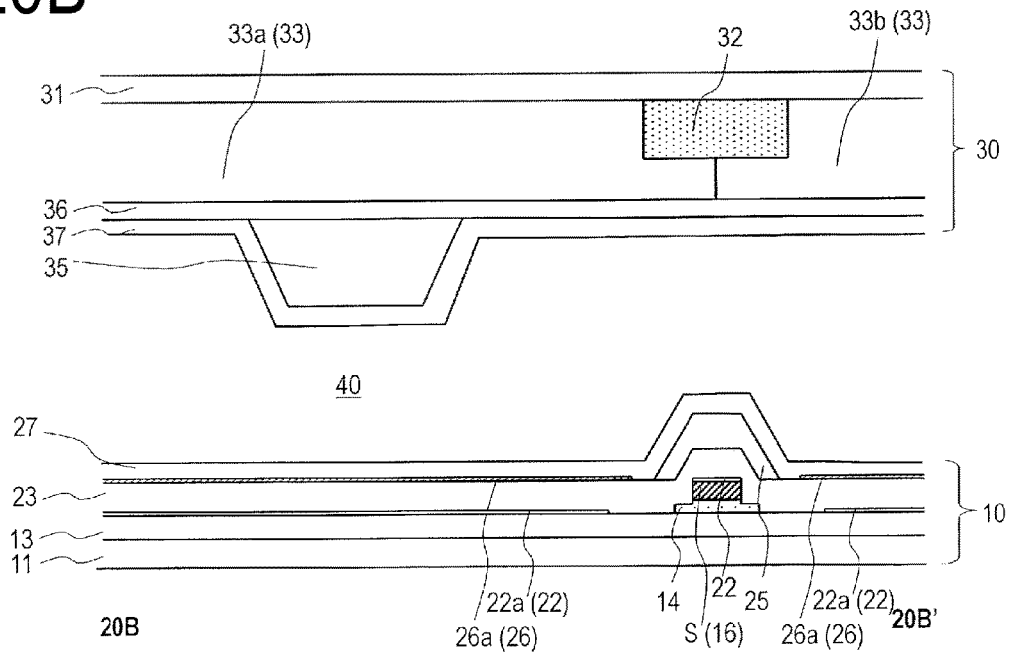

FIGS. 19 to 20B illustrate a liquid crystal display panel 400 according to the present embodiment. FIGS. 19 to 20B are a plan view and cross-sectional views, that schematically illustrate the structure of a display region in the liquid crystal display panel 400. FIGS. 20A and 20B are diagrams illustrating the cross-sectional structure of the liquid crystal display panel 400, respectively taken along a line 20A-20A' and a line 20B-20B' in FIG. 19.

The liquid crystal display panel 400 differs from the liquid crystal display panel 100 in that the liquid crystal display panel 400 is a CPA mode liquid crystal display panel. In the liquid crystal display panel 400, the second transparent electrodes 26a function as pixel electrodes. Each pixel electrode 26a is electrically connected to a corresponding drain electrode 16d through a contact hole CH provided in the inorganic insulating layer 23. The counter substrate 30 includes counter electrodes 36 provided facing the pixel electrodes 26a. The counter electrodes 36 are formed from a transparent conductive material (e.g., ITO). The pixel electrodes 26a are provided individually for each pixel. However, the counter electrodes 36 are conductive films that, for example, continue along the vertical direction in FIG. 19 (a direction parallel to they axis in FIG. 19). The counter electrodes 36, which are formed in a continuous manner for corresponding columns of pixels, are connected to each other, for example, through the non-display region in the periphery of the display region, and are electrodes that allow a common potential to be supplied to all of the pixels (common electrodes). The first transparent electrodes 22a function as auxiliary capacitance electrodes (transparent CS electrodes).

The liquid crystal layer 40 is a vertically-aligned liquid crystal layer. In other words, the liquid crystal molecules contained in the liquid crystal layer 40 have negative dielectric anisotropy and are aligned substantially perpendicular to the substrate surfaces (with a typical pretilt angle of greater than or equal to 85° and less than 90°) in a state where no voltage is applied between the pixel electrodes 26a and the counter electrodes 36. The first alignment film 27 and the second alignment film 37 are vertical alignment films.

Each pixel P has a first domain P1 and a second domain P2 exhibiting an axially symmetrical alignment. Alignment restriction projections 35, which protrude toward the active matrix substrate 10, are provided in the counter substrate 30, in regions corresponding to what is substantially the center of each domain. The alignment restriction projections 35 ensure the axially symmetrical alignment of the liquid crystal molecules in each domain. Oblique electrical fields produced at the edges of the pixel electrodes 26a also work to align the liquid crystal molecules in an axially symmetrical manner.

With the liquid crystal display panel 400, a drop in the display quality caused by the alignment film partially peeling due to vibrations or forces applied from the exterior can be suppressed, without increasing the area of the light shielding layer 32, i.e. without reducing the aperture ratio.

A variation on the liquid crystal display panel according to the present embodiment will be described next.

Figure 21:
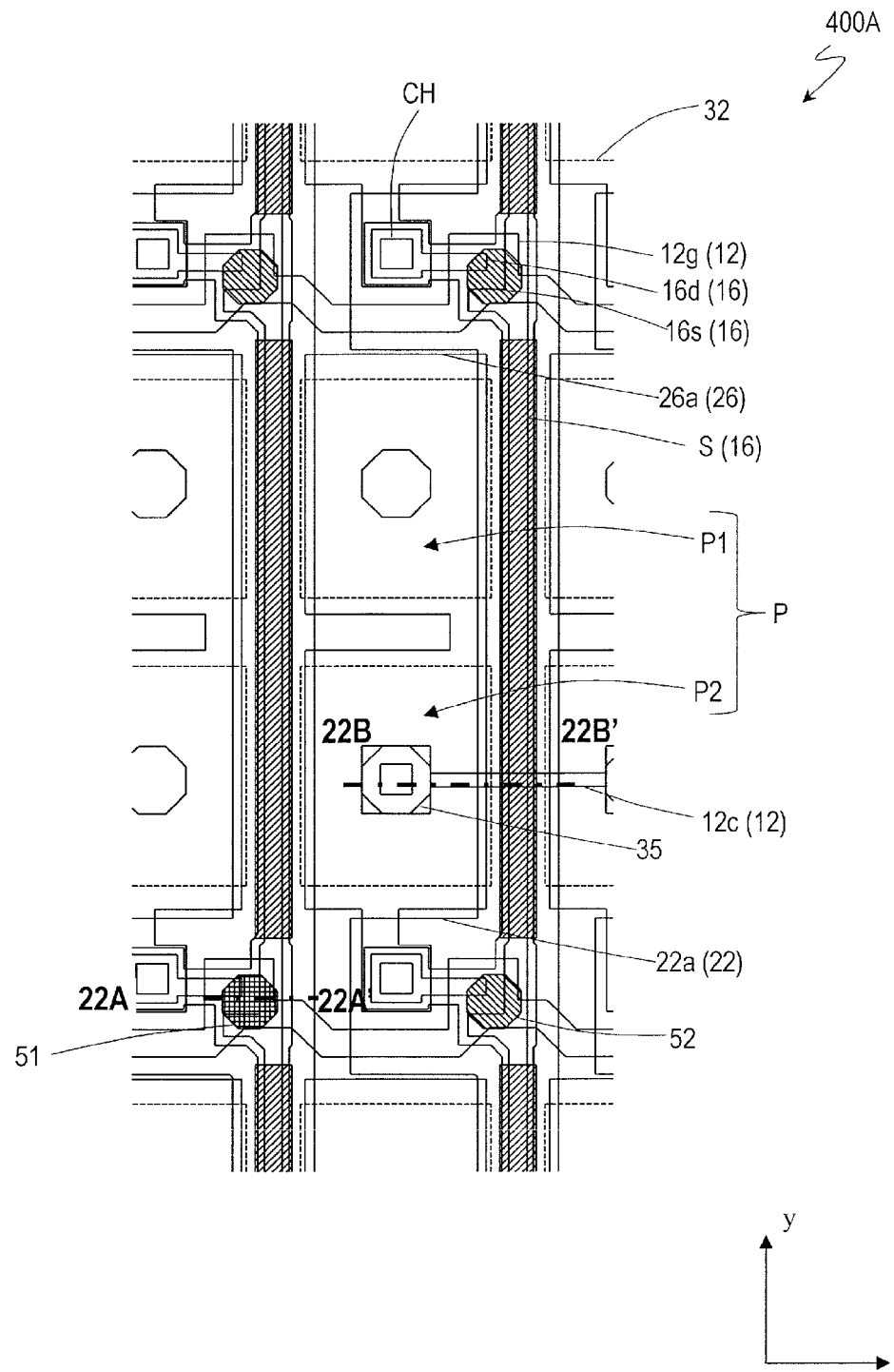
FIG. 21 is a plan view schematically illustrating the structure of a display region in a liquid crystal display panel 400A serving as a variation on the liquid crystal display panel 400.
Figure 22A:
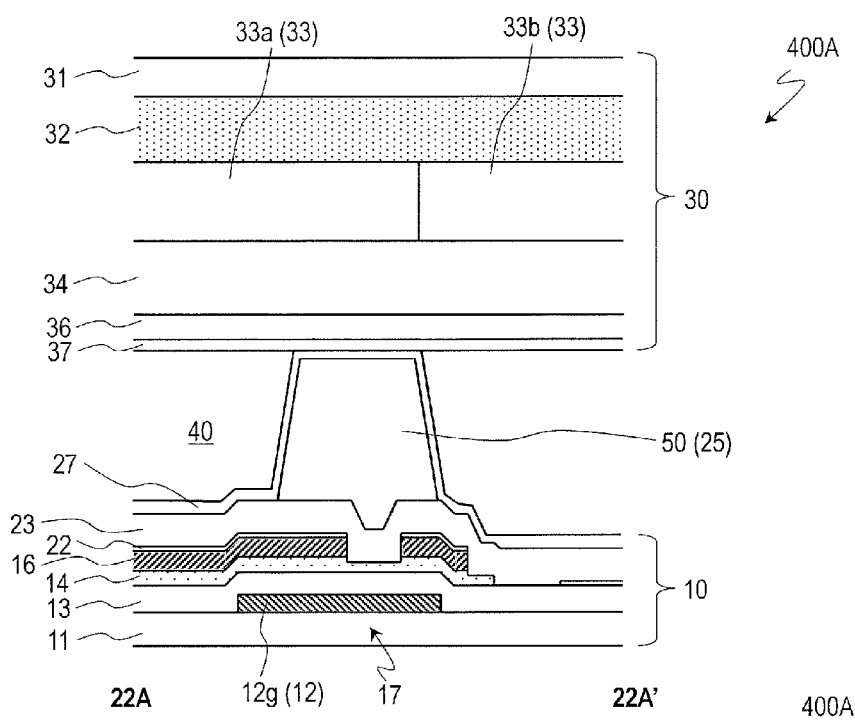
FIGS. 22A and 22B are diagrams illustrating the cross-sectional structure of the display region in the liquid crystal display panel 400A, respectively taken along a line 22A-22A' and a line 22B-22B' in FIG. 21.
Figure 22B:
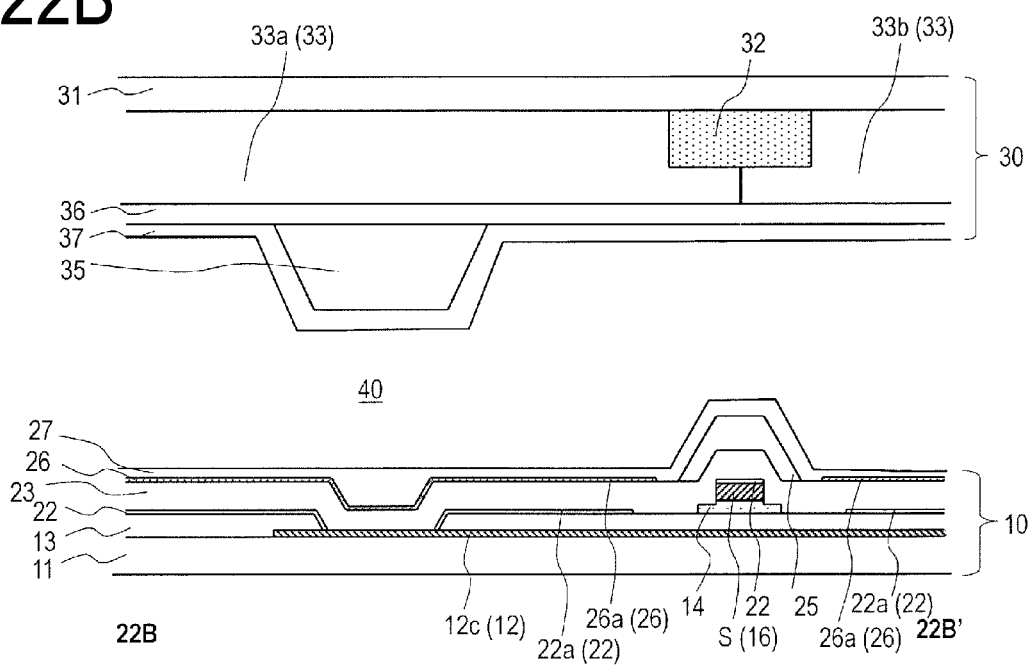

FIGS. 21 to 22B illustrate a liquid crystal display panel 400A, which is a variation on the liquid crystal display panel 400. FIGS. 21 to 22B are a plan view and cross-sectional views that schematically illustrate the structure of a display region in the liquid crystal display panel 400A. FIGS. 22A and 22B are diagrams illustrating the cross-sectional structure of the liquid crystal display panel 400A, respectively taken along a line 22A-22A' and a line 22B-22B' in FIG. 21.

In the liquid crystal display panel 400, the auxiliary capacitance electrodes 22a are formed in a continuous manner for each column of pixels. In the liquid crystal display panel 400A, auxiliary capacitances of adjacent pixel columns are electrically connected to each other by connection wiring lines 12c. The connection wiring lines 12c are formed by the gate metal layer 12. The connection wiring lines 12c connects two or more of the auxiliary capacitance electrodes 22a in the row direction, which can reduce resistance. The connection wiring lines 12c can be provided so as to connect any two auxiliary capacitance electrodes 22a adjacent in the row direction. Rather than being provided throughout the same pixel rows, a number equivalent to (number of pixel rows−1) or more of the connection wiring lines 12c may be formed as necessary to ensure that the voltage supplied to the auxiliary capacitance electrodes 22a is uniform throughout the entire display region. The connection wiring lines 12c can cause a drop in the pixel aperture ratio, and thus the number of connection wiring lines 12c may be adjusted as appropriate in consideration of the area and the like of the display region in the liquid crystal display panel, for example.

Fifth Embodiment

Figure 23:
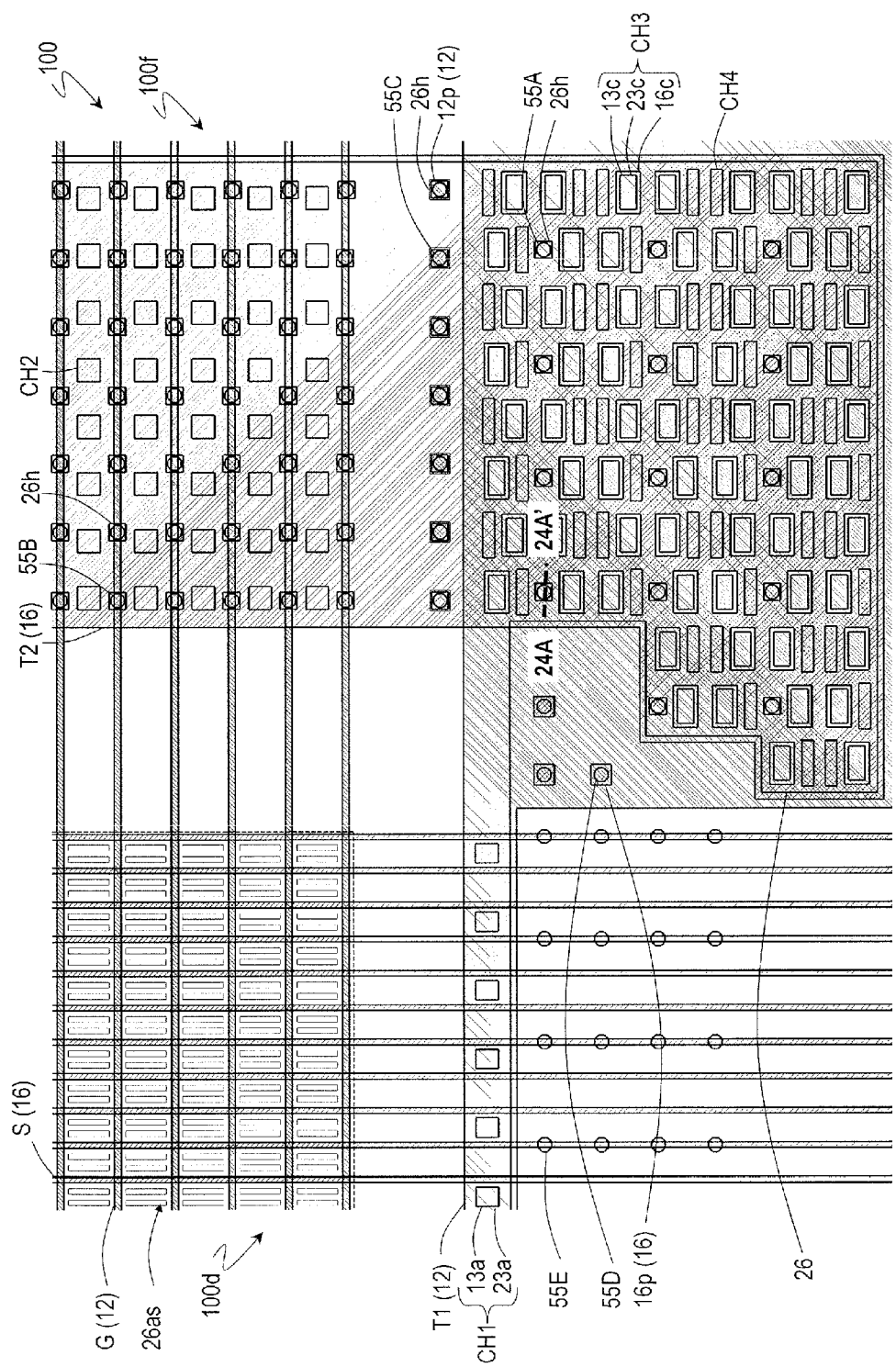
FIG. 23 is a plan view schematically illustrating the structure of a non-display region in the liquid crystal display panel 100.
Figure 24:
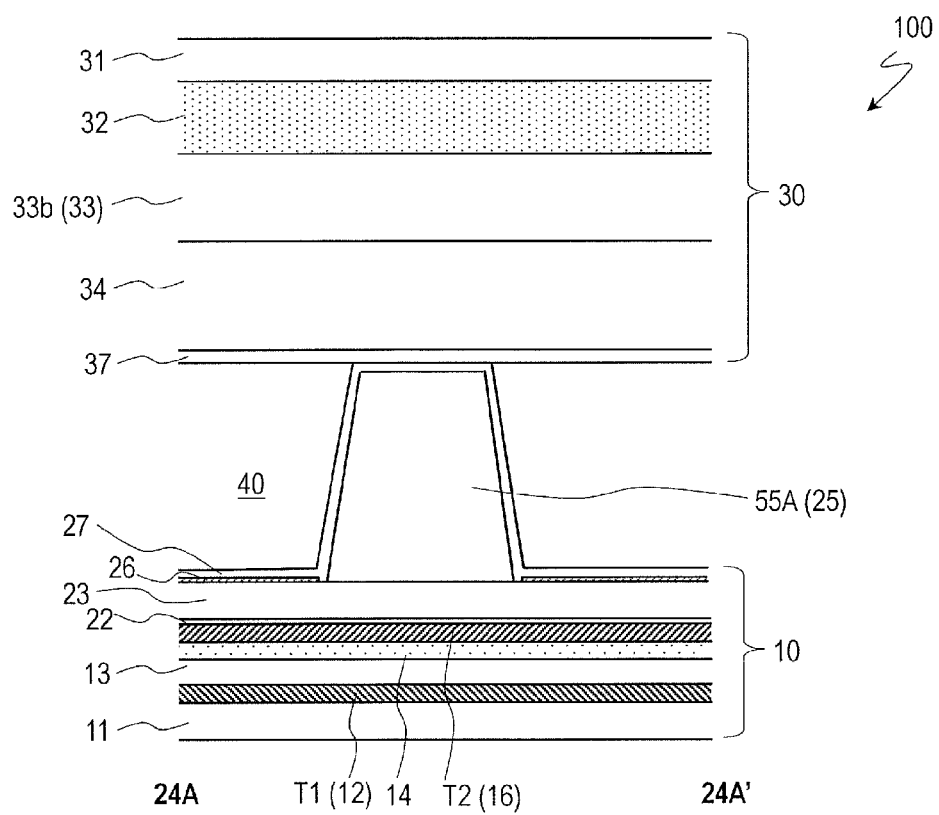
FIG. 24 is a diagram schematically illustrating the cross-sectional structure of the non-display region in the liquid crystal display panel 100, taken along a line 24A-24A' in FIG. 23.

In the preceding embodiments, the display region 100d in the liquid crystal display panel 100 is primarily described. In the present embodiment, however, the non-display region 100f in the liquid crystal display panel 100 will be described, FIGS. 23 and 24 are a plan view and a cross-sectional view schematically illustrating the structure of the non-display region 100f in the liquid crystal display panel 100. FIG. 23 is a diagram illustrating the region enclosed in the bold broken line in FIG. 1 in an enlarged manner, and like in FIG. 1, the display region 100d is indicated by a normal broken line. FIG. 24 is a diagram illustrating the cross-sectional structure of the non-display region 100f in the liquid crystal display panel 100 along a line 24A-24A' in FIG. 23.

As illustrated in FIG. 1, the non-display region 100f in the liquid crystal display panel 100 includes a seal portion 68 that encloses the liquid crystal layer 40.

In the non-display region 100f, the active matrix substrate 10 includes the gate metal layer 12, the gate insulating layer (also called a "first inorganic insulating layer") 13, the semiconductor layer 14, the source metal layer 16, the first transparent conductive layer 22, the inorganic insulating layer (also called a "second inorganic insulating layer") 23, and the organic insulating layer 25, as illustrated in FIG. 24. The active matrix substrate 10 further includes the second transparent conductive layer 26 in the non-display region 100f. Descriptions of items that are the same as for the display region 100d, such as details of the materials that form the respective layers and methods for forming the respective layers, and the like may be omitted.

The liquid crystal display panel 100 includes the plurality of spacers 50 that hold a gap between the active matrix substrate 10 and the counter substrate 30, and the plurality of spacers 50 include a plurality of spacers in the display region 100d and a plurality of spacers 55 in the non-display region 100f. When viewed from the normal direction of the active matrix substrate 10, each of the plurality of spacers 55 overlaps with the first transparent conductive layer 22 and the inorganic insulating layer 23. When viewed from the normal direction of the active matrix substrate 10, each of the plurality of spacers 55 overlaps with the gate metal layer 12 and/or the source metal layer 16. Each of the plurality of spacers 55 includes a part of the organic insulating layer 25.

As described earlier, when viewed from the normal direction of the active matrix substrate 10, each of the spacers in the display region 100d overlaps with at least one of the source electrode 16s and the drain electrode 16d of the corresponding TFT 17. In other words, when viewed from the normal direction of the active matrix substrate 10, each of the spacers in the display region 100d overlaps with the gate metal layer 12 and/or the source metal layer 16. Furthermore, as described earlier, each of the spacers in the display region 100d includes a part of the organic insulating layer 25. When viewed from the normal direction of the active matrix substrate 10, each of the spacers in the display region 100d overlaps with the first transparent conductive layer 22 and the inorganic insulating layer 23, as illustrated in FIG. 3A, for example.

In this manner, each of the spacers 55 in the non-display region 100f has substantially the same height as the spacers in the display region 100d. Accordingly, the liquid crystal display panel 100 can maintain a uniform cell gap at the non-display region 100f and the portions of the display region 100d that are adjacent to the non-display region 100f. Additionally, the places where the spacers 55 are provided can have a layered structure that includes all of the layers in the active matrix substrate 10 aside from the second transparent conductive layer 26. As such, the liquid crystal display panel 100 can have reduced amount of material used to form the spacers 55, which can make it possible to reduce manufacturing costs. Furthermore, the liquid crystal display panel 100 can have reduced height and volume of the spacers 55, which makes it easier to suppress low-temperature bubbling (vacuum bubbling).

The arrangement of the spacers 55 in the non-display region 100f (including locations and density) may be set as desired. For example, the spacers 55 may be formed inward from the seal portion 68, or may be covered by the seal portion 68. The liquid crystal display panel 100 can provide the following advantages by adjusting the arrangement of the spacers 55 in the non-display region 100f as appropriate. In the step of manufacturing the liquid crystal display panel 100, typically, a mother panel including a plurality of liquid crystal display panels is prepared, after which a step of partitioning the mother panel is carried out to obtain each liquid crystal display panel. In the step of partitioning the mother panel, scribe lines (cuts in the surface of a glass substrate) are provided in the mother glass substrate using a wheel cutter or the like, for example, and the scribe lines serve as starting points for cutting. There are situations where the glass substrate warps under the load of the wheel cutter or the like making contact with the surface of the mother glass substrate. Heavy warping in the glass substrate can cause cracking, seal peeling, and the like at the cut surfaces. Note that the magnitude of warping in the glass substrate depends on, for example, the arrangement of members for holding the cell gap, the distance between the seal portion 68 and the scribe lines, and the like. Although typically provided outward from the seal portion 68, the scribe lines may be provided overlapping with the seal portion 68. The liquid crystal display panel 100 includes the spacers 50 arranged as appropriate in and near the non-display region 100f, which makes it possible to suppress warping in the glass substrate caused by loads applied when cutting the substrate.

Additionally, with the liquid crystal display panel 100, when electrically connecting the common electrodes 26a to common main lines that allow a common voltage to be supplied to the common electrodes 26a in the non-display region 100f, failures in the second transparent conductive layer 26 are prevented, which prevents blunting of the signal waveform of the common voltage and makes it possible to suppress a drop in the display quality. The common main lines, and the electrical connections between the common main lines and the common electrodes, will be described below.

In the non-display region 100f, the liquid crystal display panel 100 includes a first common main line T1 that is connected to the first transparent electrodes 22a or the second transparent electrodes 26a and includes a part of the gate metal layer 12, and a second common main line T2 that is connected to the first transparent electrodes 22a or the second transparent electrodes 26a and includes a part of the source metal layer 16. The common main lines T1 and T2 are electrically connected, for example, to the second transparent electrodes 26a, which function as common electrodes. A common voltage from the common main line T1 and/or T2 is supplied to the common electrodes 26a. The common main lines are formed by patterning the same conductive film as the gate metal layer 12 or the same conductive film as the source metal layer 16, for example. Here, the common main line formed by the gate metal layer 12 is called the first common main line T1, and the common main line formed by the source metal layer 16 is called the second common main line T2. In the example illustrated here, the first common main line T1 and/or the second common main line T2 are provided inward from the seal portion 68, along the four sides of the display region 100d. The first common main line T1 is provided along three sides of the display region 100d, and the second common main line T2 is provided along the one remaining side. A common voltage is supplied to the first common main line T1 through a lead-out wiring line 12e. The lead-out wiring line 12e is formed by the gate metal layer 12, for example.

Preferably, the common main lines include a part of the gate metal layer 12 and/or the source metal layer 16. An increase in the steps for forming the common main lines can be suppressed in a case where the common main lines include a part of the gate metal layer 12 and/or the source metal layer 16. Additionally, a reduction in the resistance of the common main lines can be achieved in a case where the common main lines include a part of the gate metal layer 12 and/or the source metal layer 16. The common main lines may have a layered structure including a part of the gate metal layer 12 and/or the source metal layer 16. The common main lines may have a layered structure of the gate metal layer 12 and the source metal layer 16. A common main line having a layered structure of a gate metal layer and a source metal layer is disclosed in, for example, WO 2013/077262, filed by the applicant of the present invention. Neither the arrangements of the common main lines nor the electrical connections between the common main lines and the common electrodes are limited to those described as an example here. An electrical connection relationship between two types of common main lines and common electrodes is disclosed in, for example, WO 2013/077262, filed by the applicant of the present invention. The entire contents of WO 2013/077262 are incorporated into the present specification by reference.

Although the drawings illustrate an example in which the second transparent electrodes 26a function as common electrodes, the first transparent electrodes 22a may function as common electrodes in the liquid crystal display panel 100, as described earlier. In this case, the first common main line T1 and the second common main line T2 are electrically connected to the common electrodes 22a, and a common voltage from the common main line T1 and/or T2 is supplied to the common electrodes 22a.

The spacers 55 provided in the non-display region 100f will be described, with the spacers classified according to the location where the spacers are provided and the layered structure. As described below, the plurality of spacers 55 can include spacers 55 that overlap with the first common main line T1 and/or the second common main line T2 when viewed from the normal direction of the active matrix substrate 10. The spacers 55 may include main spacers and sub spacers.

As illustrated in FIGS. 23 and 24, spacers 55A overlap entirely with the first common main line T1 and the second common main line T2. In other words, the spacers 55A overlap entirely with the gate metal layer 12 and the source metal layer 16 when viewed from the normal direction of the active matrix substrate 10.

Spacers 55B overlap entirely with the second common main line T2, and also overlap with the gate bus lines G. The spacers 55B overlap entirely with the gate metal layer 12 or the source metal layer 16 when viewed from the normal direction of the active matrix substrate 10.

Spacers 55C overlap entirely with the second common main line T2, and overlap entirely with pillar portions 12p formed from the gate metal layer 12. Spacers 55D overlap entirely with the first common main line T1, and overlap entirely with pillar portions 16p formed from the source metal layer 16. The spacers 55C and the spacers 55D overlap entirely with the gate metal layer 12 and the source metal layer 16, respectively, when viewed from the normal direction of the active matrix substrate 10. The spacers 55C includes the pillar portions 12p, which allows the spacers 55C to have the same height as the spacers 55A and the spacers 55B. The spacers 55D include the pillar portions 16p, which allows the spacers 55D to have the same height as the spacers 55A and the spacers 55B. Note that when viewed from the normal direction of the active matrix substrate 10, the pillar portions 12p and the pillar portions 16p are not limited to the square shapes illustrated in FIG. 23, and may be rectangular, another polygon shape, or circular instead.

Spacers 55E overlap with the source bus lines S. The spacers 55E overlap with the source metal layer 16 when viewed from the normal direction of the active matrix substrate 10.

As described above, the spacers 55 in the non-display region 100f include spacers having substantially the same height as the spacers in the display region 100d. As such, it is preferable that the layered structure of the counter substrate 30 in the non-display region 100f be the same as the layered structure of the counter substrate 30 in the display region 100d. As illustrated in FIG. 24, in the non-display region 100f, the counter substrate 30 includes, for example, the second transparent substrate (e.g. a glass substrate) 31, the light shielding layer (black matrix) 32 provided on the second transparent substrate 31, the color filter layer 33, and the overcoat layer 34 covering the color filter layer 33. In other words, this is the same layered structure as the counter substrate 30 in the display region 100d, illustrated in FIGS. 3A and 39. The color filter layer 33 may include three types of color filters (a first color filter, a second color filter, and a third color filter) that transmit mutually-different colors of light. The layered structure of the color filter layer 33 is not limited to the example illustrated here, and any structure may be used. For example, two or more color filters that transmit mutually-different colors of light may be stacked. However, the layered structure of the color filter layer 33 is not limited to the example described here, and it is preferable that the structure be the same at places where the spacers are provided in the display region 100d and at the places where the spacers are provided in the non-display region 100f. To rephrase again, it is preferable that the thickness of the counter substrate 30 (the thickness of the counter substrate 30 in the normal direction thereof) be the same at the places where the spacers are provided in the display region 100d and at the places where the spacers are provided in the non-display region 100f. Thus, the thickness of the overcoat layer 34 may be adjusted as appropriate so that the thickness of the counter substrate 30 is the same at the places where the spacers are provided in the display region 100d and at the places where the spacers are provided in the non-display region 100f. For example, stacking two or more color filters that transmit mutually-different colors of light also makes it possible to omit the overcoat layer 34.

Preferably, the spacers 55 provided in the non-display region 100f do not overlap with the second transparent conductive layer 26. As described earlier, the second transparent conductive layer 26 is formed on the inorganic insulating layer 23, and part of the second transparent conductive layer 26 is formed on the organic insulating layer 25. In a case where the spacers 55 overlap with the second transparent conductive layer 26, part of the second transparent conductive layer 26 may make contact with the counter substrate 30 in a case where the spacer 55 is a main spacer, for example. In this case, the second transparent conductive layer 26 may be damaged. Debris from the damaged second transparent conductive layer 26 can also cause leak defects. For example, in a case where the second transparent electrode 26a functions as a pixel electrode, this can cause leakage between adjacent pixel electrodes. Furthermore, in a case where wiring lines connected to the two-terminal elements (diodes) provided as the static electricity countermeasure element partially include the second transparent conductive layer 26, this can cause leakage between adjacent static electricity countermeasure elements. This problem can be suppressed in a case where the spacers 55 do not overlap with the second transparent conductive layer 26. Even in a case where the first transparent electrodes 22a function as common electrodes, it is preferable that the spacers 55 not overlap with the second transparent conductive layer 26.

As illustrated in FIG. 23, for example, the second transparent conductive layer 26 has openings 26h, and the spacers 55A, the spacers 55B, and the spacers 55C are provided within the openings 26h. In other words, the spacers 55A, 55B, and 55C do not overlap with the second transparent conductive layer 26. The spacers 55D and the spacers 55E also do not overlap with the second transparent conductive layer 26, as illustrated in the drawing.

As described above, a method of forming the semiconductor layer 14, the source metal layer 16, and the first transparent conductive layer 22 using two photomasks can be used as a method for manufacturing the liquid crystal display panel 100. In the liquid crystal display panel 100 manufactured through this method, the first transparent conductive layer 22 is formed on the source metal layer 16, and the second metal layer 16 and the first transparent conductive layer 22 are in direct contact, in the region where the source metal layer 16 is formed, when viewed from the normal direction of the active matrix substrate 10. When viewed from the normal direction of the active matrix substrate 10, the semiconductor layer 14 is formed under the source metal layer 16, and the source metal layer 16 and the semiconductor layer 14 are in direct contact, in the region where the source metal layer 16 is formed. Accordingly, in the liquid crystal display panel manufactured through the above-described method, the spacers (including the spacers provided in the display region 100d and the spacers provided in the non-display region 100f) can overlap with the source metal layer 16 and the semiconductor layer 14 when viewed from the normal direction of the active matrix substrate 10. The spacers (including the spacers provided in the display region 100d and the spacers provided in the non-display region 1000 may overlap with the source metal layer 16 and the first transparent conductive layer 22, when viewed from the normal direction of the active matrix substrate 10. FIG. 23 illustrates an example in which the source metal layer 16 has the same shape as the semiconductor layer 14 and the first transparent conductive layer 22.

The electrical connection between the first common main line T1 or the second common main line T2 and the second transparent conductive layer 26 will be described next. The following contact holes, for example, are provided in the non-display region 100f in the liquid crystal display panel 100.

First contact holes CH1 are formed in the gate insulating layer 13 and the inorganic insulating layer 23. Each of the first contact holes CH1 is constituted by an opening 13a formed in the gate insulating layer 13 and an opening 23a formed in the inorganic insulating layer 23. When viewed from the normal direction of the active matrix substrate 10, the first contact holes CH1 overlap with the first common main line T1 but not with the second common main line T2. In other words, the first contact holes CH1 are formed exposing the first common main line T1. The first common main line T1 and the second transparent conductive layer 26 are electrically connected by the first contact holes CH1.

Second contact holes CH2 are formed in the inorganic insulating layer 23. When viewed from the normal direction of the active matrix substrate 10, the second contact holes CH2 overlap with the second common main line T2. In other words, the second contact holes CH2 are formed exposing the second common main line T2. The second common main line T2 and the second transparent conductive layer 26 are electrically connected by the second contact holes CH2.

Third contact holes CH3 are formed in the gate insulating layer 13, the source metal layer 16, and the inorganic insulating layer 23. Each of the third contact holes CH3 is constituted by an opening 13c formed in the gate insulating layer 13, an opening 16c formed in the source metal layer, and an opening 23c formed in the inorganic insulating layer 23. When viewed from the normal direction of the active matrix substrate 10, the third contact holes CH3 overlap with the first common main line T1. In other words, the third contact holes CH3 are formed exposing the first common main line T1. The first common main line T1 and the second transparent conductive layer 26 are electrically connected by the third contact holes CH3.

Fourth contact holes CH4 are formed in the inorganic insulating layer 23. When viewed from the normal direction of the active matrix substrate 10, the fourth contact holes CH4 overlap with the second common main line T2. In other words, the fourth contact holes CH4 are formed exposing the second common main line T2. The second common main line T2 and the second transparent conductive layer 26 are electrically connected by the fourth contact holes CH4. The second contact holes CH2 do not overlap with the gate metal layer 12 when viewed from the normal direction of the active matrix substrate 10, but the fourth contact holes CH4 overlap with the gate metal layer 12 when viewed from the normal direction of the active matrix substrate 10.

The plurality of spacers 55 in the non-display region 100f may include spacers 55 formed inward from the seal portion 68. The plurality of spacers 55 in the non-display region 100f may include spacers 55 covered by the seal portion 68.

In a case where the plurality of spacers 55 in the non-display region 100f include spacers 55 located inward from the seal portion 68 and spacers 55 covered by the seal portion 68, the height of the organic insulating layer 25 at the places where the spacers 55 located inward from the seal portion 68 are provided is, for example, substantially equal to the height of the organic insulating layer 25 at the places where the spacers 55 covered by the seal portion 68 are provided. Here, the "height of the organic insulating layer 25" refers to the distance, in the normal direction of the active matrix substrate 10, from the surface of the first transparent substrate 11 closer to the liquid crystal layer 40 to the surface of the organic insulating layer 25 closer to the liquid crystal layer 40.

A light-curable resin (including thermosetting resins), for example, is widely used as a sealing material that forms the seal portion 68. The sealing material is not limited to an ultraviolet light-curable resin. Resins cured by light of other wavelengths (e.g. visible light) may be used, and a variety of light-curable resins can be used favorably. "Light-curable resin" refers to a resin in which the curing reaction is advanced by irradiating the resin with light of a prescribed wavelength, and includes resins that can furthermore be thermally cured after the light curing. Using thermal curing as well generally improves the properties of the cured body (the hardness, elasticity, and the like). Furthermore, particles for imparting dispersive properties (filler) may be mixed into the sealing material along with the light-curable resin. A sealing material in which particles are distributed scatters or diffusely-reflects light, and thus an effect of distributing light over a broader area in the sealing material can be achieved.

The sealing material may contain particulate spacers that hold a distance between the active matrix substrate 10 and the counter substrate 30. However, in a case where the plurality of spacers 55 in the non-display region 100f include spacers 55 covered by the seal portion 68, the cell gap can be kept uniform even in a case where the sealing material does not contain particulate spacers. Using a sealing material that does not contain particulate spacers makes it possible to form the seal portion 68 at any desired location, regardless of the surface height of the active matrix substrate 10. As a result, the frame of the liquid crystal display panel 100 can be narrowed, and manufacturing costs can be reduced. Here, the "surface height of the active matrix substrate 10" refers to the distance, in the normal direction of the active matrix substrate 10, from the surface of the active matrix substrate 10 closer to the liquid crystal layer 40 to the surface of the first transparent substrate 11 closer to the liquid crystal layer 40.

The sealing material may contain conductive particles. Particularly with a vertical electrical field mode liquid crystal display panel, using a sealing material containing conductive particles makes it possible to form a transition portion where the active matrix substrate 10 and the counter electrode formed on the counter substrate 30 are electrically connected by the conductive particles.

As described above, by disposing the spacers 55 so as to overlap with the first common main line T1 and/or the second common main line T2 in the non-display region 100f, each of the spacers 55 can be arranged so as to overlap with the gate metal layer 12 and/or the source metal layer 16. However, the embodiments of the present invention are not limited thereto. The non-display region 100f can include, for example, dummy pixel TFTs that do not contribute to displays, inspection TFTs used for inspecting whether there are defects in the pixels or the like in the display region 100d, two-terminal elements (diodes) (including TFTs) provided as static electricity countermeasure elements, driving TFTs, and the like. The spacers 55 in the non-display region 100f may be provided overlapping with the above-described TFTs. In other words, when viewed from the normal direction of the active matrix substrate 10, each spacer 55 may be provided overlapping with at least one of the source electrode and the drain electrode of the corresponding one of the above-described TFTs.

Although the present embodiment has described the non-display region 100f in the liquid crystal display panel 100 according to the first embodiment, the embodiments of the present invention are not limited thereto. The present embodiment can of course be applied in the non-display regions in the liquid crystal display panels according to the other embodiments, and the same effects can be achieved in such cases as well. As described with reference to a CPA mode liquid crystal display panel in the fourth embodiment, in a vertical electrical field mode liquid crystal display panel, the second transparent electrode 26a can function as a pixel electrode and the first transparent electrodes 22a can function as auxiliary capacitance electrodes, for example. In this case, the above-described common main lines can be electrically connected to the auxiliary capacitance electrodes and function as auxiliary capacitance main lines that allow an auxiliary capacitance voltage to be supplied to the auxiliary capacitance electrodes.

INDUSTRIAL APPLICABILITY

According to embodiments of the present invention, a drop in display quality caused by disorder in the alignment of liquid crystal molecules near photo spacers can be suppressed without causing a drop in the aperture ratio in a liquid crystal display panel. The liquid crystal display panels according to embodiments of the present invention can be used as transverse electrical field mode or vertical electrical field mode liquid crystal display panels.

REFERENCE SIGNS LIST

10 Active matrix substrate
11 First transparent substrate
12 First metal layer (gate metal layer)
12g Gate electrode
13 Gate insulating layer (first inorganic insulating layer)
14 Semiconductor layer
16 Second metal layer (source metal layer)
16d Drain electrode
16s Source electrode
22 First transparent conductive layer
22a First transparent electrode
23 Inorganic insulating layer (second inorganic insulating lave
25 Organic insulating layer
26 Second transparent conductive layer
26a Second transparent electrode
26as Slit
27 First alignment film
30 Counter substrate
31 Second transparent substrate
32 Light shielding layer
37 Second alignment film
39 Projection-shaped structure
40 Liquid crystal layer
50 Spacer
51 First spacer
52 Second spacer
55 Spacer
100d Display region
100f Non-display region
100, 100A Liquid crystal display panel
200, 200A, 2009, 200C Liquid crystal display panel
300, 300A, 300B Liquid crystal display panel
400, 400A Liquid crystal display panel

The invention claimed is:

1. A liquid crystal display panel comprising:
a first substrate;
a second substrate;
a liquid crystal layer provided between the first substrate and the second substrate; and
a plurality of spacers configured to hold a gap between the first substrate and the second substrate,
the liquid crystal display panel including: a display region including a plurality of pixels arranged in a matrix; and a non-display region in a periphery of the display region,
wherein the non-display region includes a seal portion enclosing the liquid crystal layer,
the plurality of spacers include a plurality of first spacers in the display region and a plurality of second spacers in the non-display region,
the first substrate includes, in the display region and the non-display region,
a first transparent substrate,
a first metal layer formed on the first transparent substrate,
a first inorganic insulating layer formed on the first metal layer,
a second metal layer formed on the first inorganic insulating layer,
a first transparent conductive layer formed on the second metal layer and in direct contact with the second metal layer,
a second inorganic insulating layer formed on the first transparent conductive layer, and
an organic insulating layer formed on the second inorganic insulating layer,
when viewed from a normal direction of the first substrate, each of the plurality of spacers overlaps with the first transparent conductive layer and the second inorganic insulating layer,
when viewed from the normal direction of the first substrate, each of the plurality of spacers overlaps with the first metal layer and/or the second metal layer,
each of the plurality of spacers includes a part of the organic insulating layer,
the first transparent conductive layer is in direct contact with the second metal layer throughout the entire non-display region, and
the first transparent conductive layer and the second metal layer have the same shape in the non-display region.

2. The liquid crystal display panel according to claim 1, wherein in the display region and the non-display region, the first substrate further includes a second transparent conductive layer formed on the second inorganic insulating layer, and part of the second transparent conductive layer is formed on the organic insulating layer.

3. The liquid crystal display panel according to claim 2, wherein the plurality of spacers include a spacer that does not overlap with the second transparent conductive layer.

4. The liquid crystal display panel according to claim 2, wherein in the display region, in a case that a distance, in the normal direction of the first substrate, from a surface of the first transparent substrate closer to the liquid crystal layer to a surface of the second inorganic insulating layer closer to the liquid crystal layer is taken as a first height, the first height at places where the plurality of first spacers are provided is greater than the first height at places where the plurality of first spacers are not provided and that include a layered structure including the first transparent conductive layer and the second transparent conductive layer.

5. The liquid crystal display panel according to claim 2, wherein the first substrate includes, in the display region,
a plurality of TFTs formed on the first transparent substrate, each of the plurality of TFTs including a gate electrode, a semiconductor layer, a source electrode, and a drain electrode,
a plurality of first wiring lines including a part of the first metal layer, each of the first wiring lines being connected to one of the gate electrode and the source electrode of a corresponding one of the plurality of TFTs, and
a plurality of second wiring lines including a part of the second metal layer, each of the second wiring lines being connected to the other of the gate electrode and the source electrode of a corresponding one of the plurality of TFTs, and each of the plurality of first spacers overlaps with at least one of the source electrode and the drain electrode of a corresponding one of the plurality of TFTs.

6. The liquid crystal display panel according to claim 5, wherein in the display region, a part of the organic insulating layer is formed on the plurality of second wiring lines, and is formed substantially parallel to the plurality of second wiring lines while covering at least part of the plurality of second wiring lines.

7. The liquid crystal display panel according to claim 5, wherein part of the second transparent conductive layer covers a part of the organic insulating layer formed covering at least part of the plurality of second wiring lines.

8. The liquid crystal display panel according to claim 5, wherein the first transparent conductive layer includes a first transparent electrode, the second transparent conductive layer includes a second transparent electrode opposing the first transparent electrode with the second inorganic insulating layer between the first transparent electrode and the second transparent electrode, one of the first transparent electrode and the second transparent electrode is connected to one of the source electrode and the drain electrode, and the second transparent electrode includes at least one slit.

9. The liquid crystal display panel according to claim 8, wherein the first substrate includes, in the non-display region, a first main line connected to the first transparent electrode or the second transparent electrode and including a part of the first metal layer, and a second main line connected to the first transparent electrode or the second transparent electrode and including a part of the second metal layer, and the plurality of second spacers include a second spacer that, when viewed from the normal direction of the first substrate, overlaps with the first main line and/or the second main line.

10. The liquid crystal display panel according to claim 1, wherein the plurality of spacers include spacers that, when viewed from the normal direction of the first substrate, overlap entirely with the first metal layer and/or the second metal layer.

11. The liquid crystal display panel according to claim 1, wherein the plurality of spacers include spacers that, when viewed from the normal direction of the first substrate, overlap entirely with the first metal layer and the second metal layer.

12. The liquid crystal display panel according to claim 1, wherein the first substrate includes, in the display region and the non-display region, a semiconductor layer formed under the second metal layer, and the plurality of spacers include a spacer that, when viewed from the normal direction of the first substrate, overlaps with the second metal layer and the semiconductor layer.

13. The liquid crystal display panel according to claim 12, wherein the semiconductor layer is formed on the first metal layer.

14. The liquid crystal display panel according to claim 12, wherein the plurality of first spacers include a spacer that, when viewed from the normal direction of the first substrate, overlaps with the semiconductor layer.

15. The liquid crystal display panel according to claim 1, wherein the plurality of second spacers include a second spacer covered by the seal portion.

16. The liquid crystal display panel according to claim 1, wherein the plurality of second spacers include a second spacer inward from the seal portion.

17. The liquid crystal display panel according to claim 1, wherein the plurality of second spacers include a second spacer covered by the seal portion and a second spacer inward from the seal portion, and in a case that a distance, in the normal direction of the first substrate, from a surface of the first transparent substrate closer to the liquid crystal layer to a surface of the organic insulating layer closer to the liquid crystal layer is taken as a second height, the second height at a place where the second spacer covered by the seal portion is provided is substantially equal to the second height at a place where the second spacer inward from the seal portion is provided.

18. The liquid crystal display panel according to claim 1, wherein the second substrate includes a plurality of projection-shaped structures protruding toward the first substrate, and the plurality of spacers include a spacer that further includes a corresponding one of the plurality of projection-shaped structures.

* * * * *